United States Patent
Sorrells et al.

(10) Patent No.: US 8,406,724 B2
(45) Date of Patent: Mar. 26, 2013

(54) APPLICATIONS OF UNIVERSAL FREQUENCY TRANSLATION

(75) Inventors: David F. Sorrells, Middleburg, FL (US); Michael J. Bultman, Jacksonville, FL (US); Robert W. Cook, Switzerland, FL (US); Richard C. Looke, Jacksonville, FL (US); Charley D. Moses, Jr., DeBary, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

(21) Appl. No.: 13/421,635

(22) Filed: Mar. 15, 2012

(65) Prior Publication Data

US 2012/0178398 A1 Jul. 12, 2012

Related U.S. Application Data

(63) Continuation of application No. 12/881,912, filed on Sep. 14, 2010, now Pat. No. 8,160,534, which is a continuation of application No. 12/408,498, filed on Mar. 20, 2009, now Pat. No. 7,926,817, which is a continuation of application No. 11/230,732, filed on (Continued)

(51) Int. Cl.
*H04B 1/16* (2006.01)

(52) U.S. Cl. ....................................... 455/323; 455/313

(58) Field of Classification Search .................... 455/78, 455/307, 313, 323; 323/205, 282, 284, 304
See application file for complete search history.

(56) References Cited

U.S. PATENT DOCUMENTS

| | | | |
|---|---|---|---|
| 5,822,373 A | 10/1998 | Addy | |
| 6,240,100 B1 | 5/2001 | Riordan et al. | |
| 6,459,889 B1 | 10/2002 | Ruelke | |
| 7,522,900 B2 | 4/2009 | Allott et al. | |
| 7,536,331 B1 | 5/2009 | Pellegrino et al. | |
| 7,826,817 B2 * | 11/2010 | Sorrells et al. | ................ 455/323 |
| 8,160,196 B2 | 4/2012 | Parker et al. | |
| 8,160,534 B2 * | 4/2012 | Sorrells et al. | ................ 455/323 |
| 8,190,108 B2 | 5/2012 | Sorrells et al. | |
| 8,190,116 B2 | 5/2012 | Sorrells et al. | |
| 8,223,898 B2 | 7/2012 | Sorrells et al. | |
| 8,224,281 B2 | 7/2012 | Sorrells et al. | |
| 8,229,023 B2 | 7/2012 | Sorrells et al. | |
| 8,233,855 B2 | 7/2012 | Sorrells et al. | |
| 8,295,406 B1 | 10/2012 | Sorrells et al. | |
| 8,295,800 B2 | 10/2012 | Sorrells et al. | |
| 8,340,618 B2 | 12/2012 | Sorrells et al. | |
| 2012/0114078 A1 | 5/2012 | Sorrells et al. | |
| 2012/0220254 A1 | 8/2012 | Sorrells et al. | |
| 2012/0243643 A1 | 9/2012 | Sorrells et al. | |

OTHER PUBLICATIONS

Notice of Allowanced dated Apr. 20, 2012 cited in U.S. Appl. No. 09/569,045, filed May 10, 2000.
Notice of Allowanced dated Apr. 20, 2012 cited in U.S. Appl. No. 12/976,477, filed Dec. 22, 2010.
Notice of Allowance dated Feb. 29, 2012 cited in U.S. Appl. No. 11/589,921, filed Oct. 31, 2006.
Notice of Allowanced dated Mar. 6, 2012 cited in U.S. Appl. No. 13/040,570, filed Mar. 4, 2011.
Notice of Allowanced dated Mar. 21, 2012 cited in U.S. Appl. No. 13/093,887, filed Apr. 26, 2011.
Office Action dated Mar. 29, 2012 cited in U.S. Appl. No. 13/090,031, filed Apr. 19, 2011.

(Continued)

*Primary Examiner* — Sam Bhattacharya
(74) *Attorney, Agent, or Firm* — Workman Nydegger

(57) ABSTRACT

Frequency translation and applications of same are described herein. Such applications include, but are not limited to, frequency down-conversion, frequency up-conversion, enhanced signal reception, unified down-conversion and filtering, and combinations and applications of same.

42 Claims, 58 Drawing Sheets

Related U.S. Application Data

Sep. 21, 2005, now Pat. No. 7,697,916, which is a continuation of application No. 10/086,250, filed on Mar. 4, 2002, now Pat. No. 7,016,663, which is a continuation of application No. 09/261,129, filed on Mar. 3, 1999, now Pat. No. 6,370,371, which is a continuation-in-part of application No. 09/176,027, filed on Oct. 21, 1998, now abandoned.

(56) References Cited

OTHER PUBLICATIONS

Notice of Allowanced dated Apr. 10, 2012 cited in U.S. Appl. No. 12/776,173, filed May 7, 2010.
Notice of Allowanced dated Jul. 26, 2012 cited in U.S. Appl. No. 12/876,356, filed Sep. 7, 2010.
Office Action dated Aug. 8, 2012 cited in U.S. Appl. No. 12/634,233, filed Dec. 9, 2009.
Office Action dated Aug. 15, 2012 cited in U.S. Appl. No. 12/118,111, filed May 9, 2008.
U.S. Appl. No. 13/090,031, Jun. 7, 2012, Notice of Allowance.
U.S. Appl. No. 12/615,326, Jun. 8, 2012, Notice of Allowance.
Notice of Allowance dated Oct. 22, 2012 cited in U.S. Appl. No. 12/976,839, filed Dec. 22, 2010.
U.S. Appl. No. 13/428,816, Mailed Dec. 17, 2012, Office Action.
U.S. Appl. No. 13/323,550, Mailed Dec. 21, 2012, Office Action.
U.S. Appl. No. 12/118,111, Mailed Jan. 7, 2013, Notice of Allowance.

\* cited by examiner

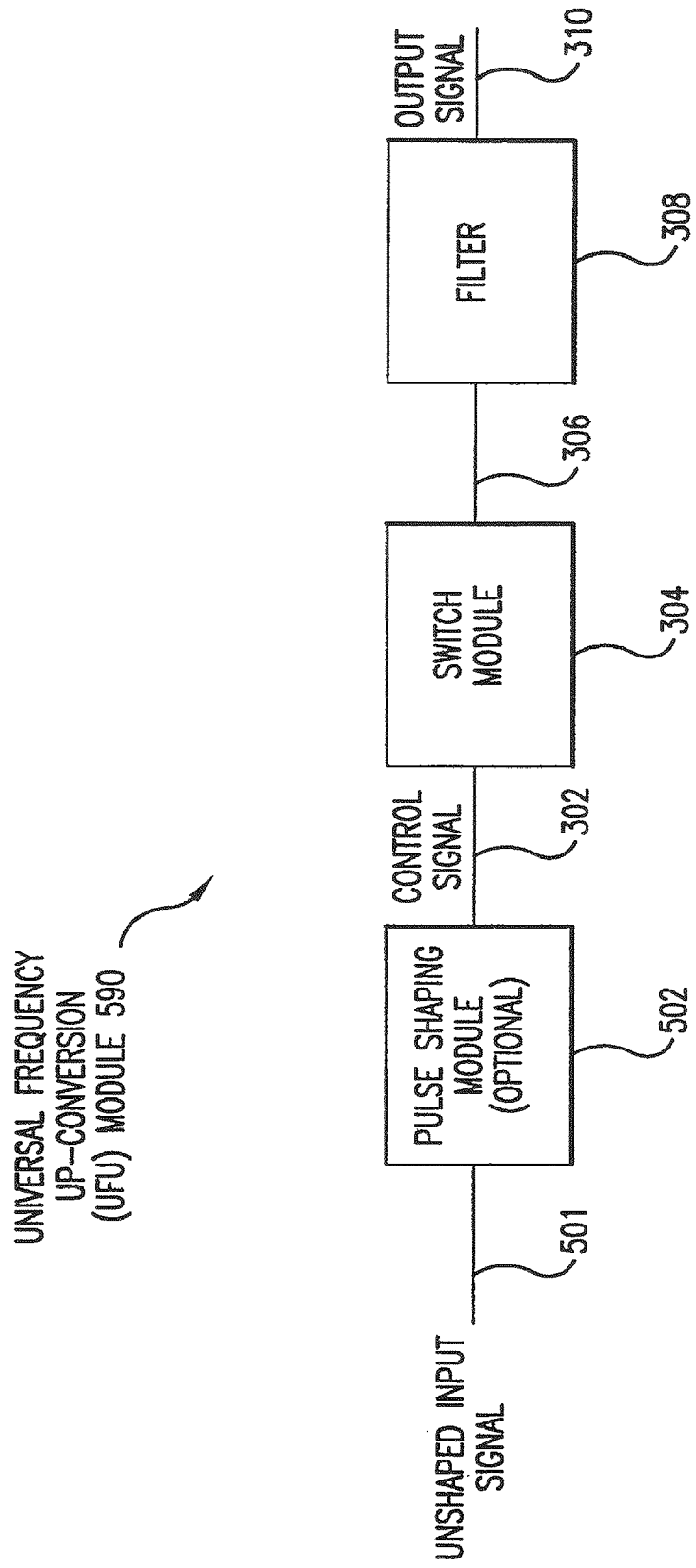

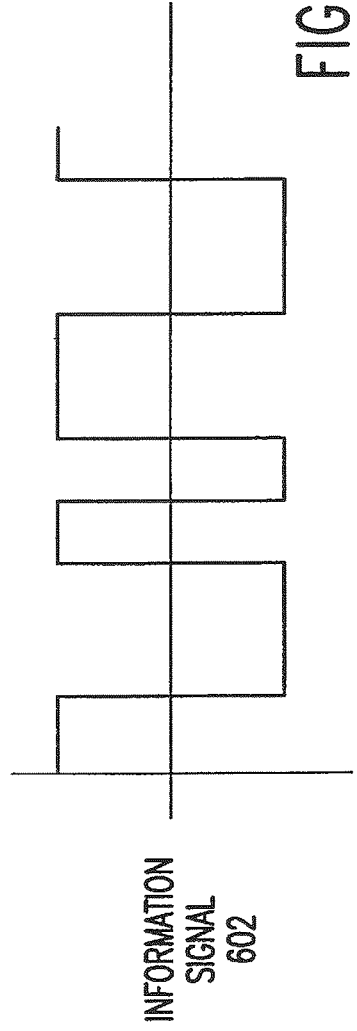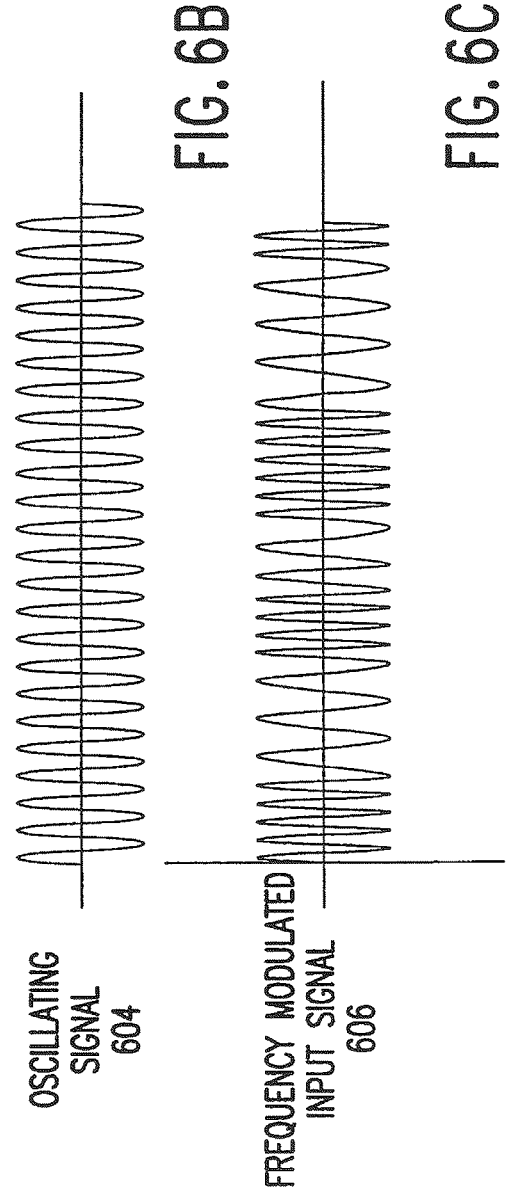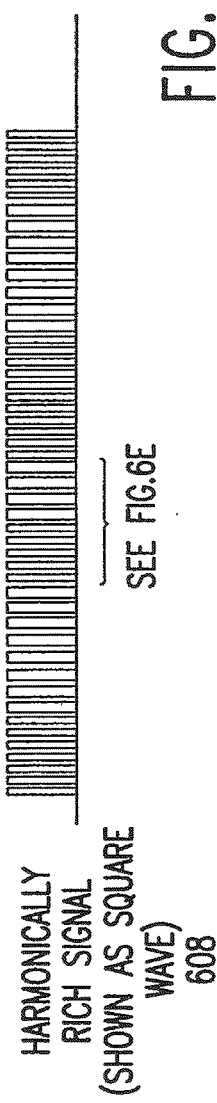

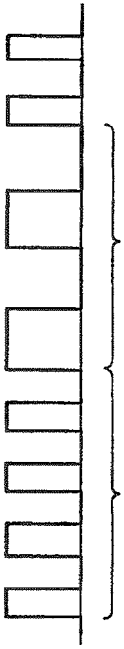
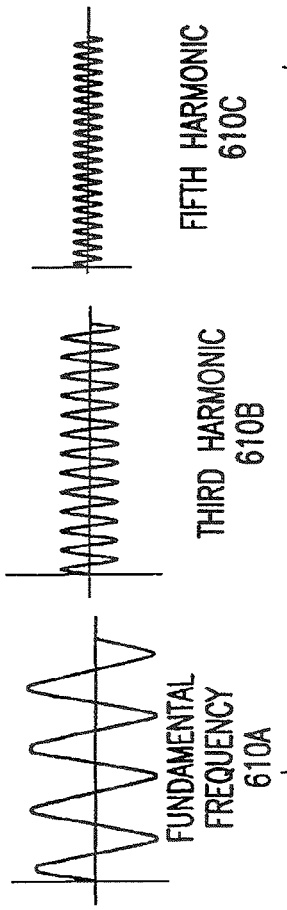
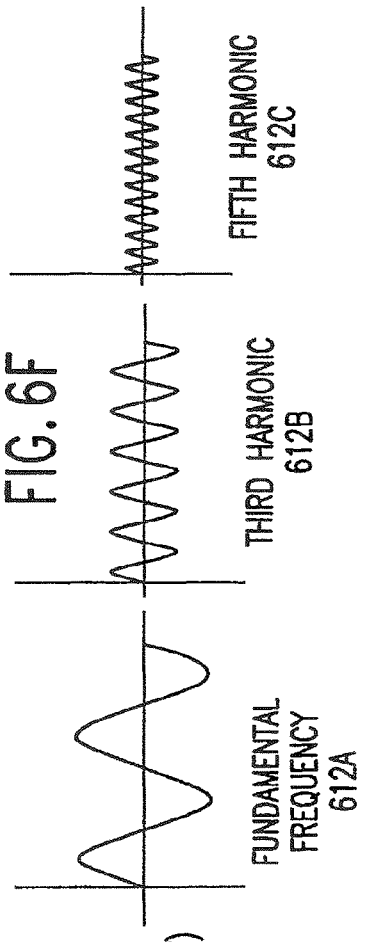

HARMONICS OF SIGNALS 610 AND 612 (SHOWN SIMULTANEOUSLY BUT NOT SUMMED)

FILTERED OUTPUT SIGNAL 614

| TIME \ NODE | t−1 (RISING EDGE OF φ₁) | t−1 (RISING EDGE OF φ₂) | t (RISING EDGE OF φ₁) | t (RISING EDGE OF φ₂) | t+1 (RISING EDGE OF φ₁) |
|---|---|---|---|---|---|
| 1902 | $VI_{t-1}$ 1804 | $VI_{t-1}$ 1808 | $VI_t$ 1816 | $VI_t$ 1826 | $VI_{t+1}$ 1838 |
| 1904 | — | $VI_{t-1}$ 1810 | $VI_{t-1}$ 1818 | $VI_t$ 1828 | $VI_t$ 1840 |
| 1906 | $VO_{t-1}$ 1806 | $VO_{t-1}$ 1812 | $VO_t$ 1820 | $VO_t$ 1830 | $VO_{t+1}$ 1842 |
| 1908 | — | $VO_{t-1}$ 1814 | $VO_{t-1}$ 1822 | $VO_t$ 1832 | $VO_t$ 1844 |
| 1910 | — | — | $VO_{t-1}$ 1824 | $VO_{t-1}$ 1834 | $VO_t$ 1846 |
| 1912 | — | 1815 | — | $VO_{t-1}$ 1836 | $VO_{t-1}$ 1848 |
| 1918 | — | — | — | — | $VI_t - 0.1 \ast VO_t - 0.8 \ast VO_{t-1}$ 1850 |

FIG. 18

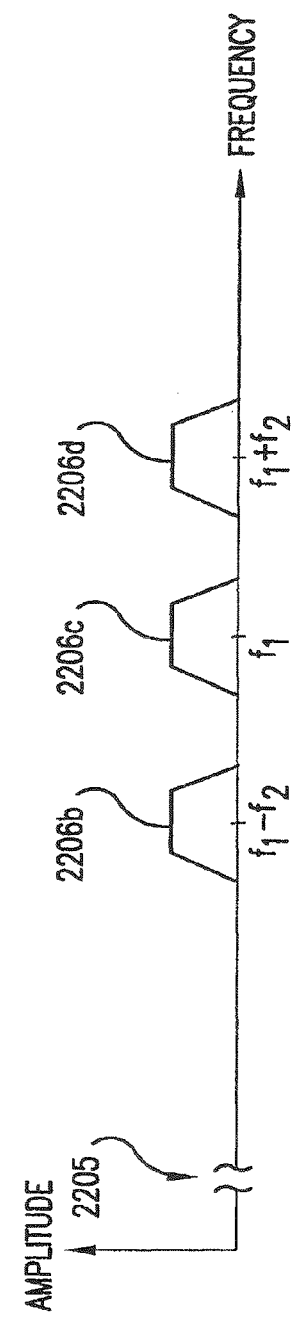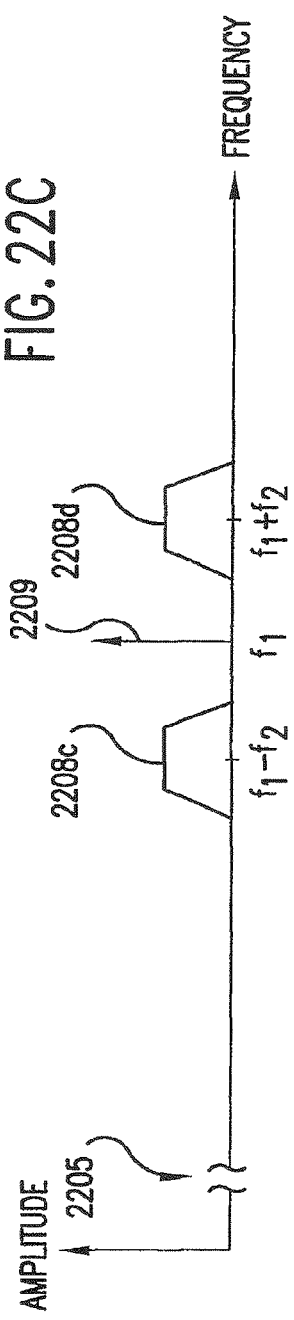

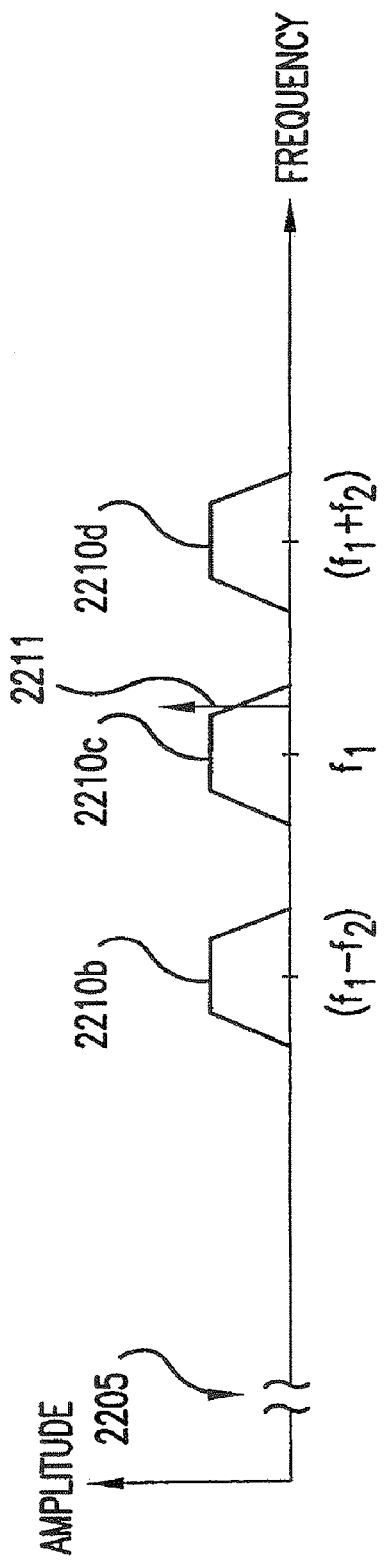
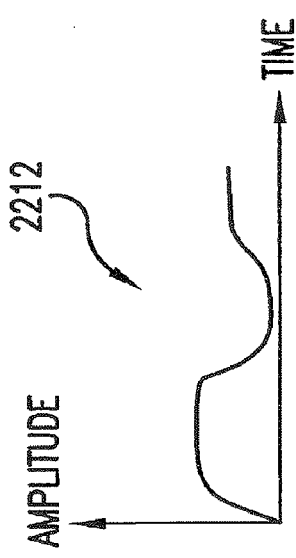
FIG. 22E
FIG. 22F

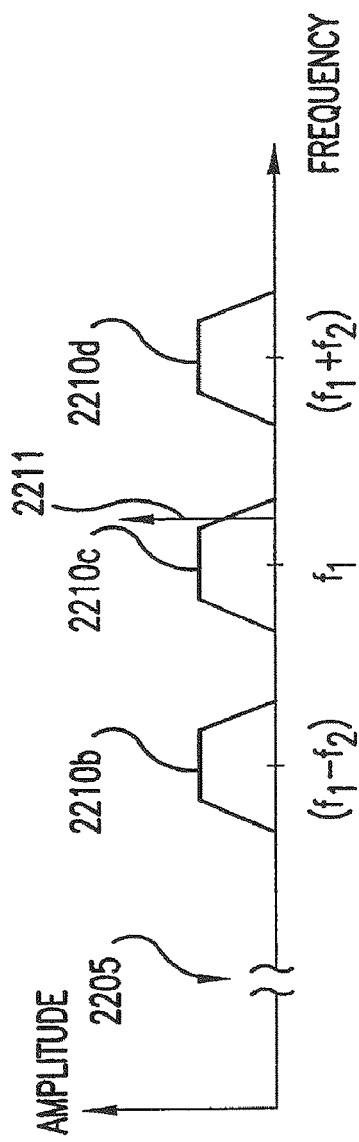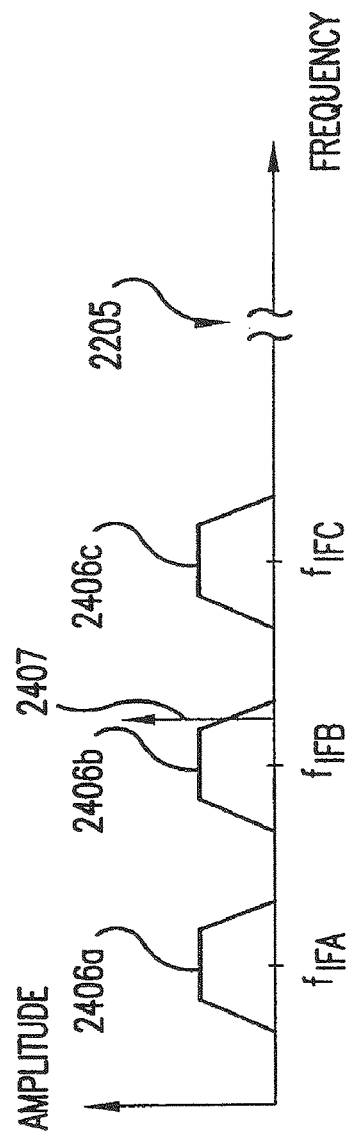

APPLICATIONS OF UNIVERSAL FREQUENCY TRANSLATION

CROSS-REFERENCE TO RELATED APPLICATIONS

This application is a continuation of U.S. patent application Ser. No. 12/881,912, filed Sep. 14, 2010, and entitled "APPLICATIONS OF UNIVERSAL FREQUENCY TRANSLATION", which is herein incorporated by reference in its entirety, which is a Continuation of co-pending U.S. Continuation application Ser. No. 12/408,498, filed on Mar. 20, 2009, entitled "APPLICATIONS OF UNIVERSAL FREQUENCY TRANSLATION" by Sorrells, David F. et al., the entire contents of which are incorporated by reference and for which priority is claimed under 35 U.S.C. 120. As in the parent U.S. Continuation application Ser. No. 12/408,498, priority is also claimed under 35 U.S.C 120 to U.S. Continuation application Ser. No. 11/230,732, filed on Sep. 21, 2005, entitled "APPLICATIONS OF UNIVERSAL FREQUENCY TRANSLATION" by Sorrells, David F. et al., now U.S. Pat. No. 7,697,916, issued on Apr. 13, 2010 which is a Continuation of U.S. Continuation application Ser. No. 10/086,250, filed on Mar. 4, 2002, entitled "APPLICATIONS OF UNIVERSAL FREQUENCY TRANSLATION" by Sorrells, David F. et al, now U.S. Pat. No. 7,016,663, issued on Mar. 21, 2006 which is a Continuation of U.S. application Ser. No. 09/261,129, filed on Mar. 3, 1999, entitled APPLICATIONS OF UNIVERSAL FREQUENCY TRANSLATION" by Sorrells, David F. et al, now U.S. Pat. No. 6,370,371, issued on Apr. 9, 2002, which is a Continuation-In-Part of U.S. application Ser. No. 09/176,027, filed Oct. 21, 1998 entitled "UNIVERSAL FREQUENCY TRANSLATION AND APPLICATIONS OF SAME," by Sorrells, David F. et al, now abandoned, the entire contents of each is incorporated herein by reference and for which benefit is claimed under 35 U.S.C. 120.

CROSS-REFERENCE TO OTHER APPLICATIONS

The following applications of common assignee are related to the present application, and are herein incorporated by reference in their entireties: "Method and System for Down-Converting Electromagnetic Signals," Ser. No. 09/176,022, filed Oct. 21, 1998. "Method and System for Frequency Up-Conversion," Ser. No. 09/176,154, filed Oct. 21, 1998. "Method and System for Ensuring Reception of a Communications Signal," Ser. No. 09/176,415, filed Oct. 21, 1998. "Integrated Frequency Translation And Selectivity," Ser. No. 09/175,966, filed Oct. 21, 1998.

BACKGROUND OF THE INVENTION

1. The Field of the Invention

The present invention is generally related to frequency translation, and applications of same.

2. Background and Relevant Art

Various communication components exist for performing frequency down-conversion, frequency up-conversion, and filtering. Also, schemes exist for signal reception in the face of potential jamming signals.

BRIEF SUMMARY OF THE INVENTION

The present invention is related to frequency translation, and applications of same. Such applications include, but are not limited to, frequency down-conversion, frequency up-conversion, enhanced signal reception, unified down-conversion and filtering, and combinations and applications of same.

Further features and advantages of the invention, as well as the structure and operation of various embodiments of the invention, are described in detail below with reference to the accompanying drawings. The drawing in which an element first appears is typically indicated by the leftmost character(s) and/or digit(s) in the corresponding reference number.

BRIEF DESCRIPTION OF THE DRAWINGS

The present invention will be described with reference to the accompanying drawings, wherein:

FIG. 5 is a block diagram of a universal frequency up-conversion (UFU) module according to an alternative embodiment of the invention;

FIGS. 6A-6I illustrate example waveforms used to describe the operation of the UFU module;

FIG. 18 is a table of example values at nodes in the UDF module of FIG. 17;

FIGS. 22A-22F are example waveforms is used to describe the system of FIG. 21;

FIGS. 24B-24J are example waveforms used to further describe the enhanced signal reception system according to an embodiment of the invention;

FIG. 42D illustrates the orientation of FIGS. 42A-42C (some overlap is shown in FIGS. 42A-42C for illustrative purposes);

DETAILED DESCRIPTION OF THE PREFERRED EMBODIMENTS

Table of Contents

Universal Frequency Translation
Frequency Down-conversion
Frequency Up-conversion
Enhanced Signal Reception
Unified Down-conversion and Filtering
Example Application Embodiments of the Invention
    Telephones
    Base Stations
    Positioning
    Data Communication
    Pagers
    Security
    Repeaters
    Mobile Radios
    Satellite Up/Down Links
    Command and Control
        PC Peripherals
        Building/Home Functions
        Automotive Controls
        Aircraft Controls
        Maritime Controls
    Radio Control
    Radio Synchronous Watch
    Other Example Applications
        Applications Involving Enhanced Signal Reception
        Applications Involving Unified Down-conversion and Filtering
Conclusion Universal Frequency Translation The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
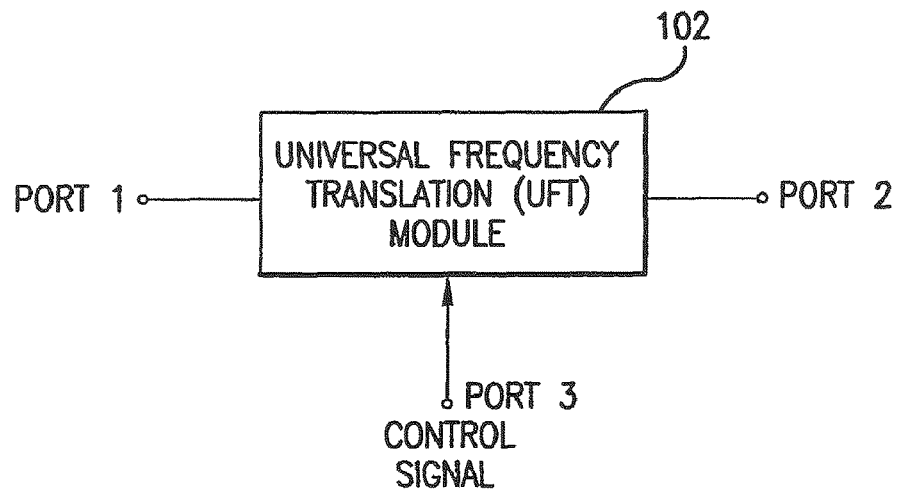
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
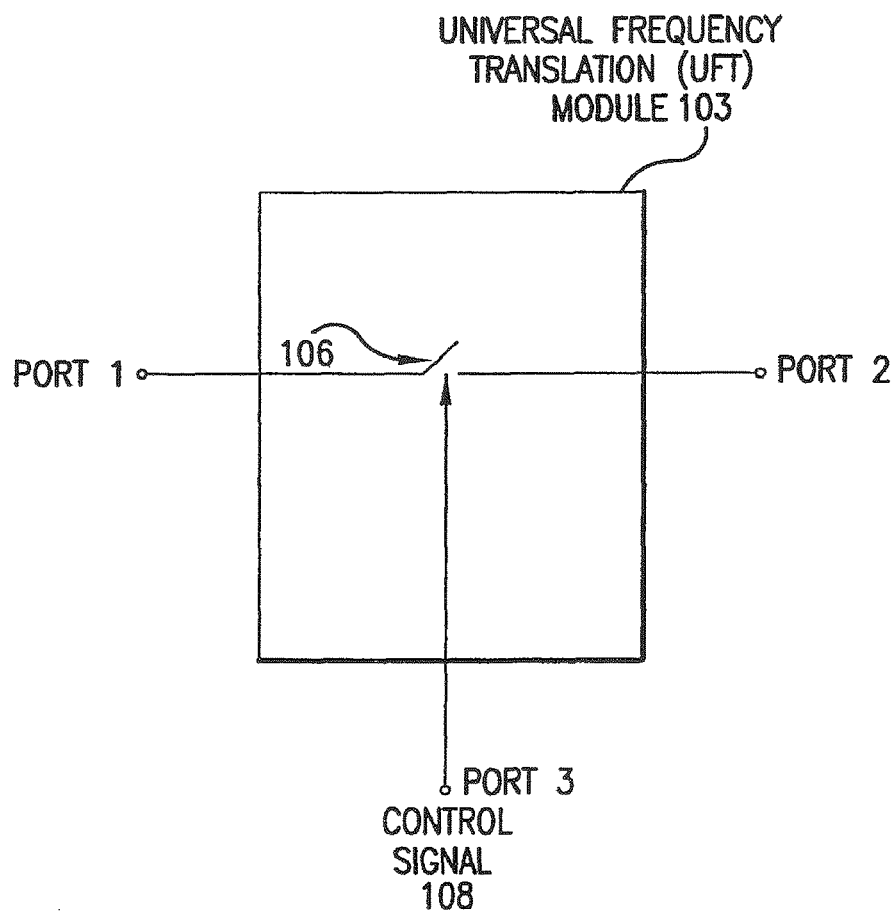
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2:
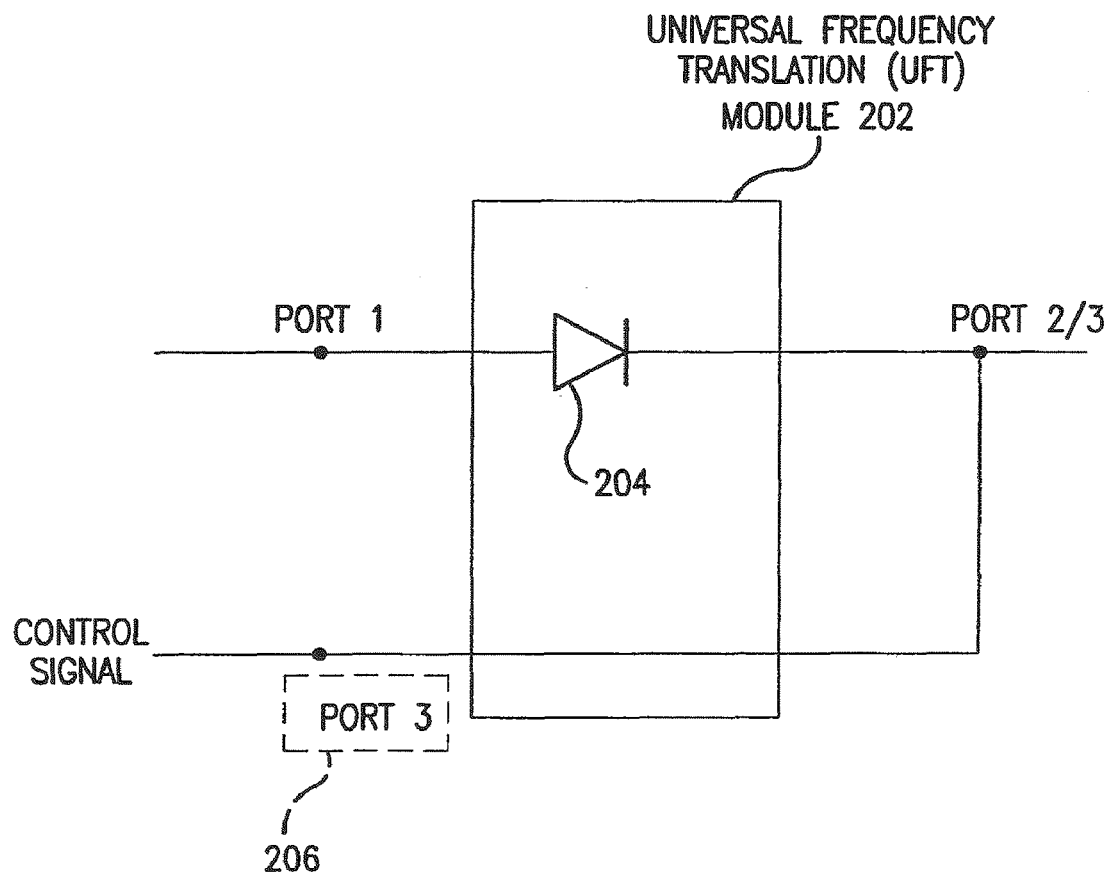
FIG. 2 is a block diagram of a universal frequency translation (UFT) module according to an alternative embodiment of the invention.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
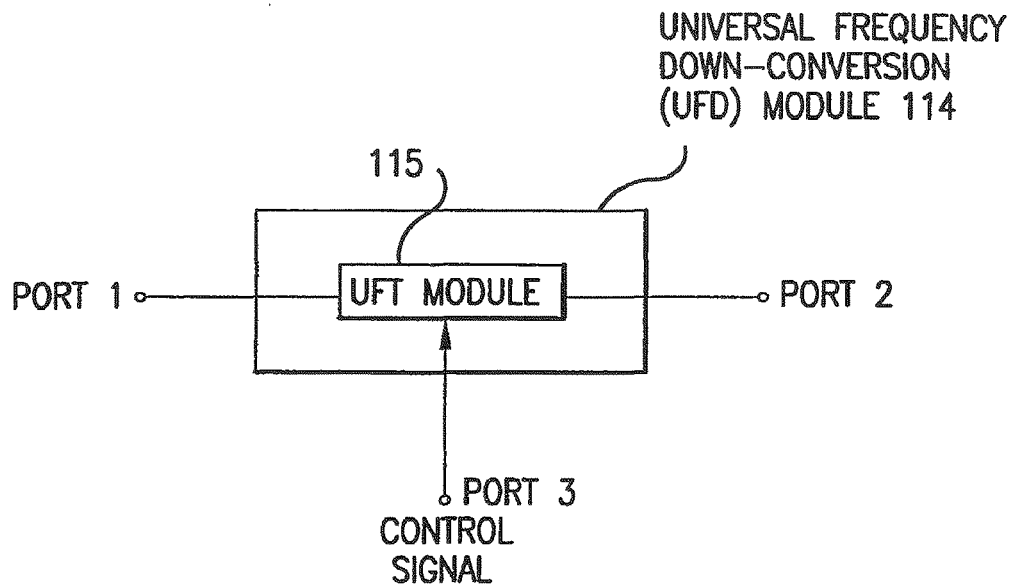
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
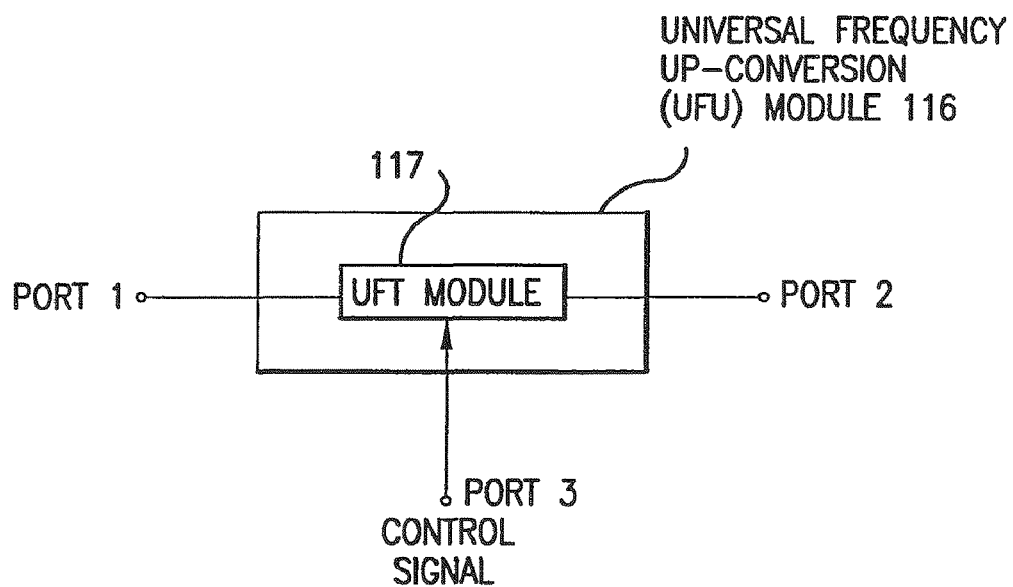
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

Frequency Down-Conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in co-pending U.S. patent application entitled "Method and System for Down-Converting Electromagnetic Signals," Ser. No. 09/176,022, filed Oct. 21, 1998, the full disclosure of which is incorporated herein by reference. A relevant portion of the above mentioned patent application is summarized below to describe down-converting an input signal to produce a down-converted signal that exists at a lower frequency or a baseband signal.

Figure 20A:
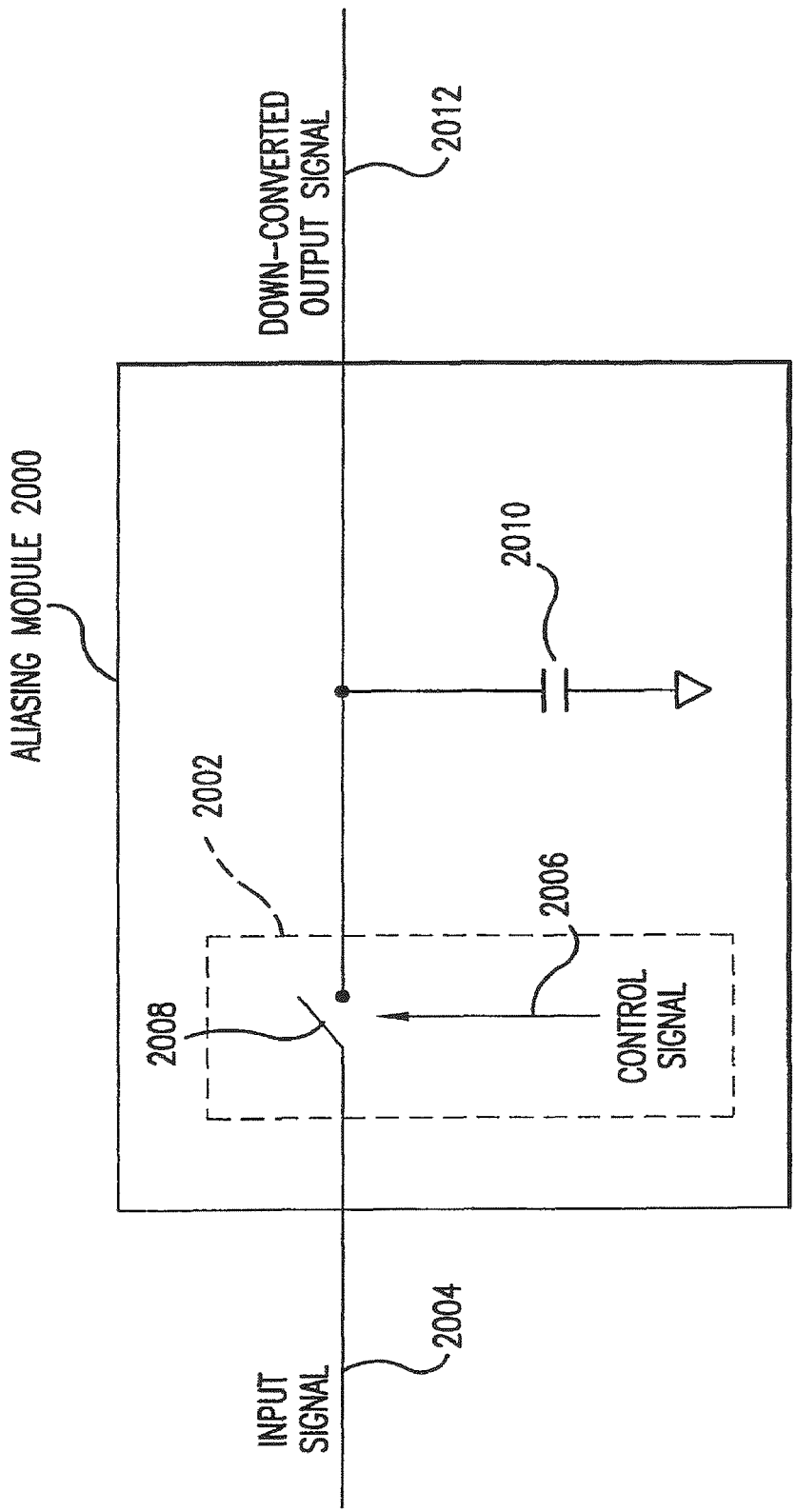
FIGS. 20A and 20A-1 are example aliasing modules according to embodiments of the invention.
Figures 1, 20A:
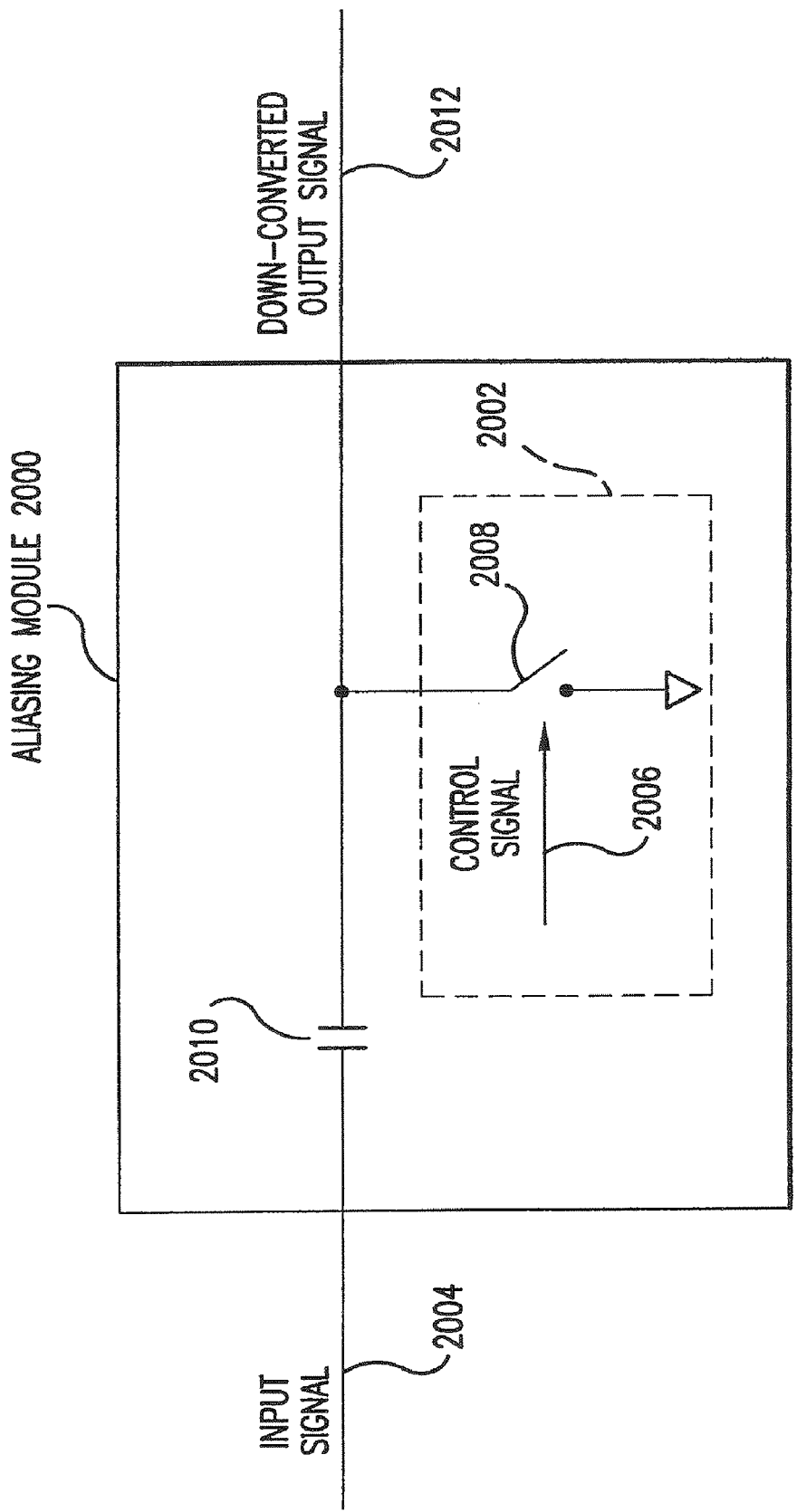

FIG. 20A illustrates an aliasing module 2000 for down-conversion using a universal frequency translation (UFT) module 2002 which down-converts an EM input signal 2004. In particular embodiments, aliasing module 2000 includes a switch 2008 and a capacitor 2010. The electronic alignment of the circuit components is flexible. That is, in one implementation, the switch 2008 is in series with input signal 2004 and capacitor 2010 is shunted to ground (although it may be other than ground in configurations such as differential mode). In a second implementation (see FIG. 20A-1), the capacitor 2010 is in series with the input signal 2004 and the switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of the EM input signal 2004.

In one implementation, aliasing module 2000 down-converts the input signal 2004 to an intermediate frequency (IF) signal. In another implementation, the aliasing module 2000 down-converts the input signal 2004 to a demodulated baseband signal. In yet another implementation, the input signal 2004 is a frequency modulated (FM) signal, and the aliasing module 2000 down-converts it to a non-FM signal, such as a phase modulated (PM) signal or an amplitude modulated (AM) signal. Each of the above implementations is described below.

In an embodiment, the control signal 2006 includes a train of pulses that repeat at an aliasing rate that is equal to, or less than, twice the frequency of the input signal 2004. In this embodiment, the control signal 2006 is referred to herein as an aliasing signal because it is below the Nyquist rate for the frequency of the input signal 2004. Preferably, the frequency of control signal 2006 is much less than the input signal 2004.

Figure 20B:
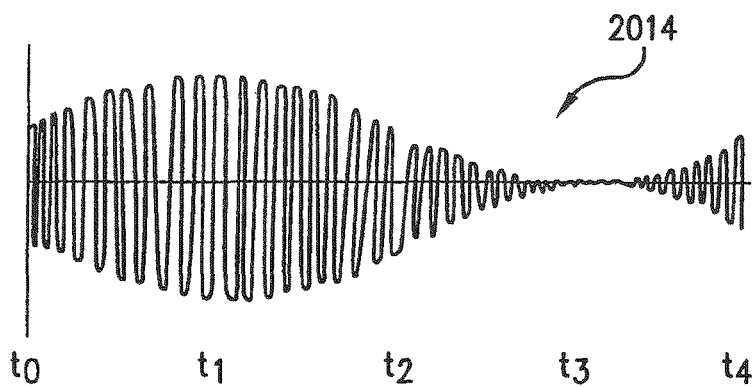
FIGS. 20B-20F are example waveforms used to describe the operation of the aliasing modules of FIGS. 20A and 20A-1.
Figure 20C:
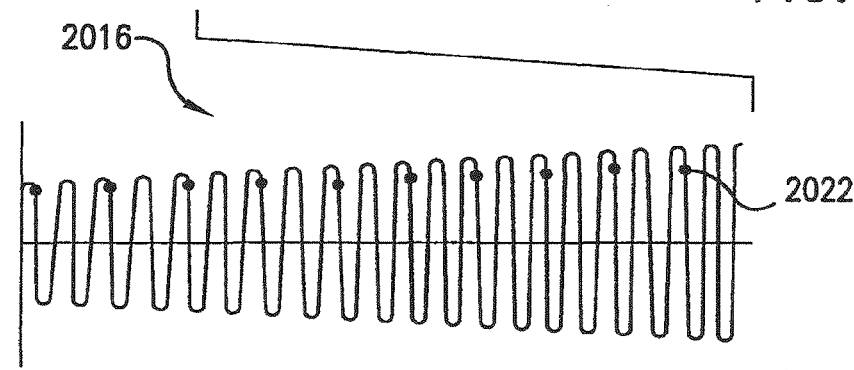
Figure 20D:
Figure 20E:
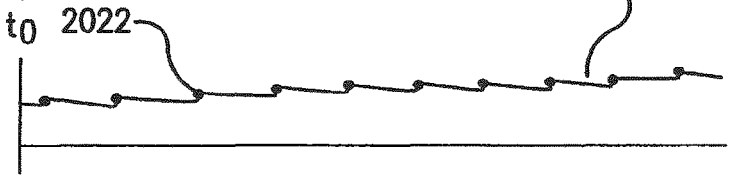

A train of pulses 2018 as shown in FIG. 20D controls the switch 2008 to alias the input signal 2004 with the control signal 2006 to generate a down-converted output signal 2012. More specifically, in an embodiment, switch 2008 closes on a first edge of each pulse 2020 of FIG. 20D and opens on a second edge of each pulse. When the switch 2008 is closed, the input signal 2004 is coupled to the capacitor 2010, and charge is transferred from the input signal to the capacitor 2010. The charge stored during successive pulses forms down-converted output signal 2012.

Exemplary waveforms is are shown in FIGS. 20B-20F.

FIG. 20B illustrates an analog amplitude modulated (AM) carrier signal 2014 that is an example of input signal 2004. For illustrative purposes, in FIG. 20C, an analog AM carrier signal portion 2016 illustrates a portion of the analog AM carrier signal 2014 on an expanded time scale. The analog AM carrier signal portion 2016 illustrates the analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as the analog AM carrier signal portion 2016. In the example shown in FIG. 20D, the aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). The pulses 2020 repeat at an aliasing rate, or pulse repetition rate of aliasing signal 2018. The aliasing rate is determined as described below, and further described in co-pending U.S. patent application entitled "Method and System for Down-converting Electromagnetic Signals," application Ser. No. 09/176,022.

Figure 20F:
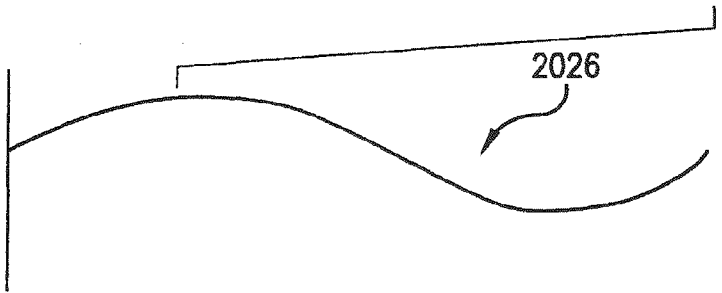

As noted above, the train of pulses 2020 (i.e., control signal 2006) control the switch 2008 to alias the analog AM carrier signal 2016 (i.e., input signal 2004) at the aliasing rate of the aliasing signal 2018. Specifically, in this embodiment, the switch 2008 closes on a first edge of each pulse and opens on a second edge of each pulse. When the switch 2008 is closed, input signal 2004 is coupled to the capacitor 2010, and charge is transferred from the input signal 2004 to the capacitor 2010. The charge transferred during a pulse is referred to herein as an under-sample. Exemplary under-samples 2022 form down-converted signal portion 2024 (FIG. 20E) that corresponds to the analog AM carrier signal portion 2016 (FIG. 20C) and the train of pulses 2020 (FIG. 20D). The charge stored during successive under-samples of AM carrier signal 2014 form the down-converted signal 2024 (FIG. 20E) that is an example of down-converted output signal 2012 (FIG. 20A). In FIG. 20F, a demodulated baseband signal 2026 represents the demodulated baseband signal 2024 after filtering on a compressed time scale. As illustrated, down-converted signal 2026 has substantially the same "amplitude envelope" as AM carrier signal 2014. Therefore, FIGS. 20B-20F illustrate down-conversion of AM carrier signal 2014.

The waveforms shown in FIGS. 20B-20F are discussed herein for illustrative purposes only, and are not limiting. Additional exemplary time domain and frequency domain drawings, and exemplary methods and systems of the invention relating thereto, are disclosed in co-pending U.S. patent application entitled "Method and System for Down-converting Electromagnetic Signals," application Ser. No. 09/176,022.

The aliasing rate of control signal 2006 determines whether the input signal 2004 is down-converted to an IF signal, down-converted to a demodulated baseband signal, or down-converted from an FM signal to a PM or an AM signal. Generally, relationships between the input signal 2004, the aliasing rate of the control signal 2006, and the down-converted output signal 2012 are illustrated below:

(Freq. of input signal 2004)=*n*((Freq. of control signal 2006)±(Freq. of down-converted output signal 2012)

For the examples contained herein, only the "+" condition will be discussed. The value of n represents a harmonic or sub-harmonic of input signal 2004 (e.g., n=0.5, 1, 2, 3, ... ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If the input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 2006 would be calculated as follows:

(Freq$_{input}$−Freq$_{IF}$)/n=Freq$_{control}$(901 MHZ−1 MHZ)/n=900/n

For n=0.5, 1, 2, 3, 4, etc., the frequency of the control signal 2006 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in co-pending U.S. patent application entitled "Method and System for Down-converting Electromagnetic Signals," application Ser. No. 09/176,022.

Alternatively, when the aliasing rate of the control signal 2006 is substantially equal to the frequency of the input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of the input signal 2004. As a result, the under-samples form a constant output baseband signal. If the input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 2006 would be calculated as follows:

(Freq$_{input}$−Freq$_{IF}$)/n=Freq$_{control}$(900 MHZ−1 MHZ)/n=900 MHZ/n

For n=0.5, 1, 2, 3, 4, etc., the frequency of the control signal 2006 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in the co-pending U.S. patent application entitled "Method and System for Down-converting Electromagnetic Signals," application Ser. No. 09/176,022.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_Z$ (that is, $[[((F)][1+F]2)\div2]$) of the FSK signal is down-converted to zero IF. For example, to down-convert an FSK signal having $F_1$ equal to 899 MHZ and $F_Z$ equal to 901 MHZ, to a PSK signal, the aliasing rate of the control signal 2006 would be calculated as follows:

$$\text{Frequency of the input} = [(F)_1 1 + F_1 2) \div 2$$

$$= (899 \text{ MHZ} + 901 \text{ MHZ}) \div 2$$

$$= 900 \text{ MHZ}$$

Frequency of the down-converted signal=0 (i.e., baseband)

(Freq$_{input}$−Freq$_{IF}$)/n=Freq$_{control}$(900 MHZ−0 MHZ)/n=900 MHZ/n

For n=0.5, 1, 2, 3, etc., the frequency of the control signal 2006 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_Z$.

As another example, to down-convert a FSK signal to an amplitude shift keying (ASK) signal (a subset of AM), either the lower frequency $F_1$ or the upper frequency $F_Z$ of the FSK signal is down-converted to zero IF. For example, to down-convert an FSK signal having $F_1$ equal to 900 MHZ and $F_Z$ equal to 901 MHZ, to an ASK signal, the aliasing rate of the control signal 2006 should be substantially equal to:

(900 MHZ−0 MHZ)/n=900 MHZ/n, or (901 MHZ−0 MHZ)/n=900 MHZ/n

For the former case of 900 MHZ/n, and for n=0.5, 1, 2, 3, 4, etc., the frequency of the control signal 2006 should be substantially equal to 1.8 GHz, 900 MHZ, 450 MHZ, 300 MHZ, 225 MHZ, etc. For the latter case of 900 MHZ/n, and for n=0.5, 1, 2, 3, 4, etc., the frequency of the control signal 2006 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_Z$ (i.e., 1 MHZ).

Exemplary time domain and frequency domain drawings, illustrating down-conversion of FM signals to non-FM signals, and exemplary methods and systems thereof, are disclosed in the co-pending U.S. patent application entitled "Method and System for Down-converting Electromagnetic Signals," application Ser. No. 09/176,022.

In an embodiment, the pulses of the control signal 2006 have negligible apertures that tend towards zero. This makes the UFT module 2002 a high input impedance device. This configuration is useful for situations where minimal disturbance of the input signal may be desired.

In another embodiment, the pulses of the control signal 2006 have non-negligible apertures that tend away from zero. This makes the UFT module 2002 a lower input impedance device. This allows the lower input impedance of the UFT module 2002 to be substantially matched with a source impedance of the input signal 2004. This also improves the energy transfer from the input signal 2004 to the down-converted output signal 2012, and hence the efficiency and signal to noise (s/n) ratio of UFT module 2002.

Exemplary systems and methods for generating and optimizing the control signal 2006, and for otherwise improving energy transfer and s/n ratio, are disclosed in the co-pending U.S. patent application entitled "Method and System for Down-converting Electromagnetic Signals," application Ser. No. 09/176,022.

Frequency Up-Conversion

The present invention is directed to systems and methods of frequency up-conversion, and applications of same.

Figure 3:
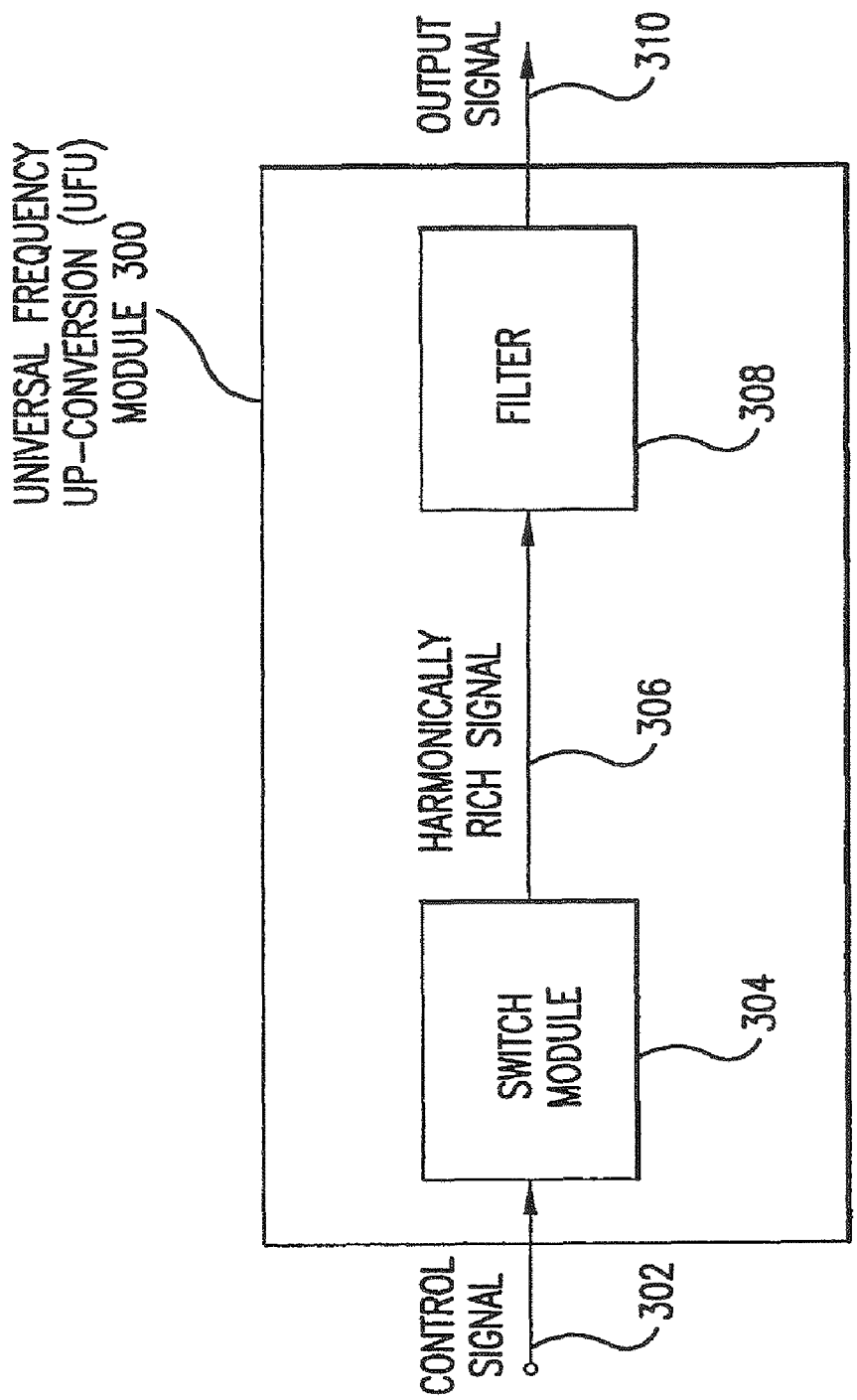
FIG. 3 is a block diagram of a universal frequency up-conversion (UFU) module according to an embodiment of the invention.

An example frequency up-conversion system 300 is illustrated in FIG. 3. The frequency up-conversion system 300 is now described.

An input signal 302 (designated as "Control Signal" in FIG. 3) is accepted by a switch module 304. For purposes of example only, assume that the input signal 302 is a FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. The information signal 602 can be analog, digital, or any combination thereof, and any modulation scheme can be used.

The output of switch module 304 is a harmonically rich signal 306, shown for example in FIG. 6D as a harmonically rich signal 608. The harmonically rich signal 608 has a continuous and periodic waveform.

FIG. 6E is an expanded view of two sections of harmonically rich signal 608, section 610 and section 612. The harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 6H:
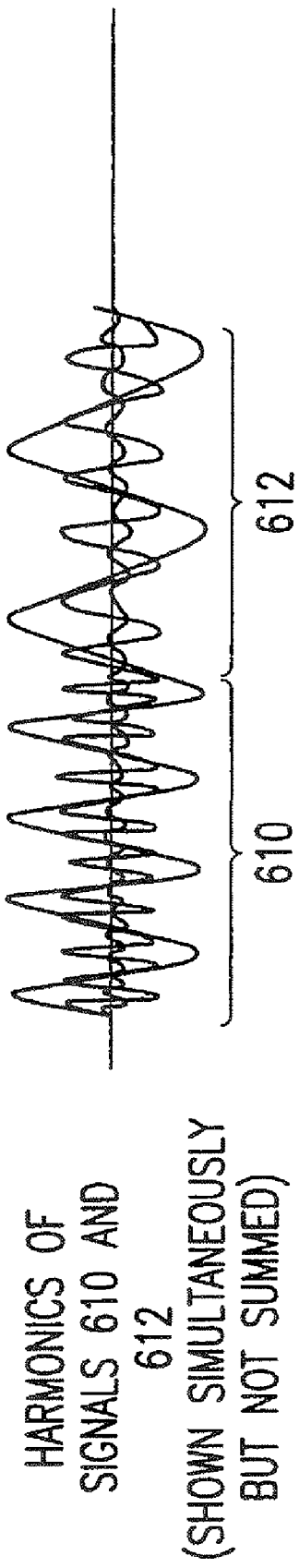

Harmonically rich signal 608 is comprised of a plurality of sinusoidal waves whose frequencies are integer multiples of the fundamental frequency of the waveform of the harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, the input signal 606 may be shaped to ensure that the amplitude of the desired harmonic is sufficient for its intended use (e.g., transmission).

Figure 6I:
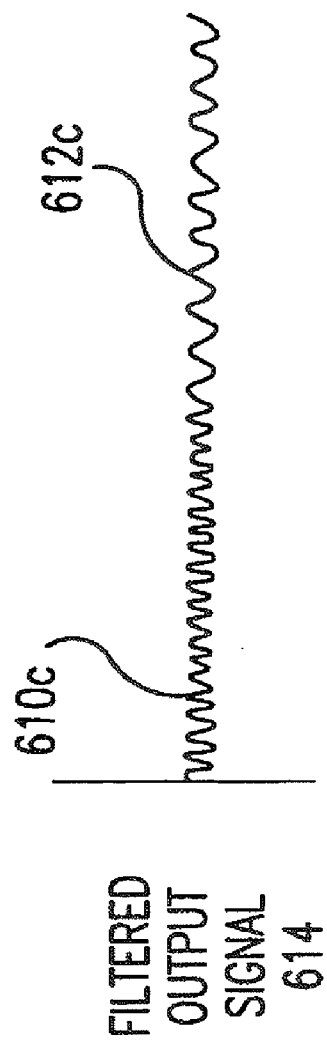

A filter 308 filters out any undesired frequencies (harmonics), and outputs an electromagnetic (EM) signal at the desired harmonic frequency or frequencies as an output signal 310, shown for example as a filtered output signal 614 in FIG. 6I.

Figure 4:
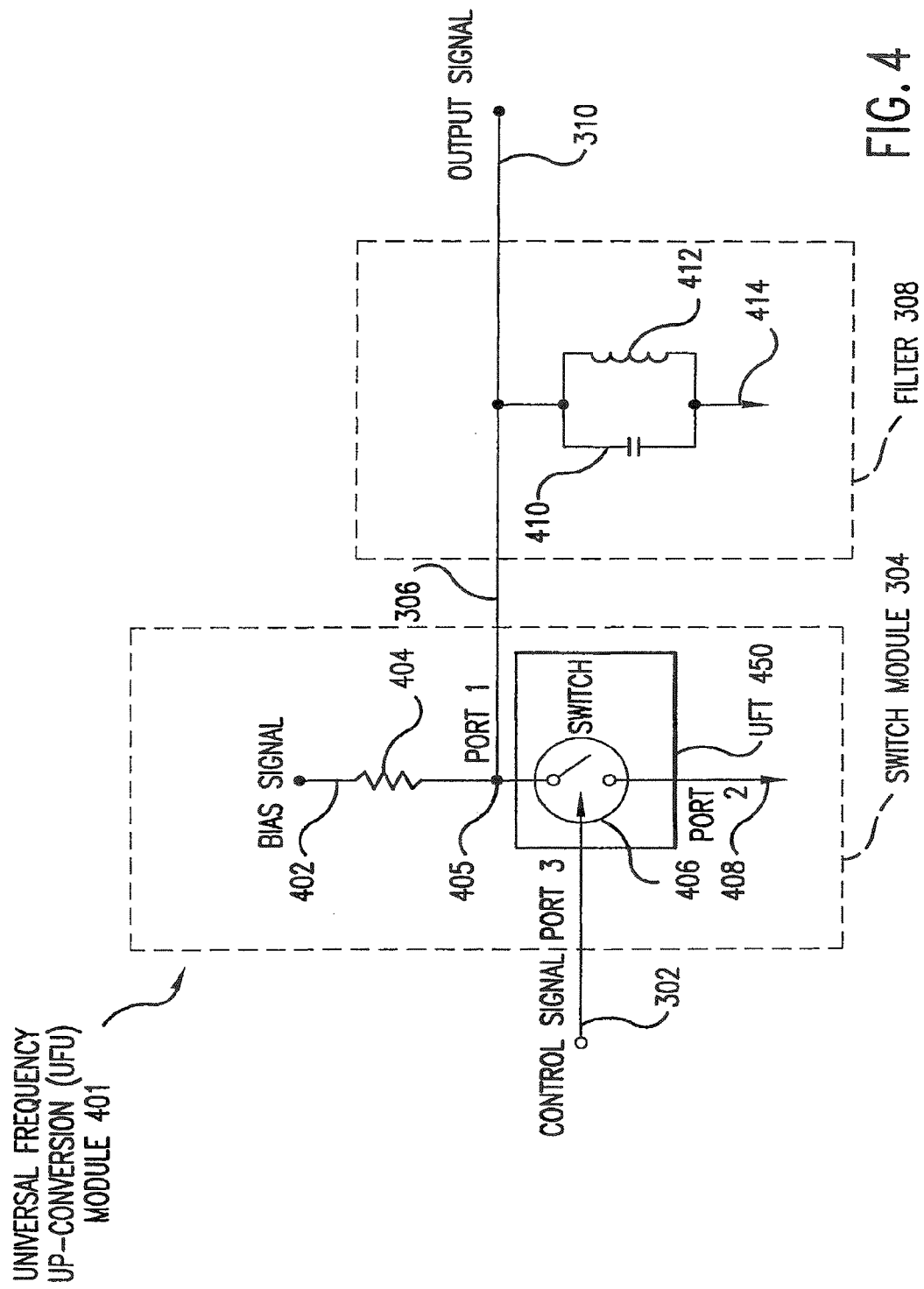
FIG. 4 is a more detailed diagram of a universal frequency up-conversion (UFU) module according to an embodiment of the invention.

FIG. 4 illustrates an example universal frequency up-conversion (UFU) module 401. The UFU module 401 includes an example switch module 304, which comprises a bias signal 402, a resistor or impedance 404, a universal frequency translator (UFT) 450, and a ground 408. The UFT 450 includes a switch 406. The input signal 302 (designated as "Control Signal" in FIG. 4) controls the switch 406 in the UFT 450, and causes it to close and open. Harmonically rich signal 306 is generated at a node 405 located between the resistor or impedance 404 and the switch 406.

Also in FIG. 4, it can be seen that an example filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

For example, in an alternate embodiment shown in FIG. 5, an unshaped input signal 501 is routed to a pulse shaping module 502. The pulse shaping module 502 modifies the unshaped input signal 501 to generate a (modified) input signal 302 (designated as the "Control Signal" in FIG. 5). The input signal 302 is routed to the switch module 304, which operates in the manner described above. Also, the filter 308 of FIG. 5 operates in the manner described above.

The purpose of the pulse shaping module 502 is to define the pulse width of the input signal 302. Recall that the input signal 302 controls the opening and closing of the switch 406 in switch module 304. During such operation, the pulse width of the input signal 302 establishes the pulse width of the harmonically rich signal 306. As stated above, the relative amplitudes of the harmonics of the harmonically rich signal 306 are a function of at least the pulse width of the harmonically rich signal 306. As such, the pulse width of the input signal 302 contributes to setting the relative amplitudes of the harmonics of harmonically rich signal 306.

Further details of up-conversion as described in this section are presented in pending U.S. application "Method and System for Frequency Up-Conversion," Ser. No. 09/176,154, filed Oct. 21, 1998, incorporated herein by reference in its entirety.

Enhanced Signal Reception

The present invention is directed to systems and methods of enhanced signal reception (ESR), and applications of same.

Figure 21:
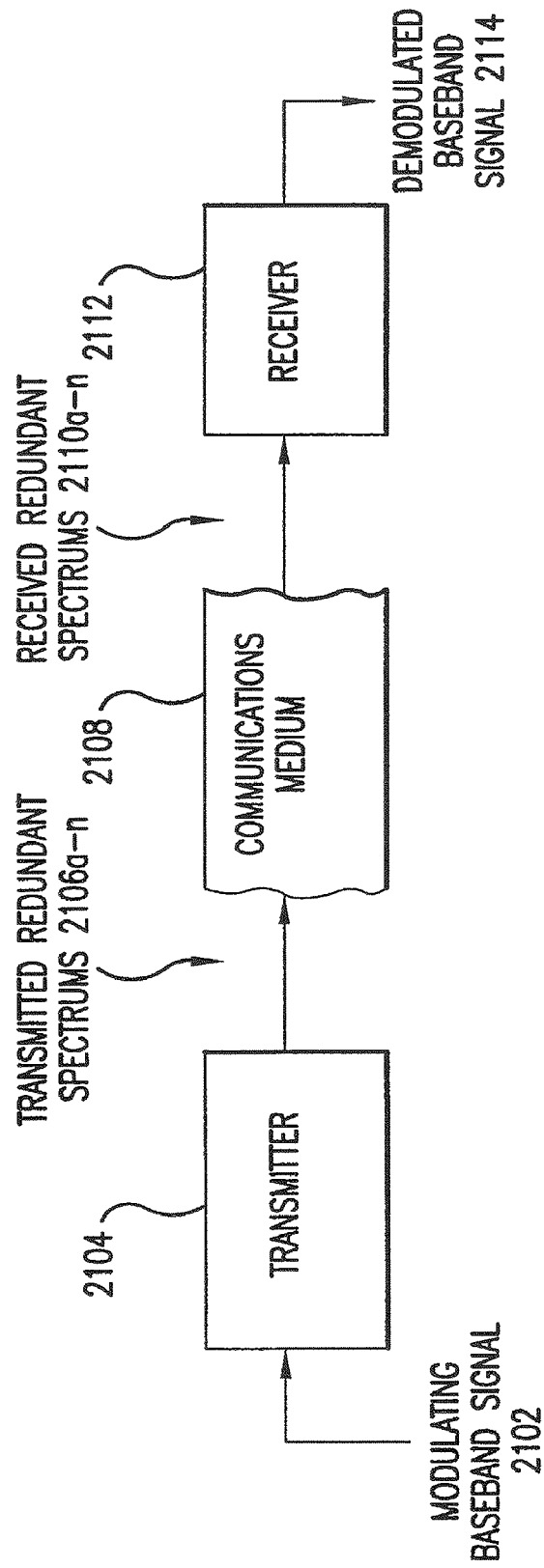
FIG. 21 illustrates an enhanced signal reception system according to an embodiment of the invention.

Referring to FIG. 21, transmitter 2104 accepts a modulating baseband signal 2102 and generates (transmitted) redundant spectrums 2106a-n, which are sent over communications medium 2108. Receiver 2112 recovers a demodulated baseband signal 2114 from (received) redundant spectrums 2110a-n. Demodulated baseband signal 2114 is representative of the modulating baseband signal 2102, where the level of similarity between the modulating baseband signal 2114 and the modulating baseband signal 2102 is application dependent.

Modulating baseband signal 2102 is preferably any information signal desired for transmission and/or reception. An example modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22a, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106a-n contains the necessary information to substantially reconstruct the modulating baseband signal 2102. In other words, each redundant spectrum 2106a-n contains the necessary amplitude, phase, and frequency information to reconstruct the modulating baseband signal 2102.

FIG. 22C illustrates example transmitted redundant spectrums 2206b-d. Transmitted redundant spectrums 2206b-d are illustrated to contain three redundant spectrums for illustration purposes only. Any number of redundant spectrums could be generated and transmitted as will be explained in following discussions.

Transmitted redundant spectrums 2206b-d are centered at $f_1$, with a frequency spacing $f_Z$ between adjacent spectrums. Frequencies $f_1$ and $f_Z$ are dynamically adjustable in real-time as will be shown below. FIG. 22D illustrates an alternate embodiment, where redundant spectrums 2208c,d are centered on unmodulated oscillating signal 2209 at $f_1$ (Hz). Oscillating signal 2209 may be suppressed if desired using, for example, phasing techniques or filtering techniques. Transmitted redundant spectrums are preferably above baseband frequencies as is represented by break 2205 in the frequency axis of FIGS. 22C and 22D.

Received redundant spectrums 2110a-n are substantially similar to transmitted redundant spectrums 2106a-n, except for the changes introduced by the communications medium 2108. Such changes can include but are not limited to signal attenuation, and signal interference. FIG. 22E illustrates example received redundant spectrums 2210b-d. Received redundant spectrums 2210b-d are substantially similar to transmitted redundant spectrums 2206b-d, except that redundant spectrum 2210c includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

As stated above, demodulated baseband signal 2114 is extracted from one or more of received redundant spectrums 2210b-d. FIG. 22F illustrates example demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectrums are transmitted, where each redundant spectrum carries the necessary information to reconstruct the baseband signal. At the destination, the redundant spectrums are isolated from each other so that the baseband signal can be recovered even if one or more of the redundant spectrums are corrupted by a jamming signal.

Figure 23A:
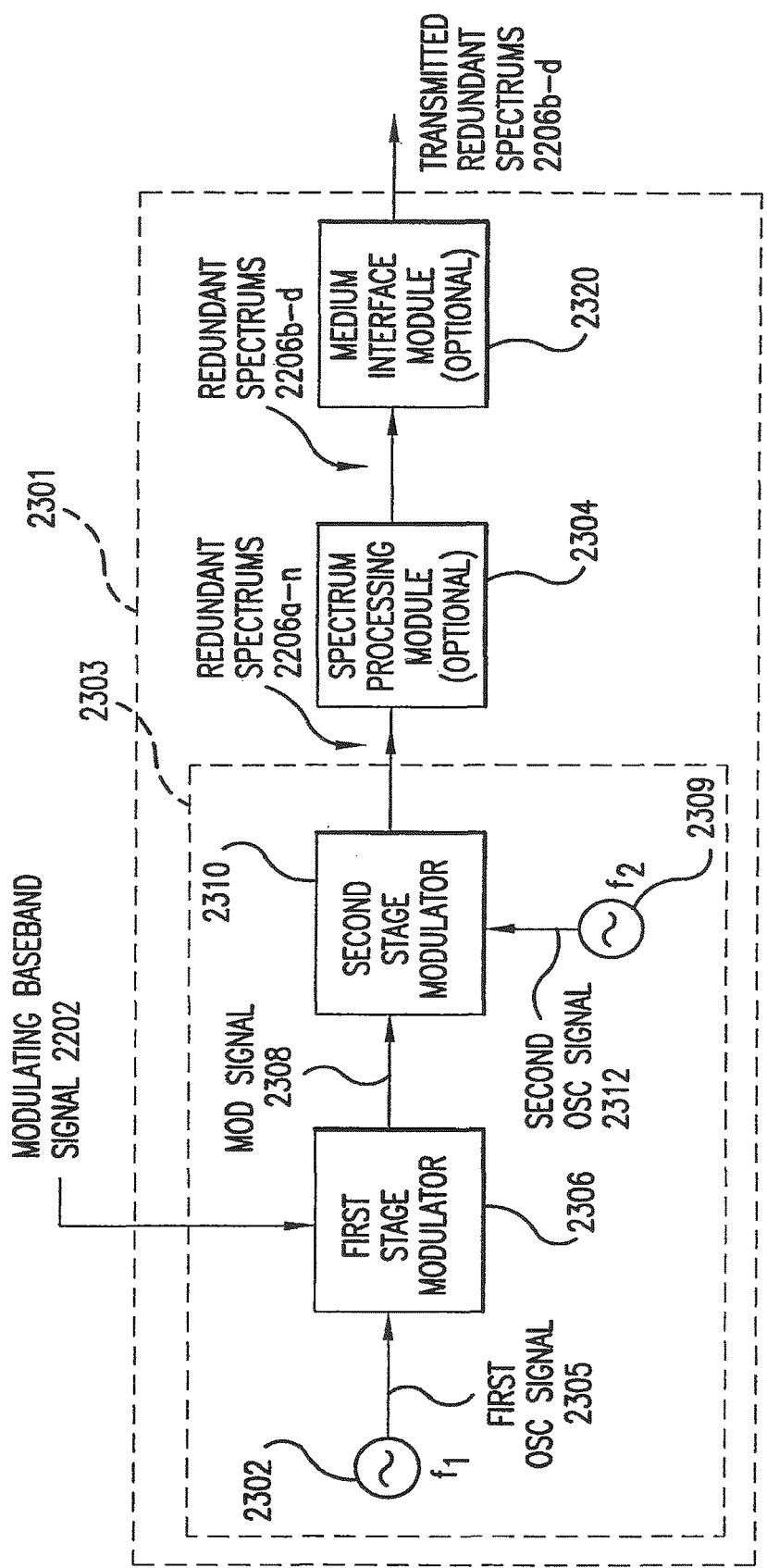
FIG. 23A illustrates an example transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectrums configured similar to redundant spectrums 2206b-d. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Figure 23B:
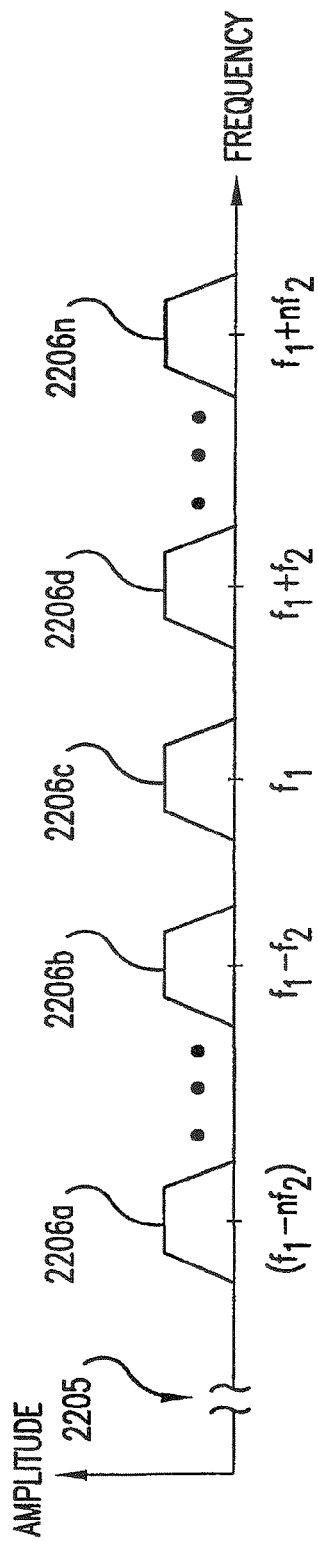
FIGS. 23B and 23C are example waveforms used to further describe the enhanced signal reception system according to an embodiment of the invention.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectrums 2206a-n shown in FIG. 23B. Second stage modulator 2310 is preferably a phase modulator, or a frequency modulator, although other types of modulation may be implemented including but not limited to amplitude modulation. Each redundant spectrum 2206a-n contains the necessary amplitude, phase, and frequency information to substantially reconstruct the modulating baseband signal 2202.

Redundant spectrums 2206a-n are substantially centered around $f_1$, which is the characteristic frequency of first oscillating signal 2305. Also, each redundant spectrum 2206a-n (except for 2206c) is offset from $f_1$ by approximately a multiple of $f_Z$ (Hz), where $f_Z$ is the frequency of the second oscillating signal 2312. Thus, each redundant spectrum 2206a-n is offset from an adjacent redundant spectrum by $f_Z$ (Hz). This allows the spacing between adjacent redundant spectrums to be adjusted (or tuned) by changing $f_1$ that is associated with second oscillator 2309. Adjusting the spacing between adjacent redundant spectrums allows for dynamic real-time tuning of the bandwidth occupied by redundant spectrums 2206a-n.

In one embodiment, the number of redundant spectrums 2206a-n generated by transmitter 2301 is arbitrary and may be unlimited as indicated by the "a-n" designation for redundant spectrums 2206a-n. However, a typical communications medium will have a physical and/or administrative limitations (i.e. FCC regulations) that restrict the number of redundant spectrums that can be practically transmitted over the communications medium. Also, there may be other reasons to limit the number of redundant spectrums transmitted. Therefore, preferably, the transmitter 2301 will include an optional spectrum processing module 2304 to process the redundant spectrums 2206a-n prior to transmission over communications medium 2108.

Figure 23C:
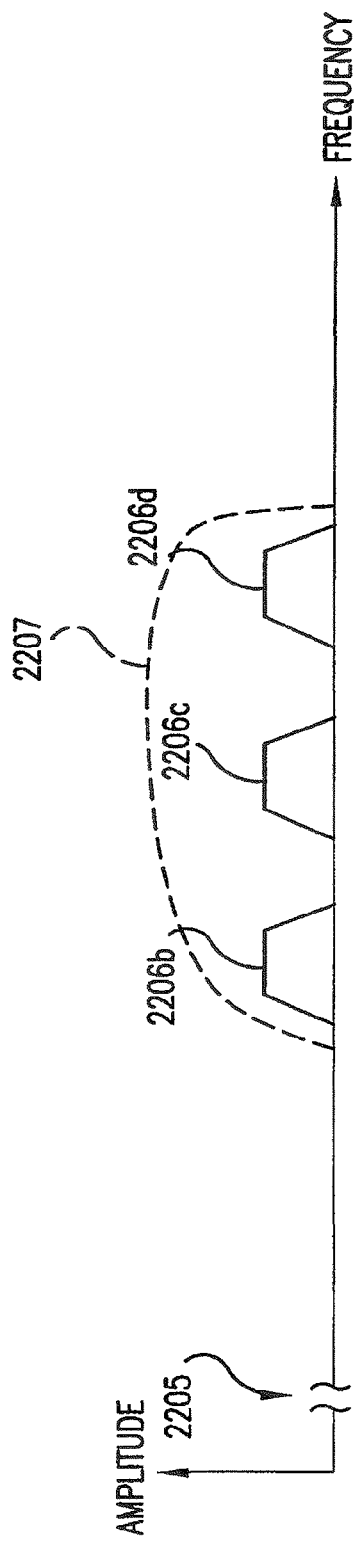

In one embodiment, spectrum processing module 2304 includes a filter with a passband 2207 (FIG. 23C) to select redundant spectrums 2206b-d for transmission. This will substantially limit the frequency bandwidth occupied by the redundant spectrums to the passband 2207. In one embodiment, spectrum processing module 2304 also up converts redundant spectrums and/or amplifies redundant spectrums prior to transmission over the communications medium 2108. Finally, medium interface module 2320 transmits redundant spectrums over the communications medium 2108. In one embodiment, communications medium 2108 is an over-the-air link and medium interface module 2320 is an antenna.

Other embodiments for communications medium 2108 and medium interface module 2320 will be understood based on the teachings contained herein.

Figure 23D:
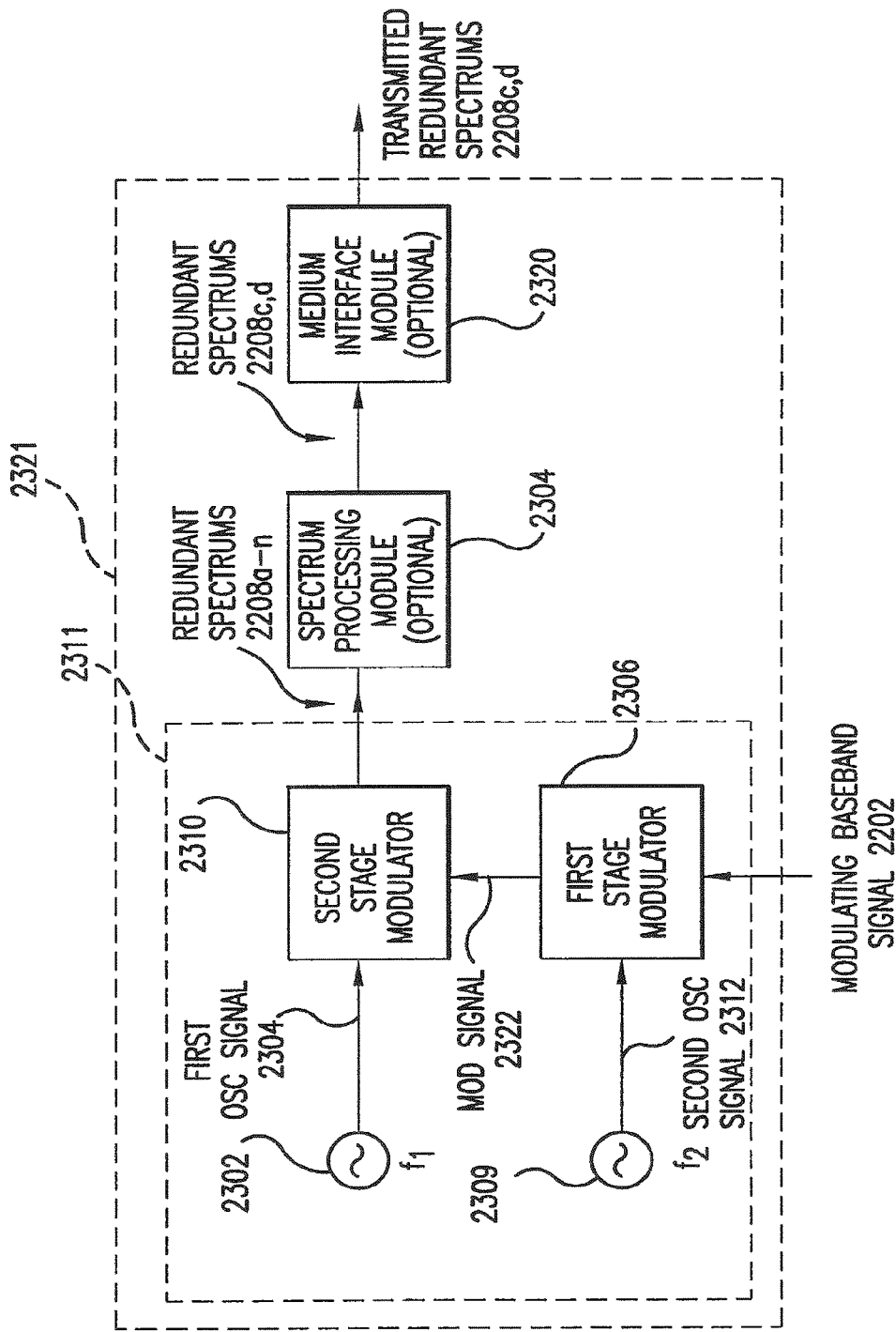
FIG. 23D illustrates another example transmitter in an enhanced signal reception system according to an embodiment of the invention.

FIG. 23D illustrates transmitter 2321, which is one embodiment of transmitter 2104 that generates redundant spectrums configured similar to redundant spectrums 2208c-d and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

Figure 23E:
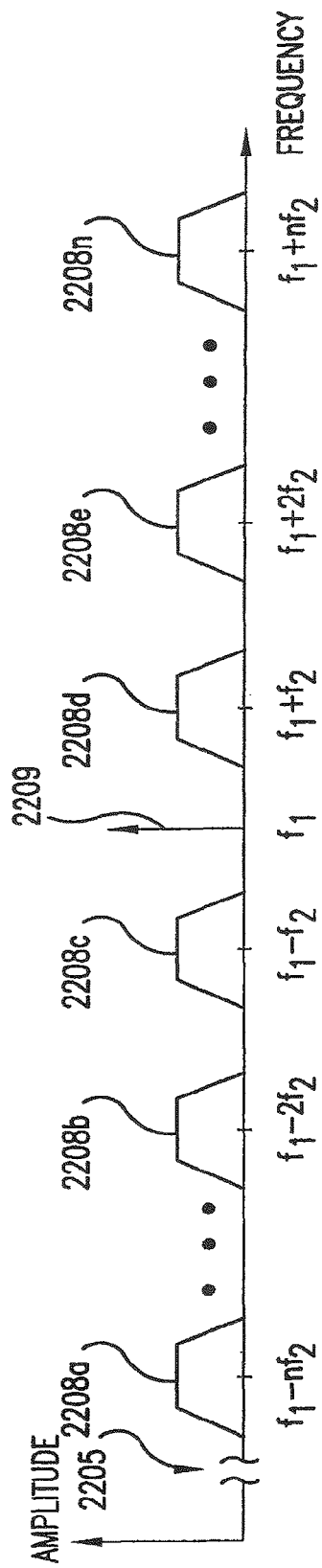
FIGS. 23E and 23F are example waveforms used to further describe the enhanced signal reception system according to an embodiment of the invention.
Figure 23F:
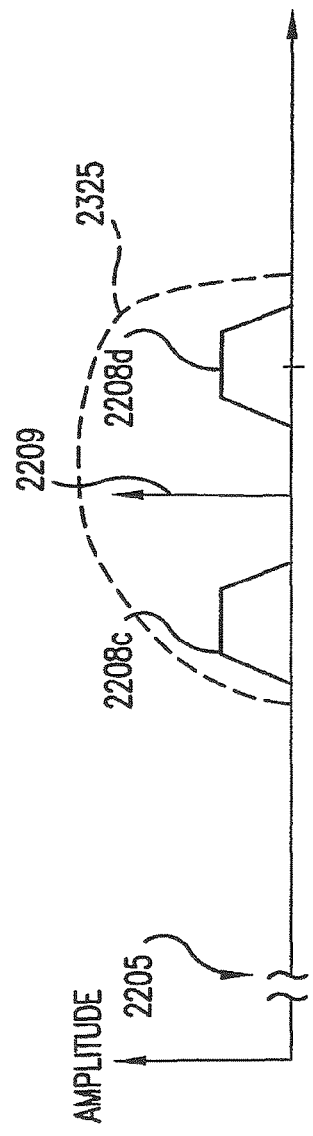

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can affect any type of modulation including but not limited to: amplitude modulation frequency modulation, combinations thereof, or any other type of modulation. Second stage modulator 2310 modulates first oscillating signal 2304 with modulated signal 2322, resulting in redundant spectrums 2208a-n, as shown in FIG. 23E. Second stage modulator 2310 is preferably a phase or frequency modulator, although other modulators could used including but not limited to an amplitude modulator.

Redundant spectrums 2208a-n are centered on unmodulated spectrum 2209 (at $f_1$ Hz), and adjacent spectrums are separated by $f_Z$ Hz. The number of redundant spectrums 2208a-n generated by generator 2311 is arbitrary and unlimited, similar to spectrums 2206a-n discussed above. Therefore, optional spectrum processing module 2304 may also include a filter with passband 2325 to select, for example, spectrums 2208c,d for transmission over communications medium 2108. In addition, optional spectrum processing module 2304 may also include a filter (such as a bandstop filter) to attenuate unmodulated spectrum 2209. Alternatively, unmodulated spectrum 2209 may be attenuated by using phasing techniques during redundant spectrum generation. Finally, (optional) medium interface module 2320 transmits redundant spectrums 2208c,d over communications medium 2108.

Figure 24A:
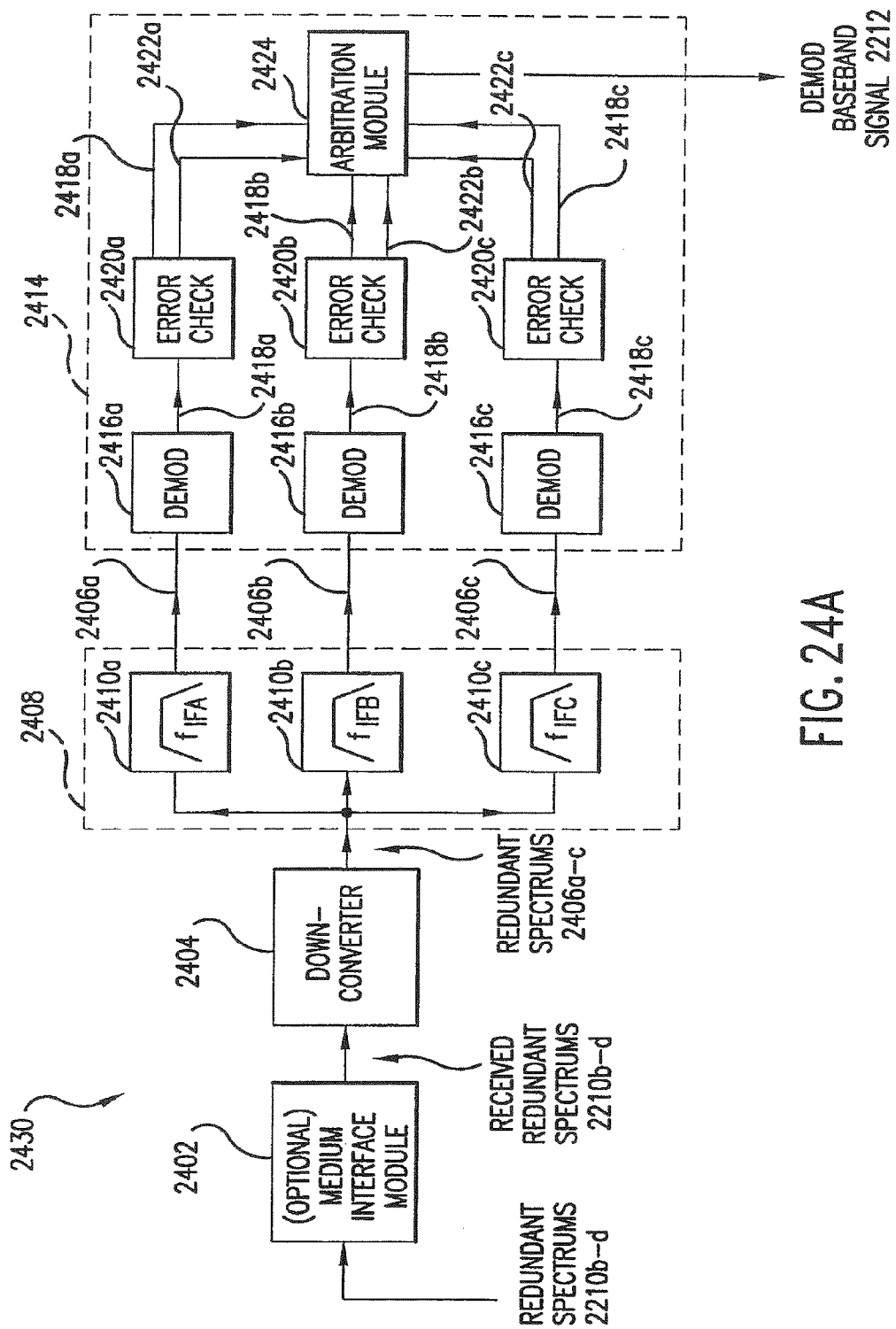
FIG. 24A illustrates an example receiver in an enhanced signal reception system according to an embodiment of the invention.

Receiver 2112 will now be explored in greater detail to illustrate recovery of a demodulated baseband signal from received redundant spectrums. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410a-c. Data extraction module 2414 includes demodulators 2416a-c, error check modules 2420a-c, and arbitration module 2424. Receiver 2430 will be discussed in relation to the signal diagrams in FIGS. 24B-24J.

Figure 24D:
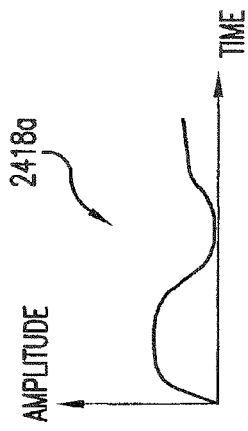
Figure 24E:
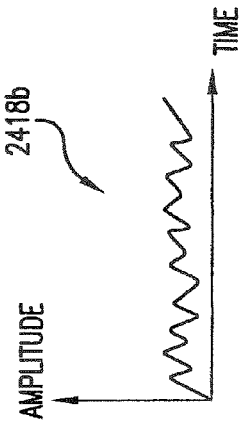
Figure 24G:
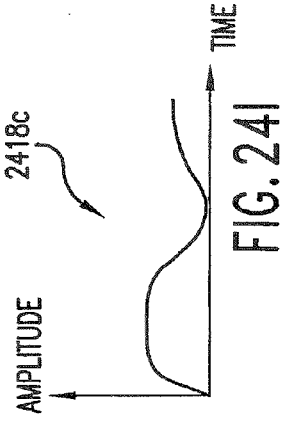
Figure 24F:
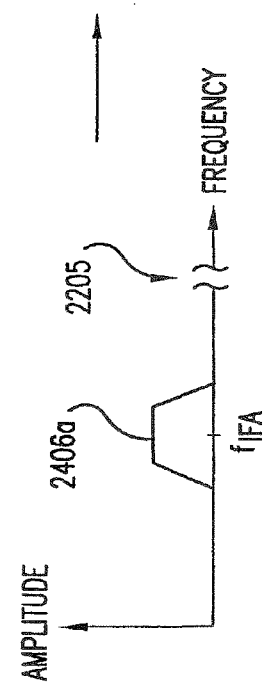
Figure 24H:
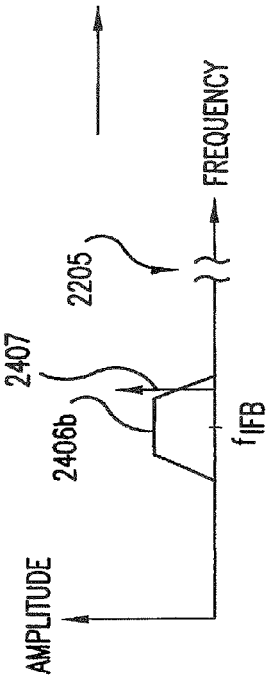
Figure 24I:
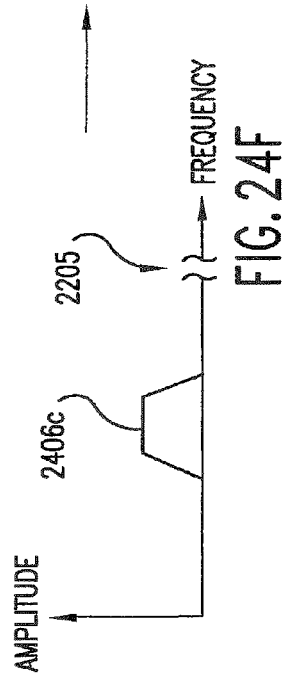
Figure 24J:
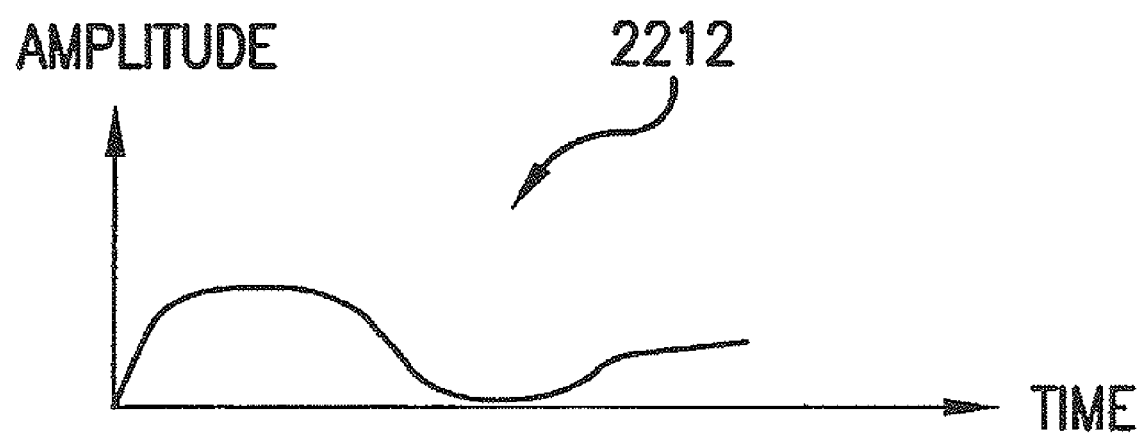

In one embodiment, optional medium interface module 2402 receives redundant spectrums 2210b-d (FIG. 22E, and FIG. 24B). Each redundant spectrum 2210b-d includes the necessary amplitude, phase, and frequency information to substantially reconstruct the modulating baseband signal used to generated the redundant spectrums. However, in the present example, spectrum 2210c also contains jamming signal 2211, which may interfere with the recovery of a baseband signal from spectrum 2210c. Down-converter 2404 down-converts received redundant spectrums 2210b-d to lower intermediate frequencies, resulting in redundant spectrums 2406a-c (FIG. 24C). Jamming signal 2211 is also down-converted to jamming signal 2407, as it is contained within redundant spectrum 2406b. Spectrum isolation module 2408 includes filters 2410a-c that isolate redundant spectrums 2406a-c from each other (FIGS. 24D-24F, respectively). Demodulators 2416a-c independently demodulate spectrums 2406a-c, resulting in demodulated baseband signals 2418a-c, respectively (FIGS. 24G-24I). Error check modules 2420a-c analyze demodulate baseband signal 2418a-c to detect any errors. In one embodiment, each error check module 2420a-c sets an error flag 2422a-c whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectrums, where the degree of similarity is application dependent.

Referring to FIGS. 24G-I, arbitration module 2424 will select either demodulated baseband signal 2418a or 2418c, because error check module 2420b will set the error flag 2422b that is associated with demodulated baseband signal 2418b.

The error detection schemes implemented by the error detection modules include but are not limited to: cyclic redundancy check (CRC) and parity check for digital signals, and various error detections schemes for analog signal.

Further details of enhanced signal reception as described in this section are presented in pending U.S. application "Method and System for Ensuring Reception of a Communications Signal," Ser. No. 09/176,415, filed Oct. 21, 1998, incorporated herein by reference in its entirety.

Unified Down-Conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
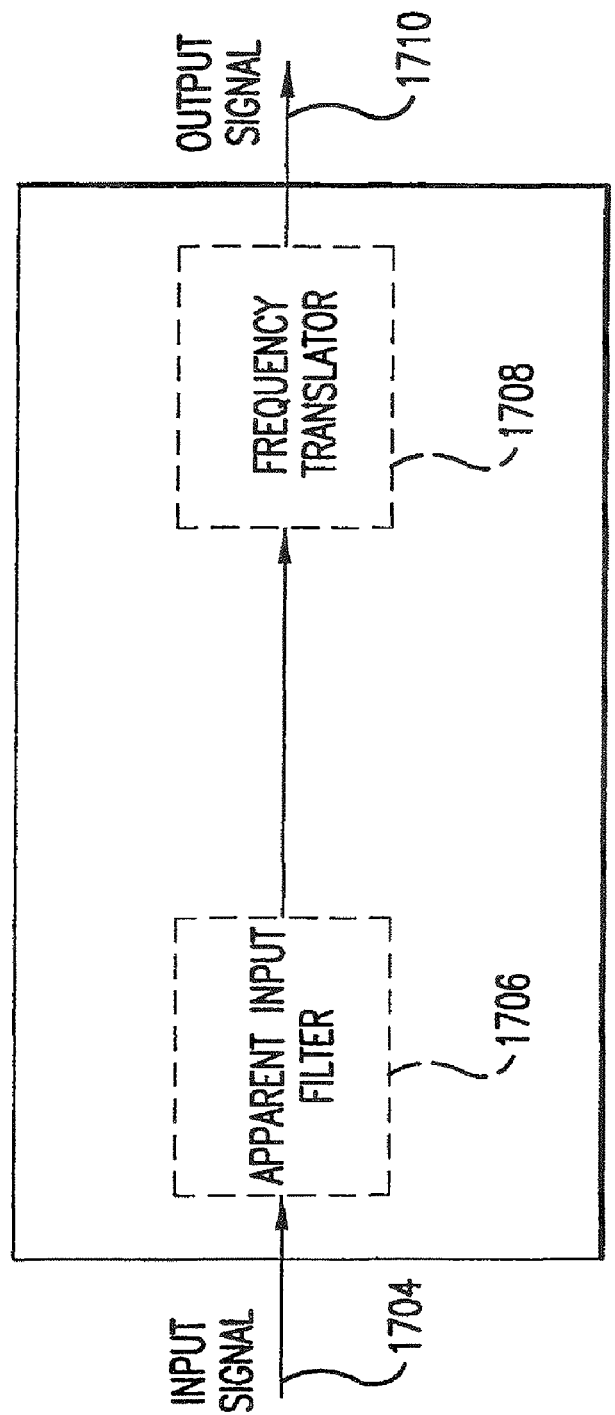
FIG. 17 illustrates a unified down-converting and filtering (UDF) module according to an embodiment of the invention.

FIG. 17 is a conceptual block diagram of a UDF module 1702 according to an embodiment of the present invention. The UDF module 1702 performs at least frequency translation and frequency selectivity.

The effect achieved by the UDF module 1702 is to perform the frequency selectivity operation prior to the performance of the frequency translation operation. Thus, the UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by the UDF module 1702 are at radio frequencies. The UDF module 1702 effectively operates to input filter these RF input signals 1704. Specifically, in these embodiments, the UDF module 1702 effectively performs input, channel select filtering of the RF input signal 1704. Accordingly, the invention achieves high selectivity at high frequencies.

The UDF module 1702 effectively performs various types of filtering, including but not limited to bandpass filtering, low pass filtering, high pass filtering, notch filtering, all pass filtering, band stop filtering, etc., and combinations thereof.

Conceptually, the UDF module 1702 includes a frequency translator 1708. The frequency translator 1708 conceptually represents that portion of the UDF module 1702 that performs frequency translation (down conversion).

The UDF module 1702 also conceptually includes an apparent input filter 1706 (also sometimes called an input filtering emulator). Conceptually, the apparent input filter 1706 represents that portion of the UDF module 1702 that performs input filtering.

In practice, the input filtering operation performed by the UDF module 1702 is integrated with the frequency translation operation. The input filtering operation can be viewed as being performed concurrently with the frequency translation operation. This is a reason why the input filter 1706 is herein referred to as an "apparent" input filter 1706.

The UDF module 1702 of the present invention includes a number of advantages. For example, high selectivity at high frequencies is realizable using the UDF module 1702. This feature of the invention is evident by the high Q factors that are attainable. For example, and without limitation, the UDF module 1702 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 1702 can be electrically adjusted, either statically or dynamically.

Also, the UDF module 1702 can be designed to amplify input signals.

Further, the UDF module 1702 can be implemented without large resistors, capacitors, or inductors. Also, the UDF module 1702 does not require that tight tolerances be maintained on the values of its individual components, i.e., its resistors, capacitors, inductors, etc. As a result, the architecture of the UDF module 1702 is friendly to integrated circuit design techniques and processes.

The features and advantages exhibited by the UDF module 1702 are achieved at least in part by adopting a new technological paradigm with respect to frequency selectivity and translation. Specifically, according to the present invention, the UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal). By operating in this manner, the UDF module preferably performs input filtering and frequency down-conversion in a unified manner.

Figure 19:
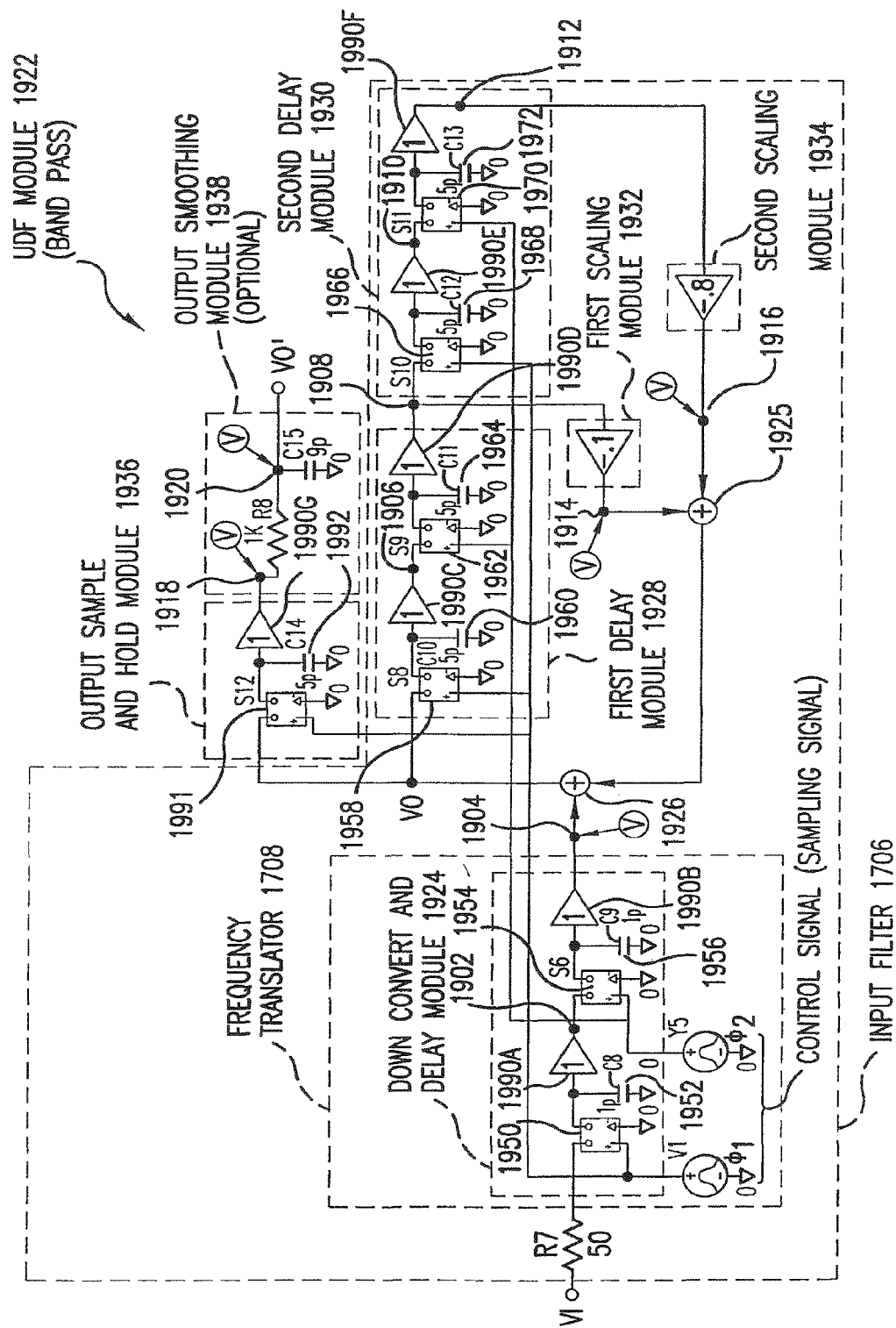
FIG. 19 is a detailed diagram of an example UDF module according to an embodiment of the invention.

FIG. 19 illustrates an example implementation of the unified down-converting and filtering (UDF) module 1922. The UDF module 1922 performs the frequency translation operation and the frequency selectivity operation in an integrated, unified manner as described above, and as further described below.

In the example of FIG. 19, the frequency selectivity operation performed by the UDF module 1922 comprises a band-pass filtering operation according to EQ. 1, below, which is an example representation of a band-pass filtering transfer function.

$$VO = \alpha_1 z^{-1} VI - \beta_1 z^{-1} VO - \beta_1 z^{-2} VO \qquad \text{EQ. 1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ. 1 is referred to herein for illustrative purposes only, and is not limiting.

The UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, the output smoothing module 1938 is optional.

As further described below, in the example of FIG. 19, the down-convert and delay module 1924 and the first and second delay modules 1928 and 1930 include switches that are controlled by a clock having two phases, $\phi_1$ and $\phi_z$. $\phi_1$ and $\phi_z$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_z$, and opens on the next corresponding falling edge of $\phi_1$ or $\phi_z$. However, the invention is not limited to this example. As will be apparent to persons skilled in the relevant art(s), other clock conventions can be used to control the switches.

In the example of FIG. 19, it is assumed that $\alpha_1$ is equal to one. Thus, the output of the down-convert and delay module 1924 is not scaled. As evident from the embodiments described above, however, the invention is not limited to this example.

The example UDF module 1922 has a filter center frequency of 900.2 MHZ and a filter bandwidth of 570 KHz. The pass band of the UDF module 1922 is on the order of 899.915 MHZ to 900.485 MHZ. The Q factor of the UDF module 1922 is approximately 1879 (i.e., 900.2 MHZ divided by 570 KHz).

The operation of the UDF module 1922 shall now be described with reference to a Table 1802 (FIG. 18) that indicates example values at nodes in the UDF module 1922 at a number of consecutive time increments. It is assumed in Table 1802 that the UDF module 1922 begins operating at time t−1. As indicated below, the UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 in the down-convert and delay module 1924 closes. This allows a capacitor 1952 to charge to the current value of an input signal, $VI_{t-1}$, such that node 1902 is at $VI_{t-1}$. This is indicated by cell 1804 in FIG. 18. In effect, the combination of the switch 1950 and the capacitor 1952 in the down-convert and delay module 1924 operates to translate the frequency of the input signal VI to a desired lower frequency, such as IF or baseband. Thus, the value stored in the capacitor 1952 represents an instance of a down-converted image of the input signal VI.

The manner in which the down-convert and delay module 1924 performs frequency down-conversion is further described elsewhere in this application, and is additionally described in pending U.S. application "Method and System for Down-Converting Electromagnetic Signals," Ser. No. 09/176,022, filed Oct. 21, 1998, which is herein incorporated by reference in its entirety.

Also at the rising edge of $\phi_1$ at time t−1, a switch 1958 in the first delay module 1928 closes, allowing a capacitor 1960 to charge to $VO_{t-1}$, such that node 1906 is at $VO_{t-1}$. This is indicated by cell 1806 in Table 1802. (In practice, $VO_{t-1}$ is undefined at this point. However, for ease of understanding, $VI_{t-1}$ shall continue to be used for purposes of explanation.)

Also at the rising edge of $\phi_1$ at time t−1, a switch 1966 in the second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\phi_z$ at time t−1, a switch 1954 in the down-convert and delay module 1924 closes, allowing a capacitor 1956 to charge to the level of the capacitor 1952. Accordingly, the capacitor 1956 charges to $VI_{t-1}$, such that node 1904 is at $VI_{t-1}$. This is indicated by cell 1810 in Table 1802.

The UDF module 1922 may optionally include a unity gain module 1990A between capacitors 1952 and 1956. The unity gain module 1990A operates as a current source to enable capacitor 1956 to charge without draining the charge from capacitor 1952. For a similar reason, the UDF module 1922 may include other unity gain modules 1990B-1990G. It should be understood that, for many embodiments and applications of the invention, these unity gain modules 1990A-1990G are optional. The structure and operation of the unity gain modules 1990 will be apparent to persons skilled in the relevant art(s).

Also at the rising edge of $\phi_z$ at time t−1, a switch 1962 in the first delay module 1928 closes, allowing a capacitor 1964 to charge to the level of the capacitor 1960. Accordingly, the capacitor 1964 charges to $VO_{t-1}$, such that node 1908 is at $VO_{t-1}$. This is indicated by cell 1814 in Table 1802.

Also at the rising edge of $\phi_z$ at time t−1, a switch 1970 in the second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, the switch 1950 in the down-convert and delay module 1924 closes. This allows the capacitor 1952 to charge to $VI_t$, such that node 1902 is at $VI_t$. This is indicated in cell 1816 of Table 1802.

Also at the rising edge of $\phi_1$ at time t, the switch 1958 in the first delay module 1928 closes, thereby allowing the capacitor 1960 to charge to $VO_t$. Accordingly, node 1906 is at $VO_t$. This is indicated in cell 1820 in Table 1802.

Further at the rising edge of $\phi_1$ at time t, the switch 1966 in the second delay module 1930 closes, allowing a capacitor 1968 to charge to the level of the capacitor 1964. Therefore, the capacitor 1968 charges to $VO_{t-1}$, such that node 1910 is at $VO_{t-1}$. This is indicated by cell 1824 in Table 1802.

At the rising edge of $\phi_z$ at time t, the switch 1954 in the down-convert and delay module 1924 closes, allowing the capacitor 1956 to charge to the level of the capacitor 1952. Accordingly, the capacitor 1956 charges to $VI_t$, such that node 1904 is at $VI_t$. This is indicated by cell 1828 in Table 1802.

Also at the rising edge of $\phi_z$ at time t, the switch 1962 in the first delay module 1928 closes, allowing the capacitor 1964 to charge to the level in the capacitor 1960. Therefore, the capacitor 1964 charges to $VO_t$, such that node 1908 is at $VO_t$. This is indicated by cell 1832 in Table 1802.

Further at the rising edge of $\phi_z$ at time t, the switch 1970 in the second delay module 1930 closes, allowing the capacitor 1972 in the second delay module 1930 to charge to the level of the capacitor 1968 in the second delay module 1930. Therefore, the capacitor 1972 charges to $VO_{t-1}$, such that node 1912 is at $VO_{t-1}$. This is indicated in cell 1836 of FIG. 18.

At time t+1, at the rising edge of $\phi_1$, the switch 1950 in the down-convert and delay module 1924 closes, allowing the capacitor 1952 to charge to $VI_{t-1}$. Therefore, node 1902 is at $VI_{t+1}$, as indicated by cell 1838 of Table 1802.

Also at the rising edge of $\phi_1$ at time t+1, the switch 1958 in the first delay module 1928 closes, allowing the capacitor 1960 to charge to $VO_{t+1}$. Accordingly, node 1906 is at $VO_{t+1}$, as indicated by cell 1842 in Table 1802.

Further at the rising edge of $\phi_1$ at time t+1, the switch 1966 in the second delay module 1930 closes, allowing the capacitor 1968 to charge to the level of the capacitor 1964. Accordingly, the capacitor 1968 charges to $VO_t$, as indicated by cell 1846 of Table 1802.

In the example of FIG. 19, the first scaling module 1932 scales the value at node 1908 (i.e., the output of the first delay module 1928) by a scaling factor of −0.1. Accordingly, the value present at node 1914 at time t+1 is $-0.1*VO_t$. Similarly, the second scaling module 1934 scales the value present at node 1912 (i.e., the output of the second scaling module 1930) by a scaling factor of −0.8. Accordingly, the value present at node 1916 is $-0.8*VO_{t-1}$ at time t+1.

At time t+1, the values at the inputs of the summer 1926 are: $VI_t$ at node 1904, $-0.1*VO_t$ at node 1914, and −0.8*VO$_{t−1}$ at node 1916 (in the example of FIG. 19, the values at nodes 1914 and 1916 are summed by a second summer 1925, and this sum is presented to the summer 1926). Accordingly, at time t+1, the summer generates a signal equal to VI$_t$−0.1*VO$_t$−0.8*VO$_{t−1}$.

At the rising edge of $\phi_1$ at time t+1, a switch 1991 in the output sample and hold module 1936 closes, thereby allowing a capacitor 1992 to charge to VO$_{t−1}$ Accordingly, the capacitor 1992 charges to VO$_{t+1}$ which is equal to the sum generated by the adder 1926. As just noted, this value is equal to: VI$_t$−0.1*VO$_t$−0.8*VO$_{t−1}$. This is indicated in cell 1850 of Table 1802. This value is presented to the optional output smoothing module 1938, which smoothes the signal to thereby generate the instance of the output signal VO$_{t+1}$. It is apparent from inspection that this value of VO$_{t+1}$ is consistent with the band pass filter transfer function of EQ. 1.

Further details of unified down-conversion and filtering as described in this section are presented in pending U.S. application "Integrated Frequency Translation And Selectivity," Ser. No. 09/175,966, filed Oct. 21, 1998, incorporated herein by reference in its entirety.

Example Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Example applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these example applications. Additional applications of the UFT module will be apparent to persons skilled in the relevant art(s), based on the teachings contained herein.

Figure 7:
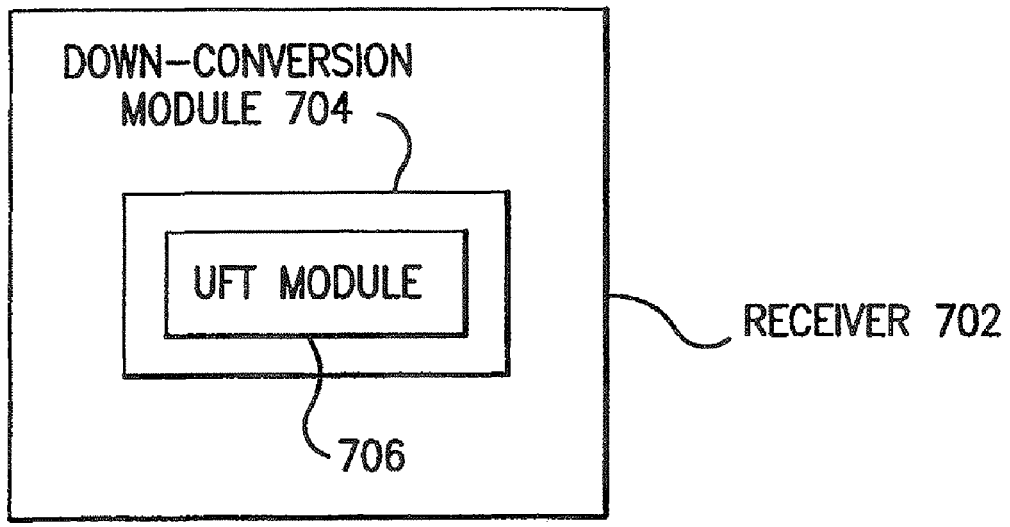
FIG. 7 illustrates a UFT module used in a receiver according to an embodiment of the invention.

For example, the present invention can be used in applications that involve frequency down-conversion. This is shown in FIG. 1C, for example, where an example UFT module 115 is used in a down-conversion module 114. In this capacity, the UFT module 115 frequency down-converts an input signal to an output signal. This is also shown in FIG. 7, for example, where an example UFT module 706 is part of a down-conversion module 704, which is part of a receiver 702.

Figure 8:
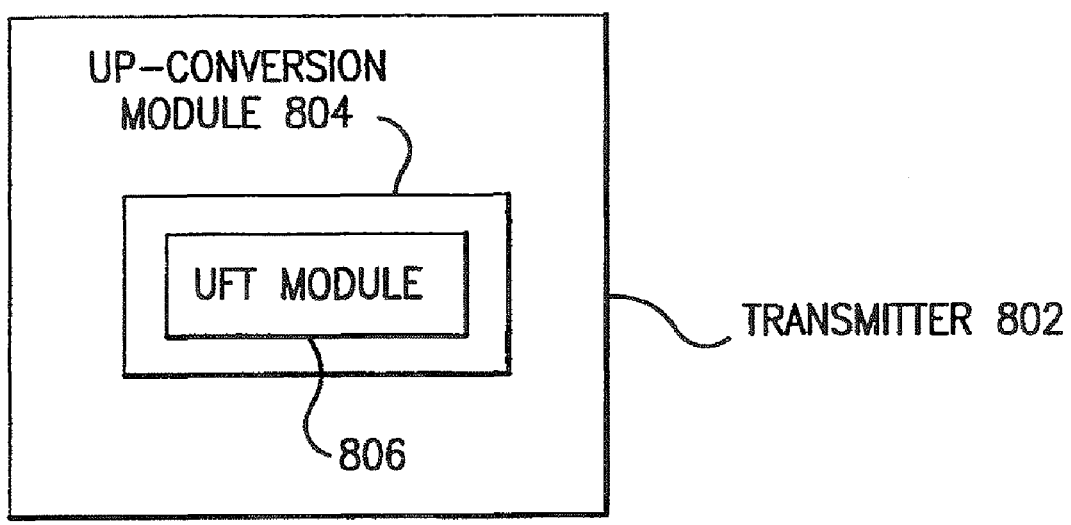
FIG. 8 illustrates a UFT module used in a transmitter according to an embodiment of the invention.

The present invention can be used in applications that involve frequency up-conversion. This is shown in FIG. 1D, for example, where an example UFT module 117 is used in a frequency up-conversion module 116. In this capacity, the UFT module 117 frequency up-converts an input signal to an output signal. This is also shown in FIG. 8, for example, where an example UFT module 806 is part of up-conversion module 804, which is part of a transmitter 802.

Figure 9:
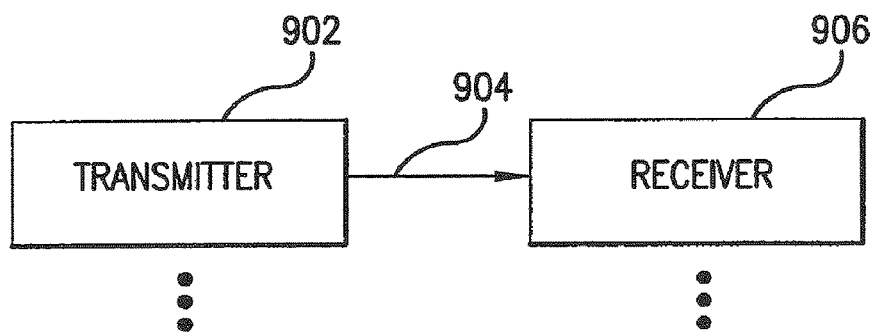
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more of the transmitters 902 may be implemented using a UFT module, as shown for example in FIG. 8. Also, one or more of the receivers 906 may be implemented using a UFT module, as shown for example in FIG. 7.

Figure 10:
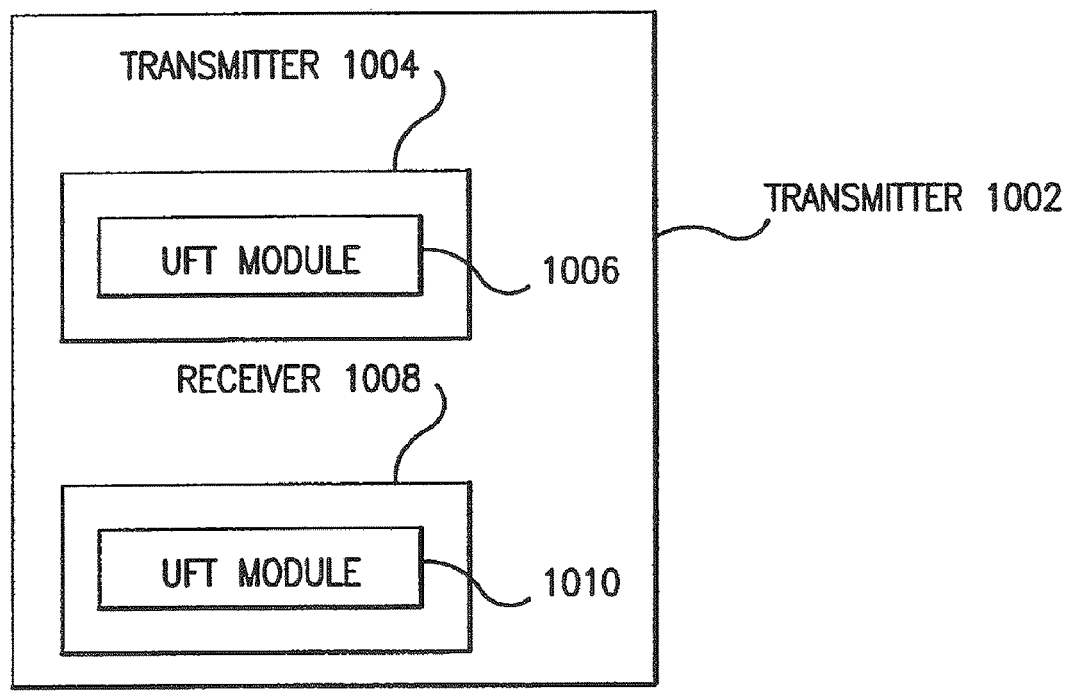
FIG. 10 illustrates a transceiver according to an embodiment of the invention.

The invention can be used to implement a transceiver. An example transceiver 1002 is illustrated in FIG. 10. The transceiver 1002 includes a transmitter 1004 and a receiver 1008. Either the transmitter 1004 or the receiver 1008 can be implemented using a UFT module. Alternatively, the transmitter 1004 can be implemented using a UFT module 1006, and the receiver 1008 can be implemented using a UFT module 1010. This embodiment is shown in FIG. 10.

Figure 11:
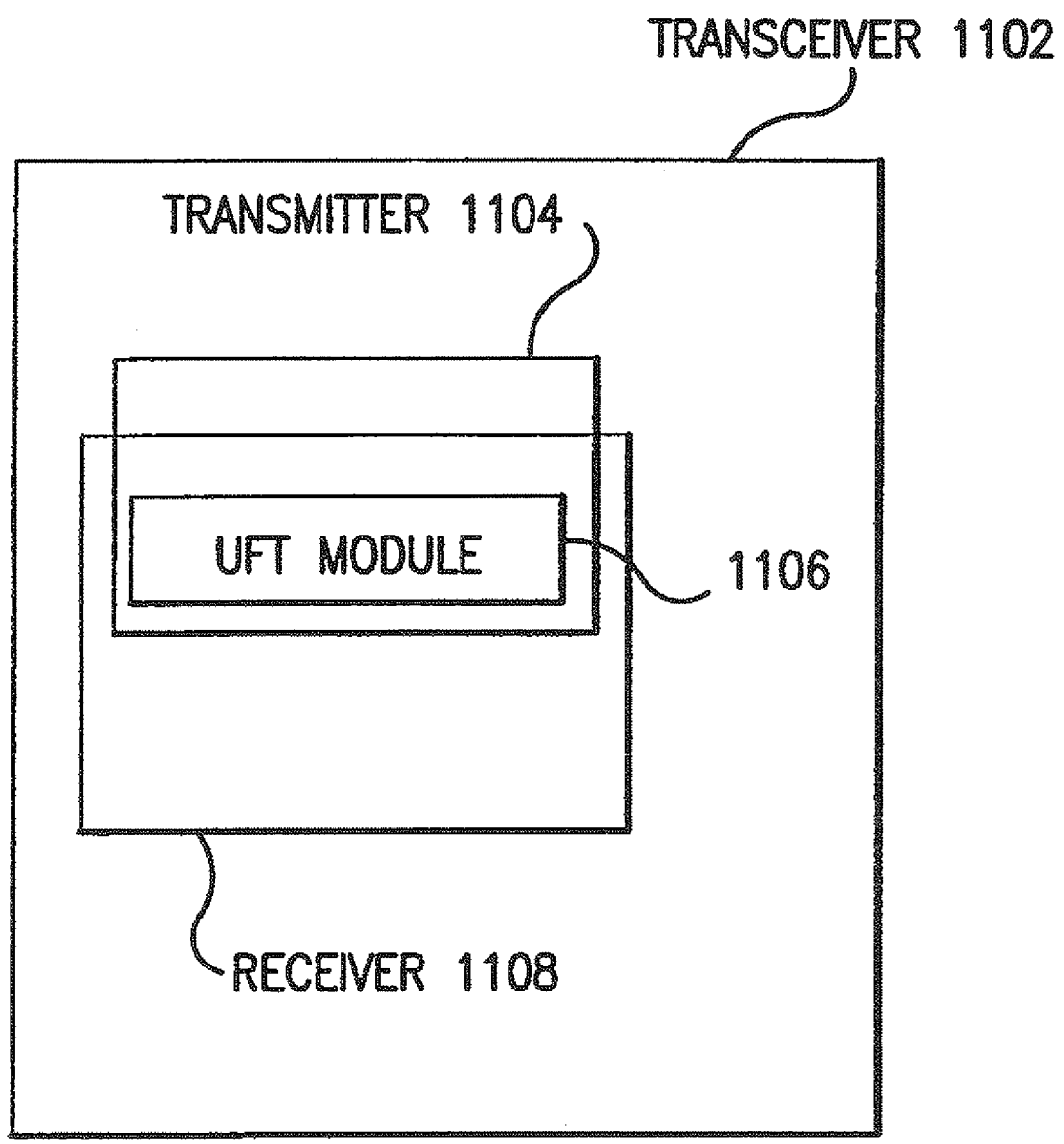
FIG. 11 illustrates a transceiver according to an alternative embodiment of the invention.

Another transceiver embodiment according to the invention is shown in FIG. 11. In this transceiver 1102, the transmitter 1104 and the receiver 1108 are implemented using a single UFT module 1106. In other words, the transmitter 1104 and the receiver 1108 share a LIFT module 1106.

Figure 12:
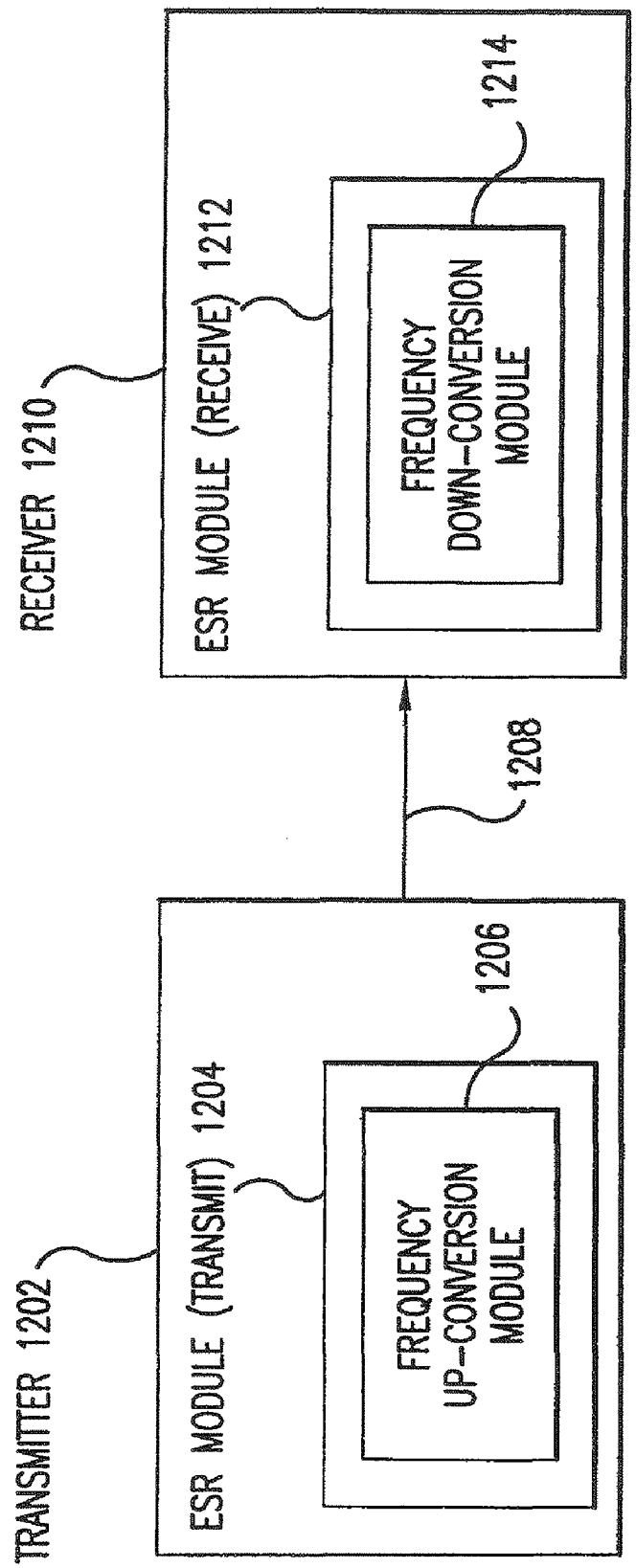
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) in a transmitter 1202, and an ESR module (receive) in a receiver 1210. An example ESR embodiment configured in this manner is illustrated in FIG. 12.

The ESR module (transmit) 1204 includes a frequency up-conversion module 1206. Some embodiments of this frequency up-conversion module 1206 may be implemented using a UFT module, such as that shown in FIG. 1D.

The ESR module (receive) 1212 includes a frequency down-conversion module 1214. Some embodiments of this frequency down-conversion module 1214 may be implemented using a UFT module, such as that shown in FIG. 1C.

Figure 13:
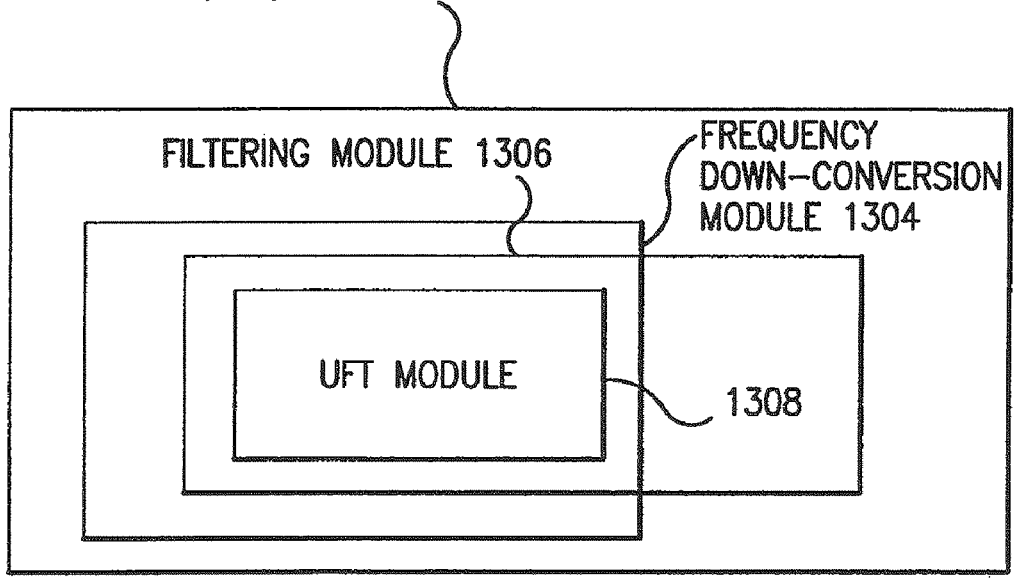
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An example unified down-conversion and filtering module 1302 is illustrated in FIG. 13. The unified down-conversion and filtering module 1302 includes a frequency down-conversion module 1304 and a filtering module 1306. According to the invention, the frequency down-conversion module 1304 and the filtering module 1306 are implemented using a UFT module 1308, as indicated in FIG. 13.

Figure 15A:
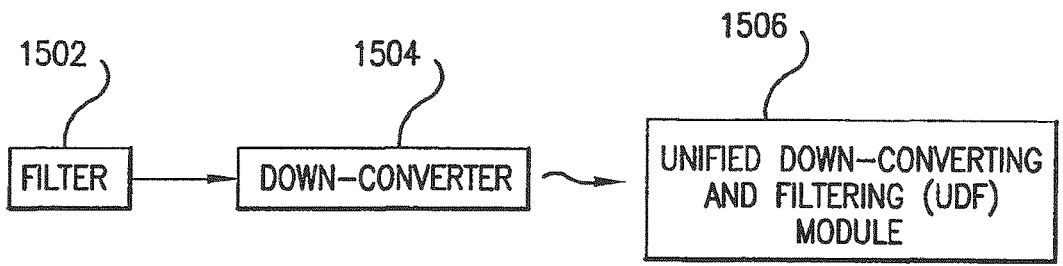
FIGS. 15A-15F illustrate example applications of the UDF module according to embodiments of the invention.
Figure 15B:
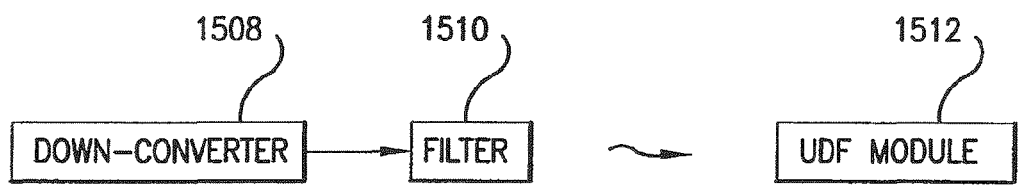
Figure 15C:
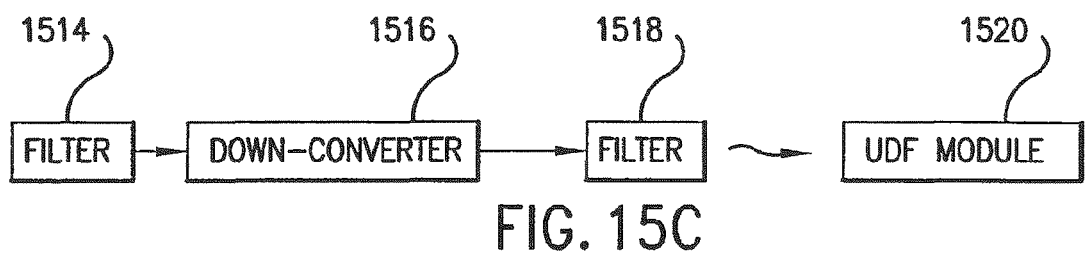
Figure 15D:
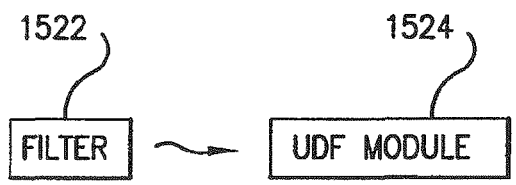
Figure 15E:
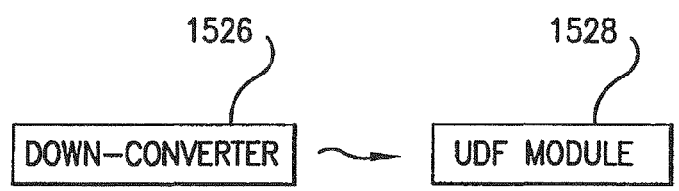
Figure 15F:
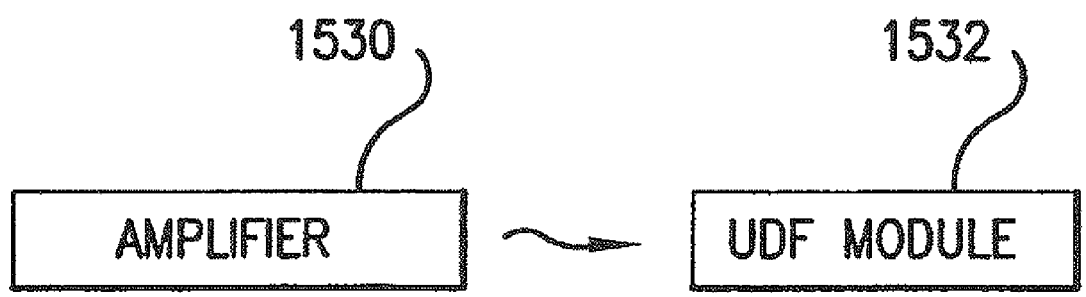

Unified down-conversion and filtering according to the invention is useful in applications involving filtering and/or frequency down-conversion. This is depicted, for example, in FIGS. 15A-15F. FIGS. 15A-15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be utilized as a filter 1522 (i.e., where the extent of frequency down-conversion by the down-converter in the unified down-conversion and filtering module 1524 is minimized). FIG. 15E indicates that a unified down-conversion and filtering module 1528 according to the invention can be utilized as a down-converter 1526 (i.e., where the filter in the unified down-conversion and filtering module 1528 passes substantially all frequencies). FIG. 15F illustrates that the unified down-conversion and filtering module 1532 can be used as an amplifier. It is noted that one or more UDF modules can be used in applications that involve at least one or more of filtering, frequency translation, and amplification.

Figure 14:
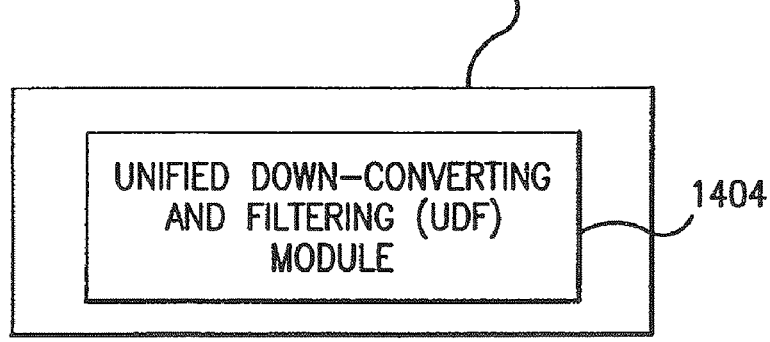
FIG. 14 illustrates an example receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
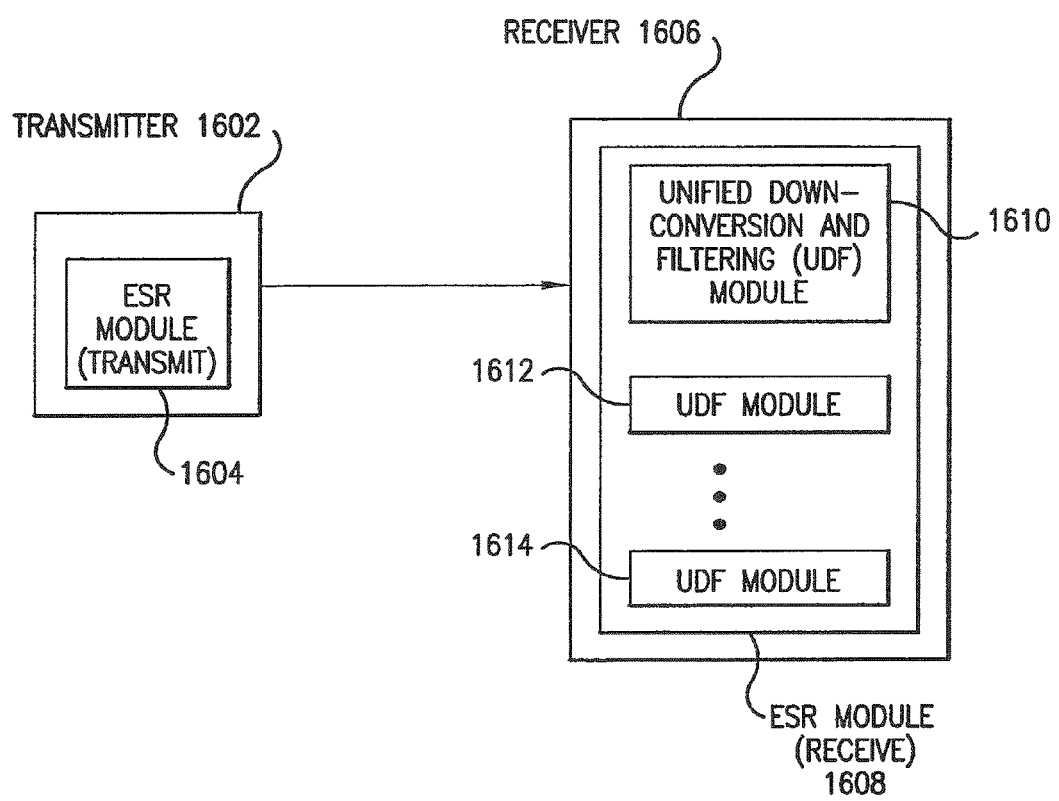
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectrums. The ESR module (receive) also operates to isolate the spectrums in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of the UDF modules 1610, 1612, 1614 operates to down-convert a received signal. The UDF modules 1610, 1612, 1614 also operate to filter the down-converted signal so as to isolate the spectrum(s) contained therein. As noted above, the UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the example applications of the UFT module discussed herein. Also, the invention is not limited to the example combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional example applications are described below.

Telephones

The present invention is directed to telephones that employ the UFT module for performing down-conversion and/or up conversion operations. According to embodiments of the invention, telephones include a receiver that uses a UFT module for frequency down-conversion (see, for example, FIG. 7), and/or a transmitter that uses a UFT module for frequency up-conversion (see, for example, FIG. 8). Alternatively, telephone embodiments of the invention employ a transceiver that utilizes one or more UFT modules for performing frequency down-conversion and/or up-conversion operations, as shown, for example, in FIGS. 10 and 11.

Any type of telephone falls within the scope and spirit of the present invention, including but not limited to cordless phones (wherein UFT modules can be used in both the base unit and the handset to communicate therebetween, and in the base unit to communicate with the telephone company via wired or wireless service), cellular phones, satellite phones, etc.

Figure 25:
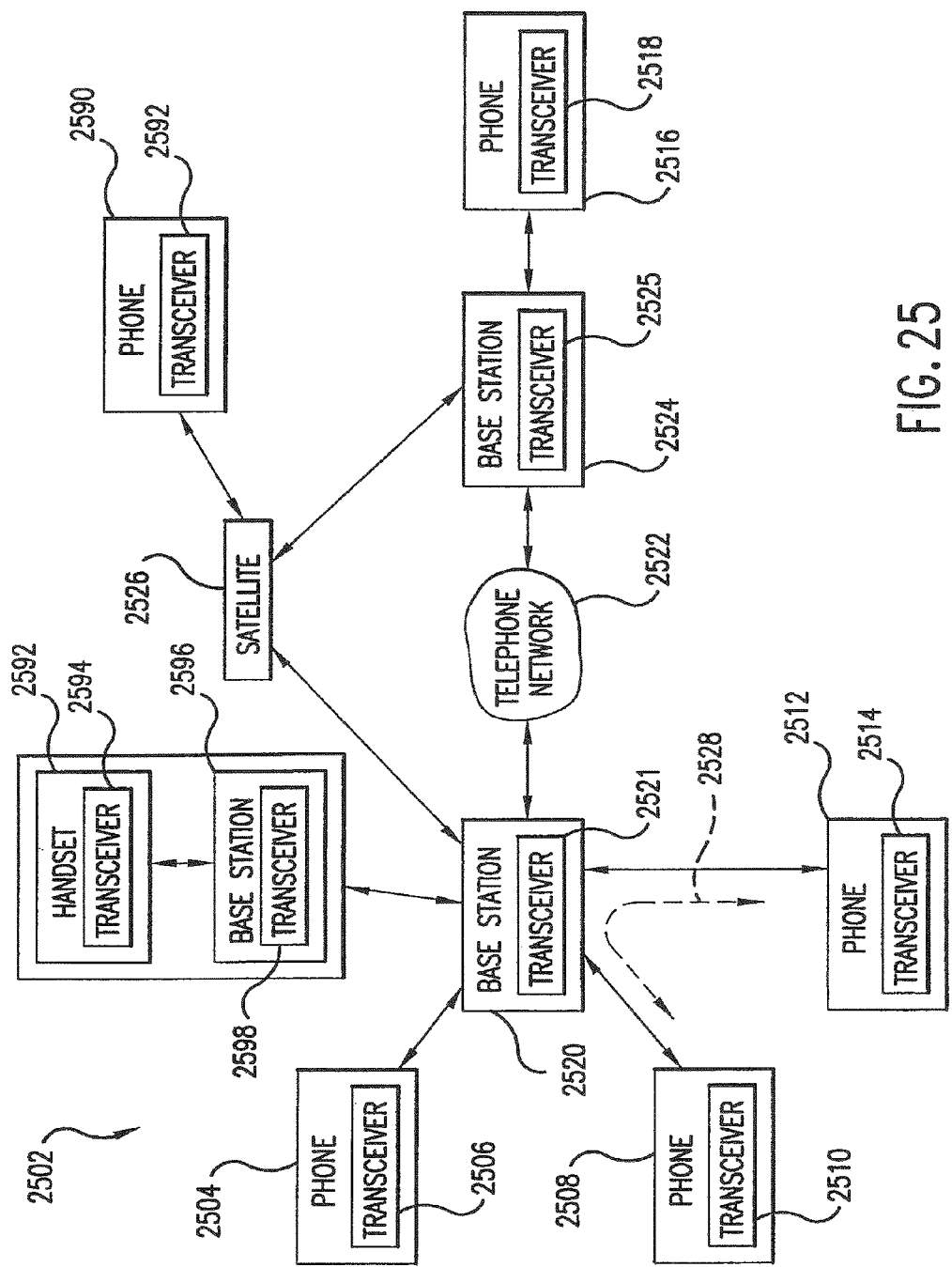
FIG. 25 illustrates an environment comprising telephones and base stations according to an embodiment of the invention.

FIG. 25 illustrates an example environment 2502 illustrating cellular phones and satellite phones according to embodiments of the invention. Cellular phones 2504, 2508, 2512 and 2516 each include a transceiver 2506, 2510, 2514, and 2518, respectively. Transceivers 2506, 2510, 2514, and 2518 enable their respective cellular phones to communicate via a wireless communication medium with base stations 2520, 2524. According to the invention, the transceivers 2506, 2510, 2514, and 2518 are implemented using one or more UFT modules. FIGS. 10 and 11 illustrate example transceivers 1002 and 1102 operable for use with the cellular phones of the present invention. Alternatively, one or more of cellular telephones 2504, 2508, 2512, and 2516 may employ transmitter modules and receiver modules. Either or both of such transmitter modules and receiver modules may be implemented using UFT modules as shown in FIGS. 7 and 8, for example.

FIG. 25 also illustrates a satellite telephone 2590 that communicates via satellites, such as satellite 2526. The satellite telephone 2590 includes a transceiver 2592, which is preferably implemented using one or more UFT modules, such as shown in FIGS. 10 and 11, for example. Alternatively, the satellite phone 2590 may include a receiver module and a transmitter module, wherein either or both of the receiver module and the transmitter module is implemented using a UFT module, as shown, for example, in FIGS. 7 and 8.

FIG. 25 also illustrates a cordless phone 2590 having a handset 2592 and a base station 2596. The handset 2592 and the base station 2596 include transceivers 2594, 2598 for communicating with each other preferably over a wireless link. Transceivers 2594, 2598 are preferably implemented using one or more UFT modules, such as shown in FIGS. 10 and 11, for example. Alternatively, transceivers 2594, 2598 each may be replaced by a receiver module and a transmitter module, wherein either or both of the receiver module and the transmitter module is implemented using a UFT module, as shown, for example, in FIGS. 7 and 8. In embodiments, the base station 2596 of the cordless phone 2590 may communicate with the base station 2520 via transceivers 2598, 2521, or using other communication modules.

Base Stations

The invention is directed to communication base stations that generally represent interfaces between telephones and telephone networks. Example base stations 2520, 2524 according to the invention are illustrated in FIG. 25. The invention is directed to other types of base stations, such as but not limited to base stations in cordless phones (see, for example, base station 2596 in cordless phone 2590 in FIG. 25). The base stations 2520, 2524, 2596 each include a transceiver 2521, 2525, 2598. According to embodiments of the invention, the transceivers 2521, 2525, 2598 are each implemented using one or more UFT modules (see, for example, FIGS. 10 and 11). Alternatively, the base stations 2520, 2524, 2596 can be implemented using receiver modules and transmitter modules, wherein either or both of the receiver and transmitter modules are implemented using UFT modules (see, for example, FIGS. 7 and 8).

As illustrated in FIG. 25, base stations 2520, 2524, 2596 operate to connect telephones together via telephone networks 2522, satellites 2526, or other communication mediums, such as but not limited to data networks (such as the Internet). Also, the base stations 2520, 2524, enable telephones (such as cellular telephones 2508, 2512) to communicate with each other via a base station 2520 and not through a network or other intermediate communication medium. This is illustrated, for example, by dotted data flow line 2528.

The invention is directed to all types of base stations, such as macro base stations (operating in networks that are relatively large), micro base stations (operating in networks that are relatively small), satellite base stations (operating with satellites), cellular base stations (operating in a cellular telephone networks), data communication base stations (operating as gateways to computer networks), etc.

Positioning

The invention is directed to positioning devices that enable the determination of the location of an object.

Figure 26:
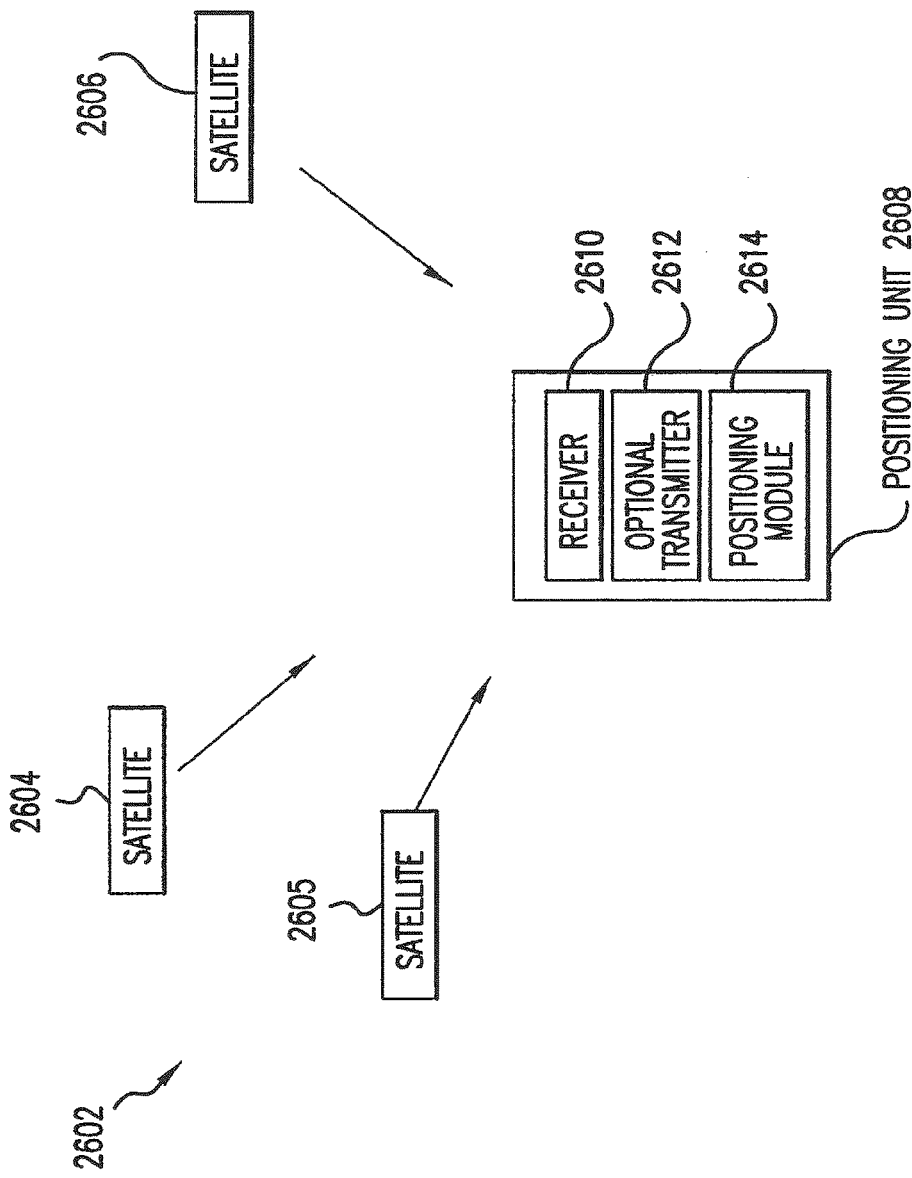
FIG. 26 illustrates a positioning unit according to an embodiment of the invention.

FIG. 26 illustrates an example positioning unit 2608 according to an embodiment of the invention. The positioning unit 2608 includes a receiver 2610 for receiving positioning information from satellites, such as satellites 2604, 2606. Such positioning information is processed in a well known manner by a positioning module 2614 to determine the location of the positioning unit 2608. Preferably, the receiver 2610 is implemented using a UFT module for performing frequency down-conversion operations (see, for example, FIG. 7).

The positioning unit 2608 may include an optional transmitter 2612 for transmitting commands and/or other information to satellites 2604, 2606, or to other destinations. In an embodiment, the transmitter 2612 is implemented using a UFT module for performing frequency up-conversion operations (see, for example, FIG. 8).

In an embodiment, the receiver 2610 and the optional transmitter 2612 are replaced in the positioning unit 2608 by a transceiver which includes one or more UFT modules (see, for example, FIGS. 10 and 11).

The invention is directed to all types of positioning systems, such as but not limited to global positioning systems (GPS), differential GPS, local GPS, etc.

Data Communication

The invention is directed to data communication among data processing devices. For example, and without limitation, the invention is directed to computer networks (such as, for example, local area networks and wide area networks), modems, etc.

Figure 27:
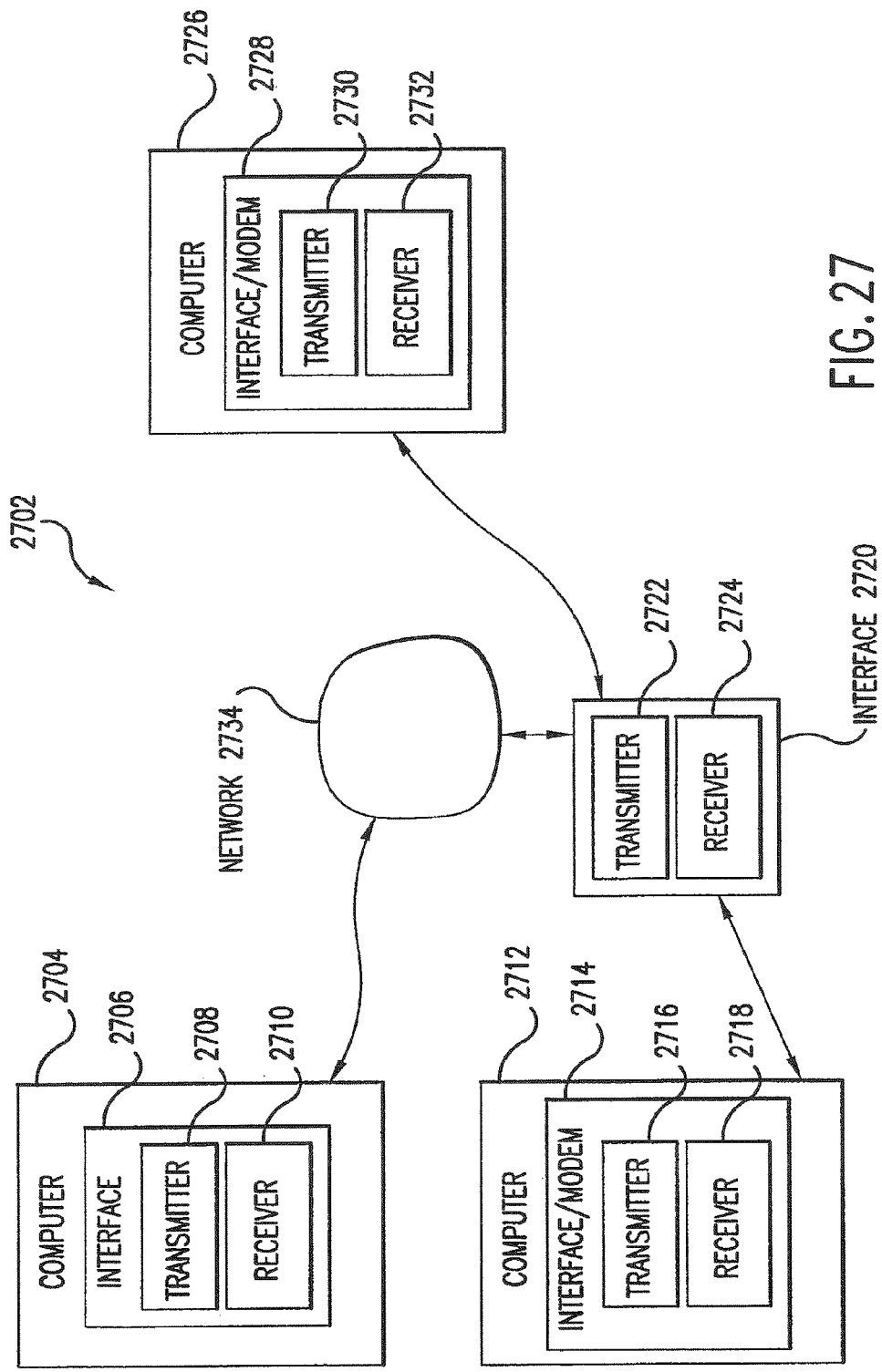
FIGS. 27 and 28 illustrate communication networks according to embodiments of the invention.

FIG. 27 illustrates an example environment 2702 wherein computers 2704, 2712, and 2726 are communicating with one another via a computer network 2734. In the example of FIG. 27, computer 2704 is communicating with the network 2734 via a wired link, whereas computers 2712 and 2726 are communicating with the network 2734 via wireless links.

In the teachings contained herein, for illustrative purposes, a link may be designated as being a wired link or a wireless link. Such designations are for example purposes only, and are not limiting. A link designated as being wireless may alternatively be wired. Similarly, a link designated as being wired may alternatively be wireless. This is applicable throughout the entire application.

The computers 2704, 2712 and 2726 each include an interface 2706, 2714, and 2728, respectively, for communicating with the network 2734. The interfaces 2706, 2714, and 2728 include transmitters 2708, 2716, and 2730 respectively. Also, the interfaces 2706, 2714 and 2728 include receivers 2710, 2718, and 2732 respectively. In embodiments of the invention, the transmitters 2708, 2716 and 2730 are implemented using UFT modules for performing frequency up-conversion operations (see, for example, FIG. 8). In embodiments, the receivers 2710, 2718 and 2732 are implemented using UFT modules for performing frequency down-conversion operations (see, for example, FIG. 7).

As noted above, the computers 2712 and 2726 interact with the network 2734 via wireless links. In embodiments of the invention, the interfaces 2714, 2728 in computers 2712, 2726 represent modems.

In embodiments, the network 2734 includes an interface or modem 2720 for communicating with the modems 2714, 2728 in the computers 2712, 2726. In embodiments, the interface 2720 includes a transmitter 2722, and a receiver 2724. Either or both of the transmitter 2722, and the receiver 2724 are implemented using UFT modules for performing frequency translation operations (see, for example, FIGS. 7 and 8).

In alternative embodiments, one or more of the interfaces 2706, 2714, 2720, and 2728 are implemented using transceivers that employ one or more UFT modules for performing frequency translation operations (see, for example, FIGS. 10 and 11).

Figure 28:
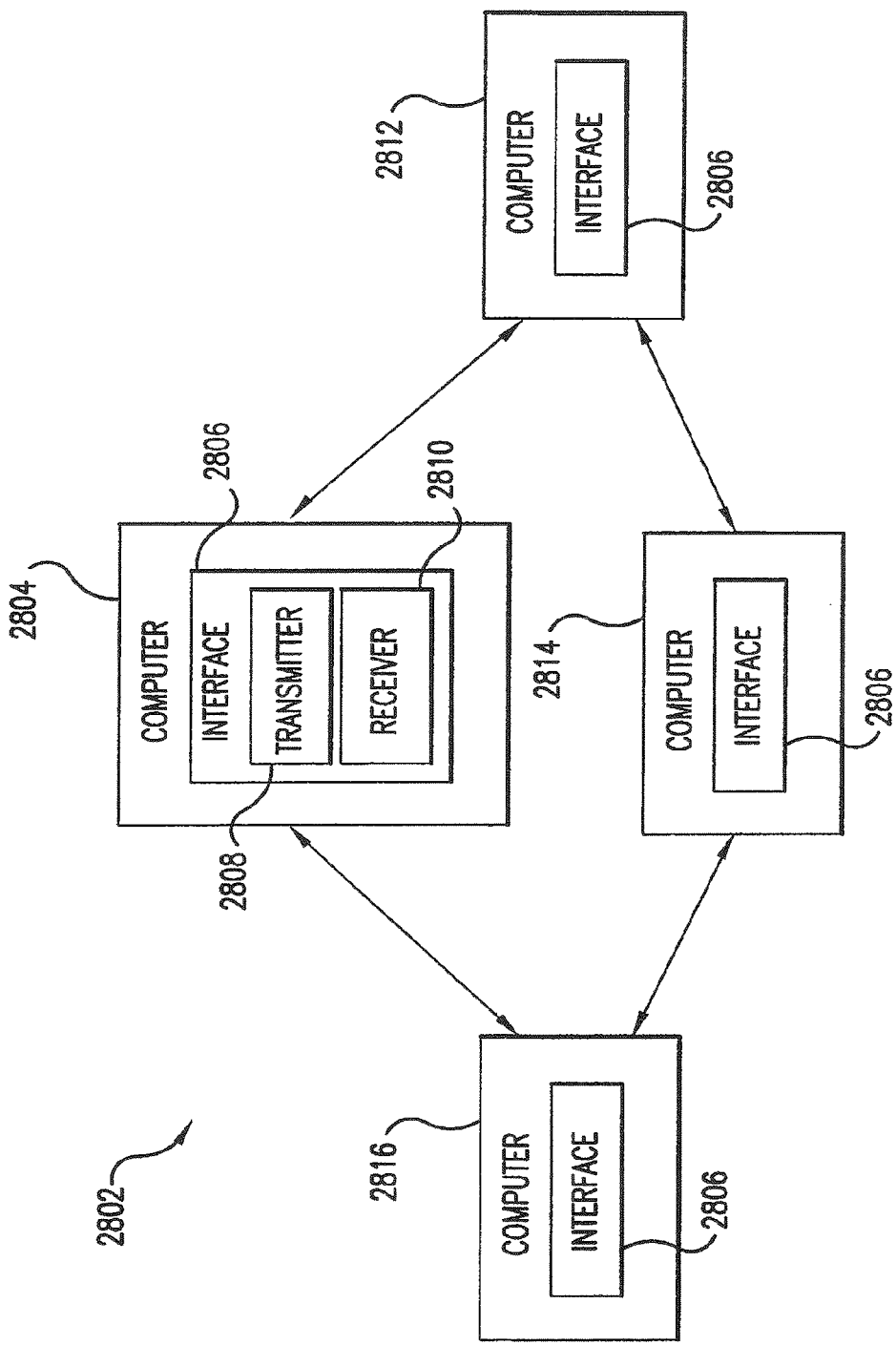

FIG. 28 illustrates another example data communication embodiment 2802. Each of a plurality of computers 2804, 2812, 2814 and 2816 includes an interface, such as an interface 2806 shown in the computer 2804. It should be understood that the other computers 2812, 2814, 2816 also include an interface such as an interface 2806. The computers 2804, 2812, 2814 and 2816 communicate with each other via interfaces 2806 and wireless or wired links, thereby collectively representing a data communication network.

The interfaces 2806 may represent any computer interface or port, such as but not limited to a high speed internal interface, a wireless serial port, a wireless PS2 port, a wireless USB port, etc.

The interface 2806 includes a transmitter 2808 and a receiver 2810. In embodiments of the invention, either or both of the transmitter 2808 and the receiver 2810 are implemented using UFT modules for frequency up-conversion and down-conversion (see, for example, FIGS. 7 and 8). Alternatively, the interfaces 2806 can be implemented using a transceiver having one or more UFT modules for performing frequency translation operations (see, for example, FIGS. 10 and 11).

Pagers

The invention is directed to pagers that employ UFT modules for performing frequency translation operations.

Figure 29:
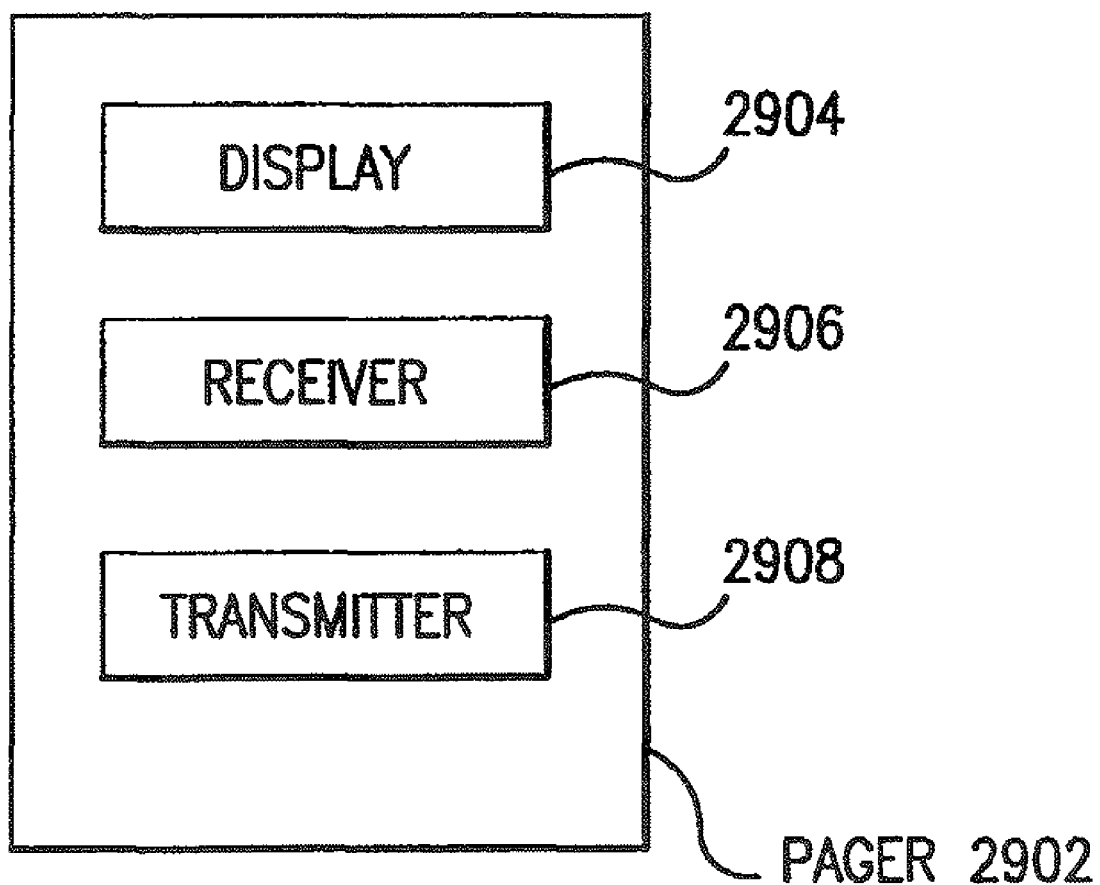
FIGS. 29 and 30 illustrate pagers according to embodiments of the invention.

FIG. 29 illustrates an example pager 2902 according to an embodiment of the invention. Pager 2902 includes a receiver 2906 for receiving paging messages. In embodiments of the invention, the receiver 2906 is implemented using a UFT module for performing frequency down-conversion operations (see, for example, FIG. 7).

The pager 2902 may also include a transmitter 2908 for sending pages, responses to pages, or other messages. In embodiments of the invention, the transmitter 2908 employs a UFT module for performing up-conversion operations (see, for example, FIG. 8).

In alternative embodiments of the invention, the receiver 2906 and the transmitter 2908 are replaced by a transceiver that employs one or more UFT modules for performing frequency translation operations (see, for example, FIGS. 10 and 11).

The pager 2902 also includes a display 2904 for displaying paging messages. Alternatively, or additionally, the pager 2902 includes other mechanisms for indicating the receipt of a page such as an audio mechanism that audibly indicates the receipt of a page, or a vibration mechanism that causes the pager 2902 to vibrate when a page is received.

Figure 30:
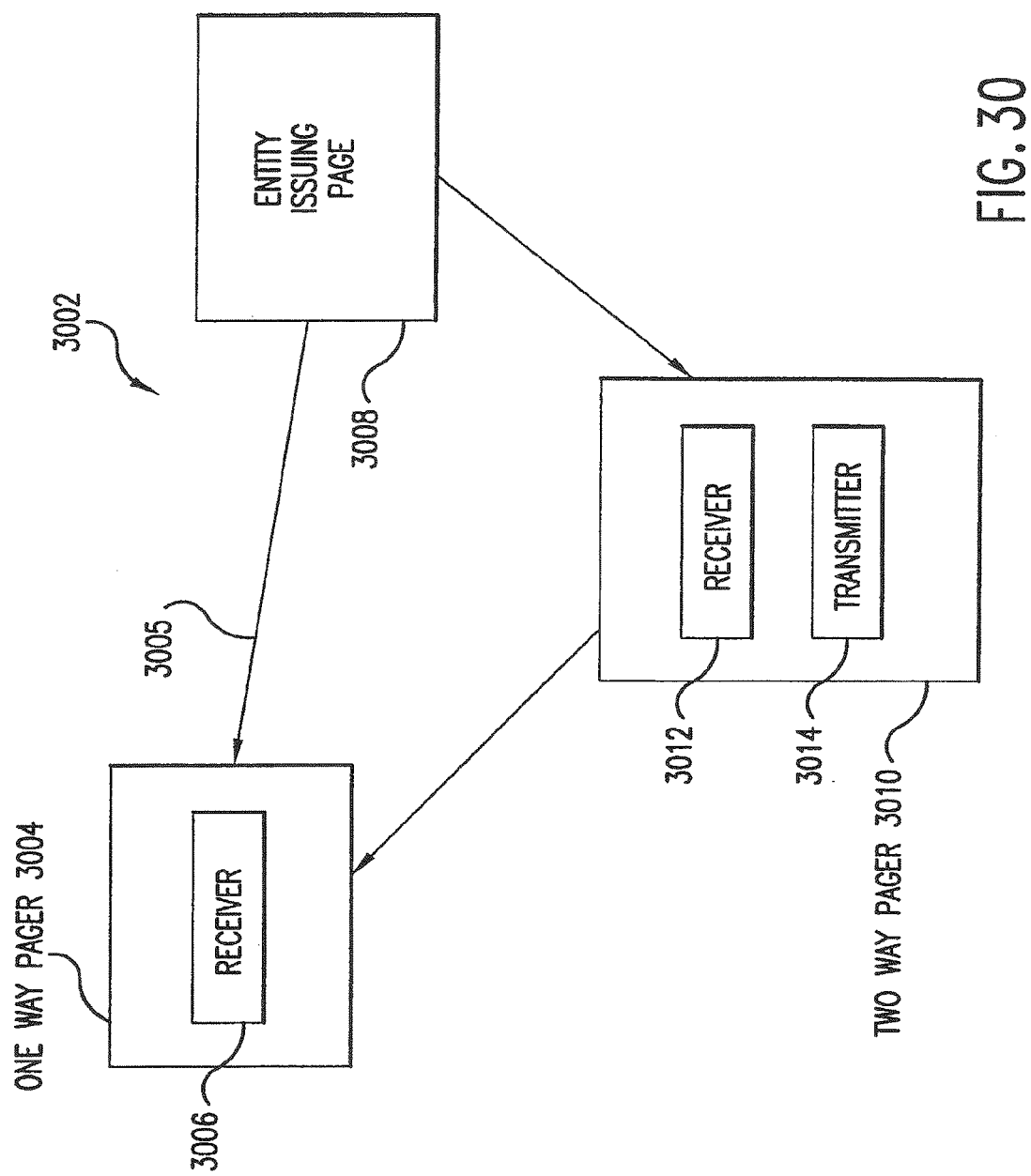

The invention is directed to all types of pagers, such as and without limitation, one way pagers, two way pagers, etc. FIG. 30 illustrates a one way pager 3004 that includes a receiver 3006. The one way pager 3004 is capable of only receiving pages. In the scenario of FIG. 30, the one way pager 3004 receives a page 3005 from an entity which issues pages 3008. The one way pager 3004 includes a receiver 3006 that is implemented using a UFT module for performing frequency down-conversion operations (see, for example FIG. 7).

FIG. 30 also illustrates a two way pager 3010. The two way pager 3010 is capable of receiving paging messages and of transmitting pages, responses to paging messages, and/or other messages. The two way pager 3010 includes a receiver 3012 for receiving messages, and a transmitter 3014 for transmitting messages. One or both of the receiver 3012 and the transmitter 3014 may be implemented using UFT modules for performing frequency translation operations (see, for example, FIGS. 7 and 8). Alternatively, the receiver 3010 and the transmitter 3014 can be replaced by a transceiver that employs one or more UFT modules for performing frequency translation operations (see, for example, FIGS. 10 and 11).

Security

Figure 31:
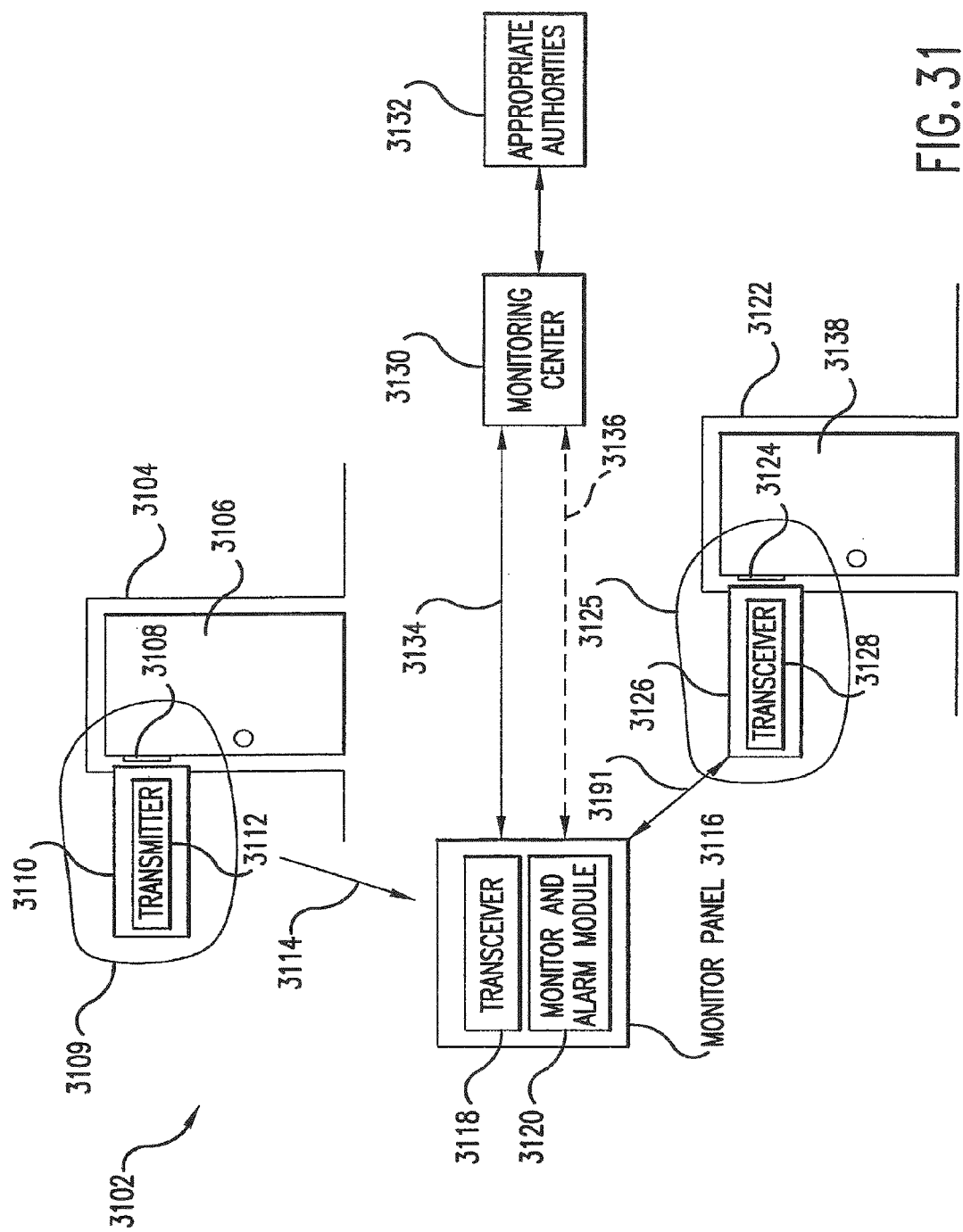
FIG. 31 illustrates a security system according to an embodiment of the invention.

The invention is directed to security systems having components which are implemented using UFT modules for performing frequency translation operations. FIG. 31 illustrates an example security system 3102 which will be used to describe this aspect of the invention.

The security system 3102 includes sensors which sense potential intrusion/hazard events, such as the opening of a window, the opening of a door, the breakage of glass, motion, the application of pressure on floors, the disruption of laser beams, fire, smoke, carbon monoxide, etc. Upon detecting an intrusion/hazard event, the sensors transmit an intrusion/hazard event message to a monitor panel 3116 that includes a monitor and alarm module 3120. The monitor and alarm module 3120 processes intrusion/hazard event messages in a well known manner. Such processing may include, for example, sending messages via a wired link 3134 or a wireless link 3136 to a monitoring center 3130, which may in turn alert appropriate authorities 3132 (such as the police, the fire department, an ambulance service, etc.).

FIG. 31 illustrates a one way sensor 3109 that is positioned, for example, to detect the opening of a door 3106. The one way sensor 3109 is not limited to this application, as would be apparent to persons skilled in the relevant arts. The one way sensor 3109 includes contacts 3108 and 3110 that are positioned on the door 3106 and the frame 3104 of the door 3106. When the contacts 3108 and 3110 are displaced from one another, indicating the opening of the door 3106, a transmitter 3112 contained in the contact 3110 transmits an intrusion/hazard event message 3114 to the monitor panel 3116.

In an embodiment, the one way sensor 3109 also transmits status messages to the monitor panel 3116. Preferably, these status messages are transmitted during a time period that is assigned to the one way sensor 3109. The status messages include information that indicates the status of the one way sensor 3109, such as if the sensor 3109 is operating within normal parameters, or if the sensor 3109 is damaged in some way. The monitor panel 3116, upon receiving the status messages, takes appropriate action. For example, if a status message indicates that the sensor 3109 is damaged, then the monitor panel 3116 may display a message to this effect, and/or may transmit a call for service. If the monitor panel 3116 does not receive a status message from the one way sensor 3109 in the time period assigned to the one way sensor 3109, then the monitor panel 3116 may issue an alarm indicating a potential intrusion or other breach in perimeter security.

Preferably, the transmitter 3112 is implemented using a UFT module to perform frequency up-conversion operations (see, for example, FIG. 8).

The one way sensor 3109 is capable of only transmitting. The invention is also directed to two way sensors, an example of which is shown as 3125. The two way sensor 3125 is shown in FIG. 31 as being positioned to detect the opening of a door 3138. The two way sensor 3125 is not limited to this application, as would be apparent to persons skilled in the relevant arts.

The two way sensor 3125 includes contacts 3124 and 3126 for detecting the opening of the door 3138. Upon detection of the opening of the door 3138, a transceiver 3128 in contact 3126 sends an intrusion/hazard event message to the monitor panel 3116. Preferably, the transceiver 3128 is implemented using one or more UFT modules for performing frequency translation operations (see, for example, FIGS. 10 and 11). Alternatively, the two way sensor 3125 may employ a receiver and a transmitter, wherein one or both of the receiver and transmitter includes UFT modules for performing frequency translation operations (see, for example, FIGS. 7 and 8).

The two way sensor 3125 is capable of both receiving and transmitting messages. Specifically, as just discussed, the transceiver 3128 in the two way sensor 3125 sends intrusion/hazard event messages to the monitor panel 3116. Additionally, the two way sensor 3125 may receive commands or other messages (such as polls) from the monitor panel 3116 via the transceiver 3128.

In an embodiment, the two way sensor 3125 also transmits status messages to the monitor panel 3116. In an embodiment, these status messages are transmitted during a time period that is assigned to the two way sensor 3125. The nature of these status message is described above. In an alternative embodiment, the monitor panel 3116 polls for status messages. When the two way sensor 3125 receives an appropriate polling message, it transmits its status message to the monitor panel 3116. If the monitor panel 3116 does not receive a status message in response to a polling message, then it may issue an alarm indicating a potential intrusion or other breach in perimeter security.

The monitor panel 3116 includes a transceiver 3118 for communicating with sensors, such as sensors 3109 and 3125, and for also communicating with external entities, such as monitoring center 3130, appropriate authorities 3132, etc. The transceiver 3118 is preferably implemented using one or more UFT modules for performing frequency translation operations (see, for example, FIGS. 10 and 11). Alternatively, the transceiver 3118 may be replaced by a receiver and a transmitter, wherein one or both of the receiver and transmitter is implemented using UFT modules for performing frequency translation operations (see, for example, FIGS. 7 and 8).

In an embodiment, the monitor panel 3116 communicates with the monitoring center 3130 via a wired telephone line 3134. However, communication over the telephone line 3134 may not always be possible. For example, at times, the telephone line 3134 may be inoperative due to natural events, failure, maintenance, sabotage, etc. Accordingly, embodiments of the invention include a back-up communication mechanism. For example, in FIG. 31, the monitor panel 3116 includes a cellular phone backup system for communication with the monitoring center 3130. This wireless link between the monitor panel 3116 and the monitoring center 3130 is represented by dotted line 3136. The transceiver 3118 (or perhaps another transceiver contained in the monitoring panel 3116 or located proximate thereto) communicates with the monitor center 3130 via the wireless link 3136. As noted, the transceiver 3118 is preferably implemented using one or more UFT modules for performing frequency translation operations (see, for example, FIGS. 10 and 11).

Repeaters

The invention is directed to communication repeaters which, generally, receive a signal, optionally amplify the signal, and then transmit the amplified signal at the same or different frequency or frequencies. A repeater is often used in combination with one or more other repeaters to transmit a signal from a first point to a second point, where the first and second points are widely spaced from one another and/or are not in line of sight with one another.

Figure 32:
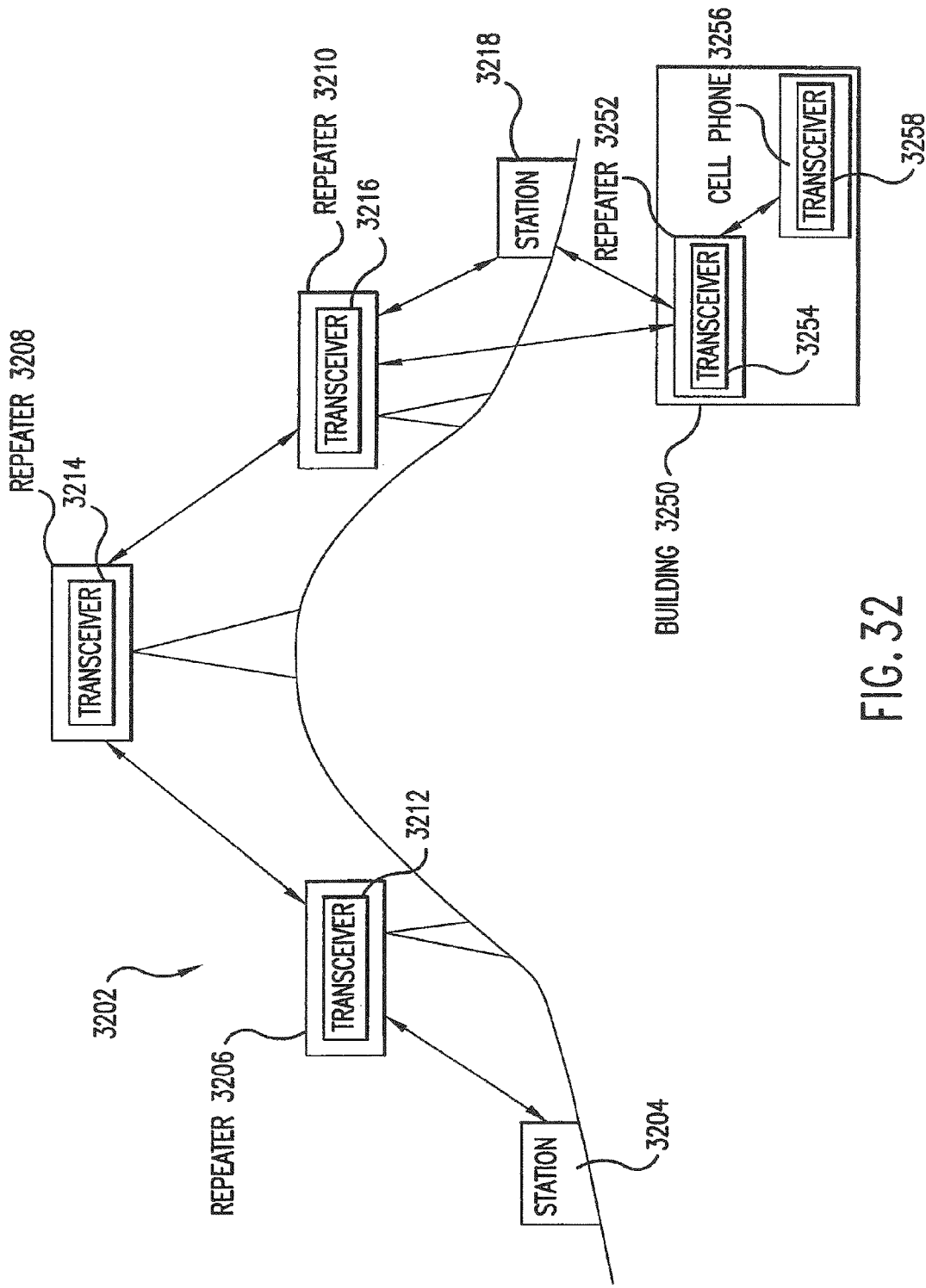
FIG. 32 illustrates a repeater according to an embodiment of the invention.

This is illustrated, for example, in FIG. 32, where a signal is being transmitted from a station 3204 to another station 3218, where stations 3204, 3218 are separated by a mountain. Signals from station 3204 are sent to station 3218 via repeaters 3206, 3208, and 3210. Similarly, signals from station 3218 are sent to station 3204 via repeaters 3206, 3208, and 3210.

Each of the repeaters 3206, 3208, 3210 includes a transceiver 3212, 3214, 3216, respectively. In embodiments of the invention, the transceivers 3212, 3214, 3216 are implemented using UFT modules for performing frequency translation operations (see, for example, FIGS. 10 and 11). Alternatively, the transceivers 3212, 3214, 3216 may be replaced by receivers and transmitters, wherein the receivers and transmitters are implemented using UFT modules for performing frequency translation operations (see, for example, FIGS. 7 and 8).

The invention includes all types of repeaters. For example, the repeater scenario described above represents a long distance or long range use of repeaters (for example, macro use). The invention is also applicable to short distance use of repeaters (for example, micro use). An example of this is shown in FIG. 32, where a repeater 3252 having a transceiver 3254 is positioned in a building or home 3250. The repeater 3252 relays signals from a cell phone 3256 or other communication device (such as a computer with a modem, a television with an input for programming, a security system, a home control system, etc.) to a base station 3218 and/or another repeater 3210. In the example scenario of FIG. 32, the combination of the cell phone 3256 and the repeater 3252 is generally similar to a cordless telephone. In embodiments of the invention, the transceivers 3254, 3258 are implemented using UFT modules for performing frequency translation operations (see, for example, FIGS. 10 and 11). Alternatively, the transceivers 3254, 3258 may be replaced by receivers and transmitters, wherein the receivers and transmitters are implemented using UFT modules for performing frequency translation operations (see, for example, FIGS. 7 and 8).

Mobile Radios

The invention is directed to mobile radios that use UFT modules for performing frequency translation operations. The invention is applicable to all types of mobile radios operating in any and all bands for any and all services, such as but not limited to walkie-talkies, citizen band, business, ISM (Industrial Scientific Medical), amateur radio, weather band, etc. See FIGS. 42A-42D for example frequency bands operable with the present invention (the invention is not limited to these bands).

Figure 33:
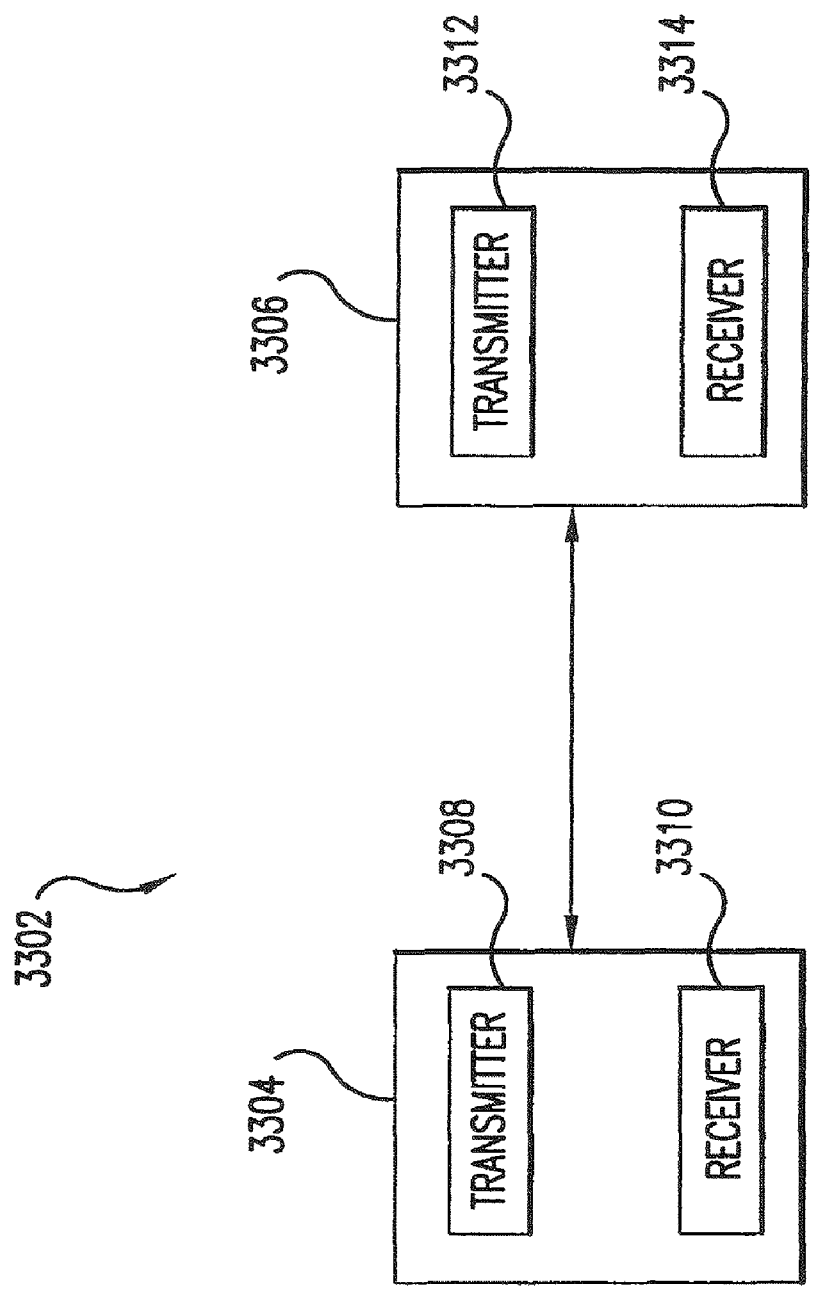
FIG. 33 illustrates mobile radios according to an embodiment of the invention.

FIG. 33 illustrates an example scenario 3302 where a first mobile radio 3304 is communicating with a second mobile radio 3306. Each of the mobile radios 3304, 3306 includes a transmitter 3308, 3312 and a receiver 3310, 3314, respectively. The transmitter 3308, 3312, and/or the receivers 3310, 3314 are implemented using UFT modules for performing frequency translation operations (see, for example, FIGS. 7 and 8). Alternatively, the transmitters 3308, 3312 and the receivers 3310, 3314 can be replaced by transceivers which utilize one or more UFT modules for performing frequency translation operations (see, for example, FIGS. 10 and 11).

Figure 44:
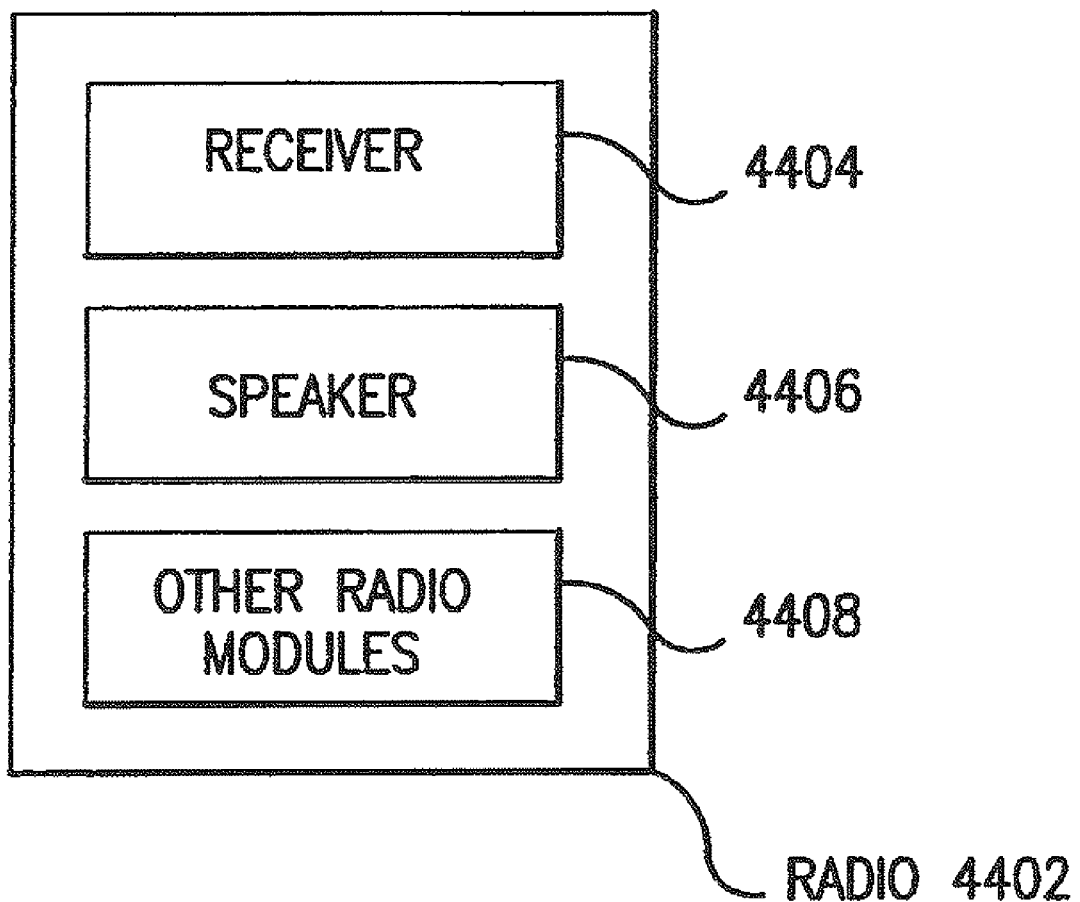
FIG. 44 illustrates an example radio according to an embodiment of the invention.

The invention is also directed to receive-only radios, such as the radio 4402 shown in FIG. 44. The radio 4402 includes a receiver 4404 to receive broadcasts. The radio 4402 also includes a speaker 4406 and other well known radio modules 4408. The radio 4402 may work in any band, such as but not limited to AM, FM, weather band, etc. See FIGS. 42A-42D for an example of the bands. The receiver 4404 is preferably implemented using a UFT module (see, for example, FIG. 7).

Satellite Up/Down Links

The invention is directed to systems and methods for communicating via satellites. This includes, for example, direct satellite systems (DSS), direct broadcast satellite (DBS), ultra wideband public/private services, etc.

Figure 34:
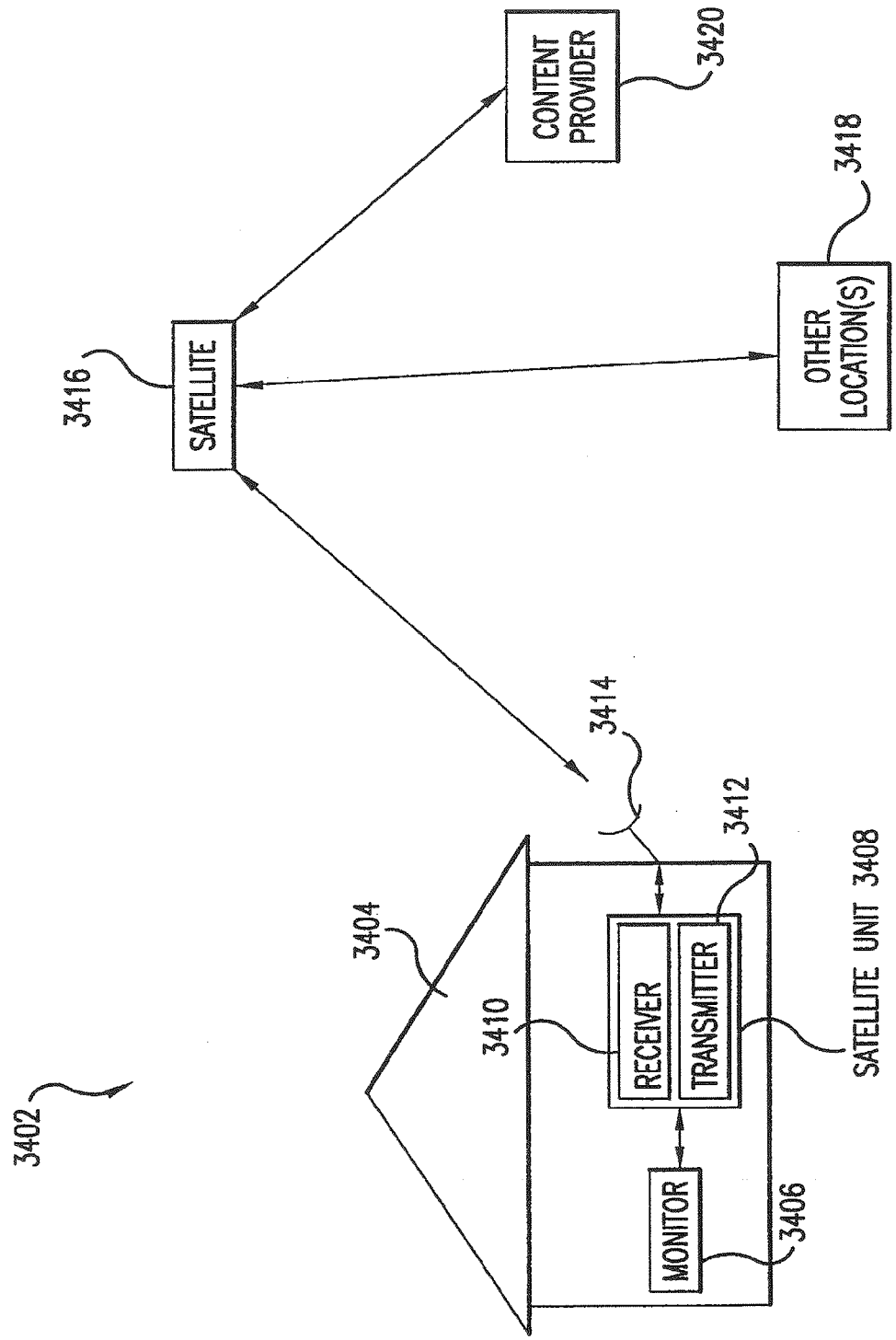
FIG. 34 illustrates an environment involving satellite communications according to an embodiment of the invention.

FIG. 34 illustrates an example environment 3402 where content transmitted from a content provider 3420 is received by a private home 3404 via a satellite 3416. A satellite unit 3408 is located in the home 3404. The satellite unit 3408 includes a receiver 3410 for receiving signals from the satellite 3416 and a transmitter 3412 for transmitting signals to the satellite 3416.

In operation, the content provider 3420 transmits content to the satellite 3416, which then broadcasts that content. The content is received at the home 3404 by an antenna or satellite dish 3414. The received signals are provided to the receiver 3410 of the satellite unit 3408, which then down-converts and demodulates, as necessary, the signal. The data is then provided to a monitor 3406 for presentation to the user. The monitor 3406 may be any device capable of receiving and displaying the content from the content provider 3420, such as a TV, a computer monitor, etc. In embodiments of the invention, the receiver 3410 and/or the transmitter 3412 are implemented using UFT modules for performing frequency translation operations (see, for example, FIGS. 7 and 8). In other embodiments, the receiver 3410 and the transmitter 3412 are replaced by a transceiver which employs one or more UFT modules for performing frequency translation operations (see, for example, FIGS. 10 and 11).

The satellite unit 3408 can be used to send and receive large amounts of data via ultra wide band satellite channels. For example, in addition to receiving content from the content provider, is possible to use the satellite unit 3408 to exchange data with other locations 3418 via the satellite links provided by satellites (such as satellite 3416).

Command and Control

The invention is directed to command and control applications. Example command and control applications are described below for illustrative purposes. The invention is not limited to these examples.

PC Peripherals

Figure 35:
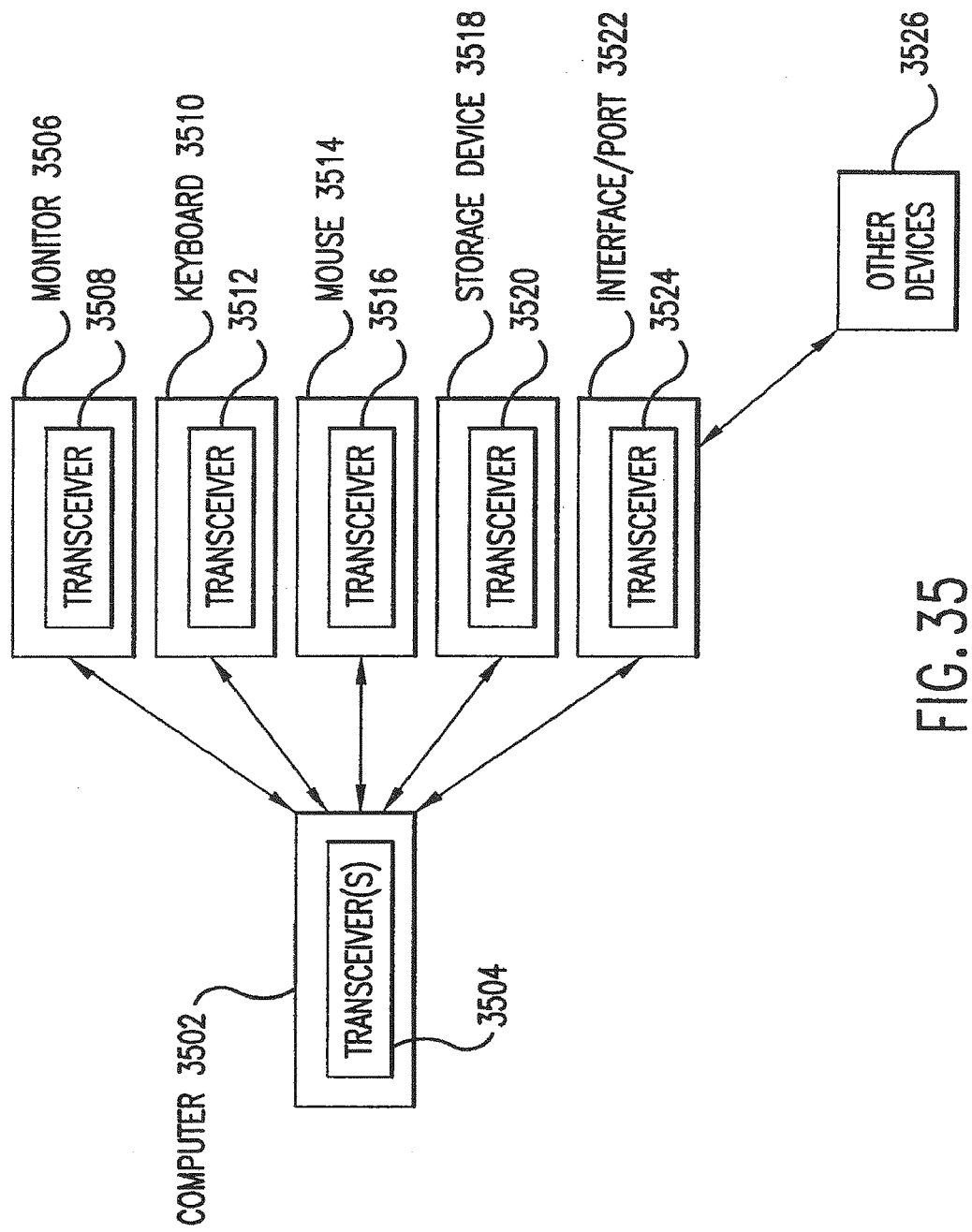
FIG. 35 illustrates a computer and its peripherals according to an embodiment of the invention.

The present invention is directed to computer peripherals that communicate with a computer over a wireless communication medium. FIG. 35 illustrates an example computer 3502 which includes a number of peripherals such as but not limited to a monitor 3506, a keyboard 3510, a mouse 3514, a storage device 3518, and an interface/port 3522. It should be understood that the peripherals shown in FIG. 35 are presented for illustrative purposes only, and are not limiting. The invention is directed to all devices that may interact with a computer.

The peripherals shown in FIG. 35 interact with a computer 3502 via a wireless communication medium. The computer 3502 includes one or more transceivers 3504 for communicating with peripherals. Preferably, the transceivers 3504 are implemented using UFT modules for performing frequency translation operations (see, for example, FIGS. 10 and 11). Alternatively, the transceiver 3504 in the computer 3502 may be replaced by receivers and transmitters, wherein any of the receivers and transmitters are implemented by using UFT modules for performing frequency translation operations (see, for example, FIGS. 7 and 8).

Each of the peripherals includes a transceiver for communicating with the computer 3502. In embodiments of the invention, the transceivers are implemented using UFT modules for performing frequency translation operations (see, for example, FIGS. 10 and 11). In other embodiments, the transceivers are replaced by receivers and transmitters which are implemented by UFT modules for performing frequency translation operations (see, for example, FIGS. 7 and 8).

The computer 3502 may send a signal to the peripherals that indicates that it is receiving signals from the peripherals. The peripherals could then provide an indication that a link with the computer 3502 is established (such as, for example, turning a green light on).

In some embodiments, some peripherals may be transmit-only, in which case they would include a transmitter instead of a transceiver. Some peripherals which may be transmit only include, for example, the keyboard 3510, the mouse 3514, and/or the monitor 3506. Preferably, the transmitter is implemented using a UFT module for performing frequency up-conversion operations (see, for example, FIG. 8).

Building/Home Functions

The invention is directed to devices for controlling home functions. For example, and without limitation, the invention is directed to controlling thermostats, meter reading, smart controls, including C-Bus and X-10, garage door openers, intercoms, video rabbits, audio rabbits, etc. These examples are provided for purposes of illustration, and not limitation. The invention includes other home functions, appliances, and devices, as will be apparent to persons skilled in the relevant art(s) based on the teachings contained herein.

Figure 36:
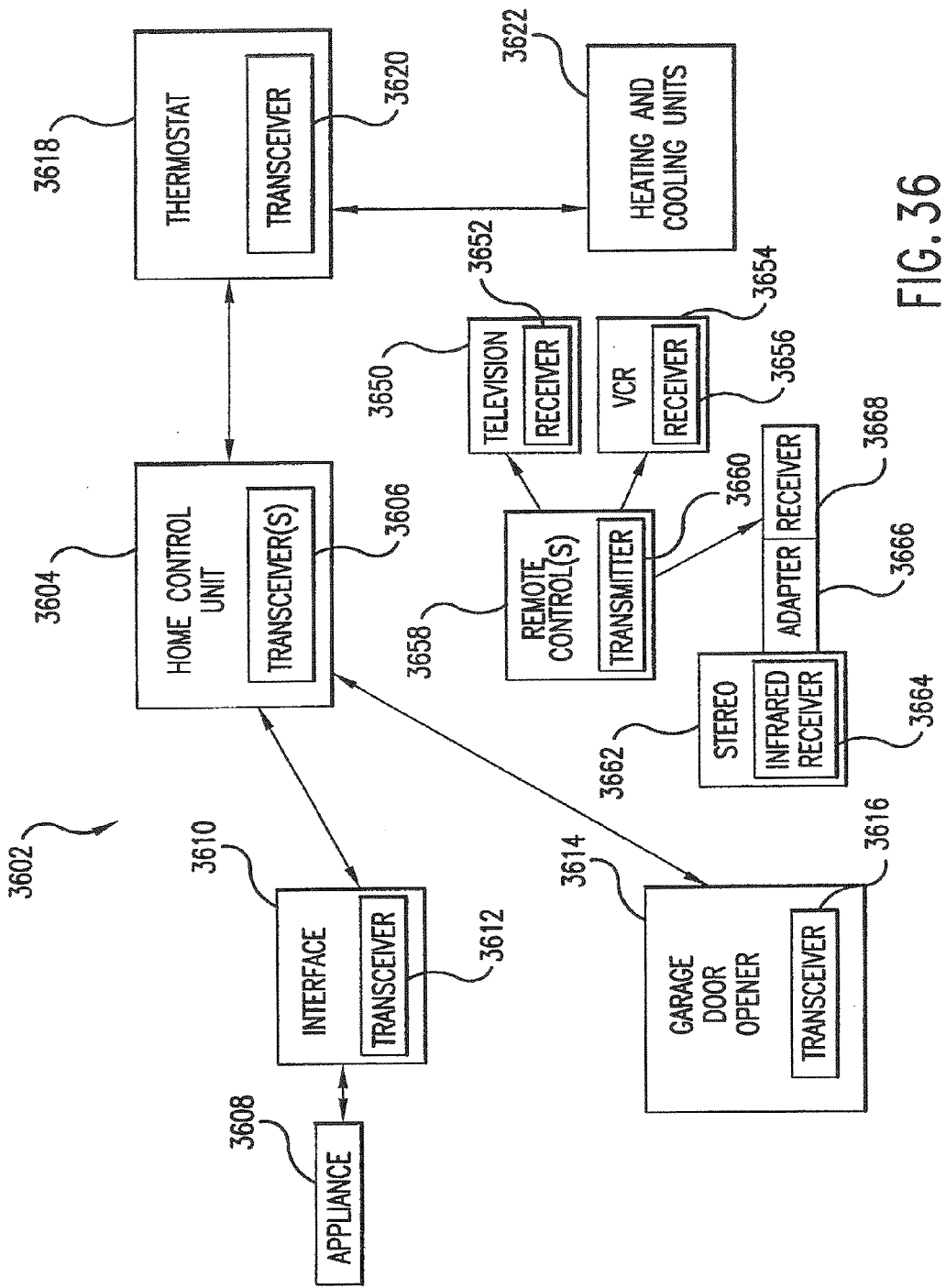
FIGS. 36-38 illustrate home control devices according to embodiments of the invention.

FIG. 36 illustrates an example home control unit 3604. The home control unit 3604 includes one or more transceivers 3606 for interacting with remote devices. In embodiments of the invention, the transceivers 3606 are implemented using UFT modules for performing frequency translation operations (see, for example, FIGS. 10 and 11). In other embodiments, the transceivers 3606 are replaced by receivers and transmitters that employ UFT modules for performing frequency translation operations (see, for example, FIGS. 7 and 8). In some embodiments, the home control unit 3604 can be transmit only, in which case the transceiver 3606 is replaced by a transmitter which is preferably implemented using a UFT module.

The home control unit 3604 interacts with remote devices for remotely accessing, controlling, and otherwise interacting with home functional devices. For example, the home control unit 3604 can be used to control appliances 3608 such as, but not limited to, lamps, televisions, computers, video recorders, audio recorders, answering machines, etc. The appliances 3608 are coupled to one or more interfaces 3610. The interfaces 3610 each includes a transceiver 3612 for communicating with the home control 3604. The transceiver 3612 includes one or more UFT modules for performing frequency translation operations (see, for example, FIGS. 10 and 11). Alternatively, the interfaces 3610 each includes a receiver and a transmitter, either or both of which include UFT modules for performing frequency translation operations (see, for example, FIGS. 7 and 8).

The home control unit 3604 can also remotely access and control other home devices, such as a thermostat 3618 and a garage door opener 3614. Such devices which interact with the home control unit 3604 include transceivers, such as transceiver 3620 in the thermostat 3618, and transceiver 3616 in the garage opener 3614. The transceivers 3620, 3616 include UFT modules for performing frequency translation operations (see, for example, FIGS. 10 and 11). Alternatively, the transceivers 3616, 3620 can be replaced by receivers and transmitters for performing translation operations (see, for example, FIGS. 7 and 8).

The invention is also directed to the control of home electronic devices, such as but not limited to televisions, VCRs, stereos, CD players, amplifiers, tuners, computers, video games, etc. For example, FIG. 36 illustrates a television 3650 and a VCR 3654 having receivers 3652, 3656 for receiving control signals from remote control(s) 3658, where each of the remote control(s) 3658 includes a transmitter 3660. The receivers 3652, 3656 are preferably implemented using UFT modules (see, for example, FIG. 7), and the transmitter 3660 is preferably implemented using a UFT module (see, for example, FIG. 8).

In some cases, it may be necessary to install an adapter 3666 to enable a device to operate with remote control(s) 3658. Consider a stereo 3662 having an infrared receiver 3664 to receive infrared control signals. Depending on their implementation, some embodiments of the remote control(s) 3658 may not transmit signals that can be accurately received by the infrared receiver 3664. In such cases, it is possible to locate or affix a receiver 3668 (preferably implemented using a UFT module) and an adapter 3666 to the stereo 3662. The receiver 3668 operates to receive control signals from the remote control(s) 3658. The adapter 3666 converts the received signals to signals that can be received by the infrared receiver 3664.

Figure 37:
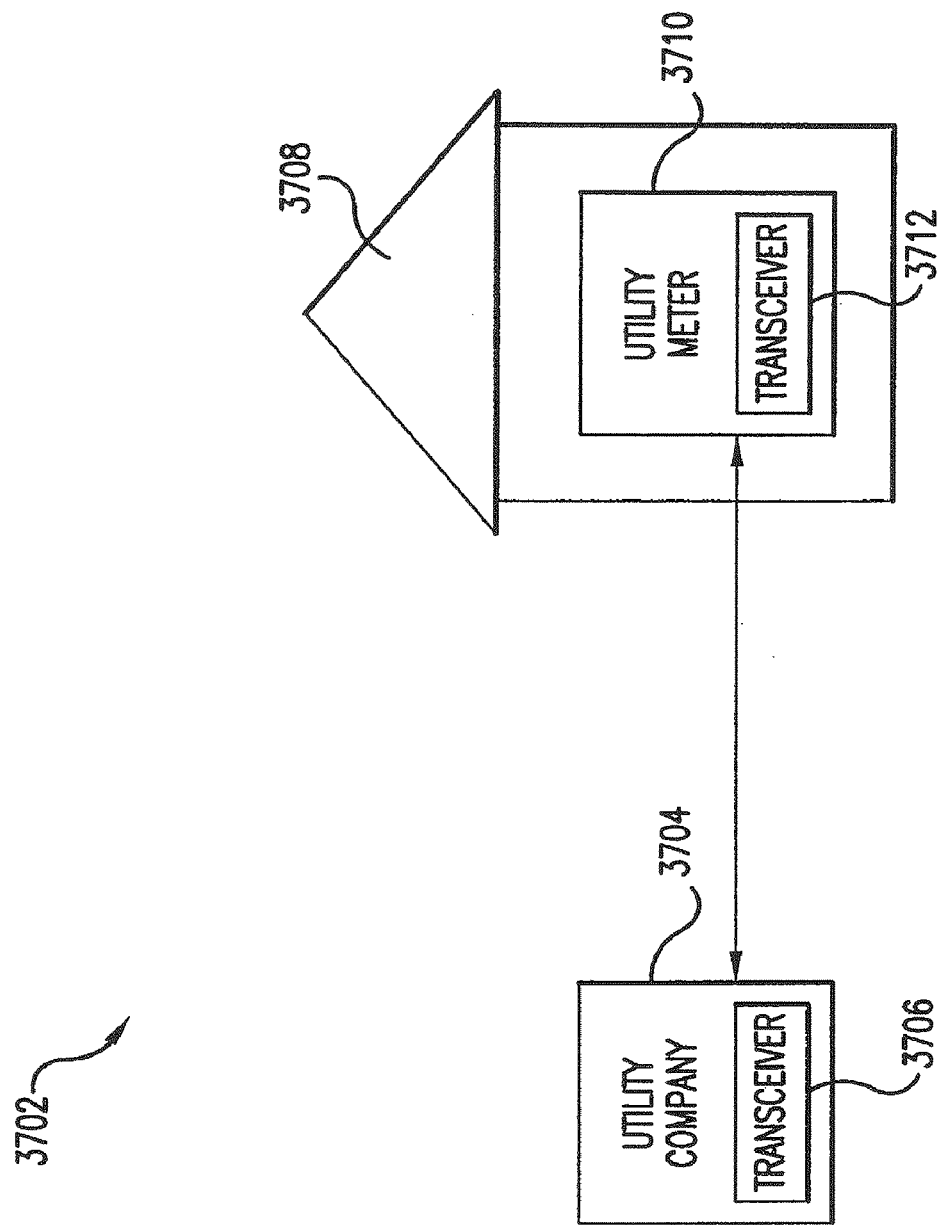

The invention can also be used to enable the remote access to home control components by external entities. For example, FIG. 37 illustrates a scenario 3702 where a utility company 3704 remotely accesses a utility meter 3710 that records the amount of utilities used in the home 3708. The utility company 3704 may represent, for example, a service vehicle or a site or office. The utility meter 3710 and the utility company 3704 include transceivers 3712, 3706, respectively, for communicating with each other. Preferably, the transceivers 3706, 3712 utilize UFT modules for performing frequency translation operations (see, for example, FIGS. 10 and 11). Alternatively, the transceivers 3706, 3712 are replaced by receivers and transmitters, wherein the receivers and/or transmitters are implemented using UFT modules for performing frequency translation operations (see, for example, FIGS. 7 and 8).

Figure 38:
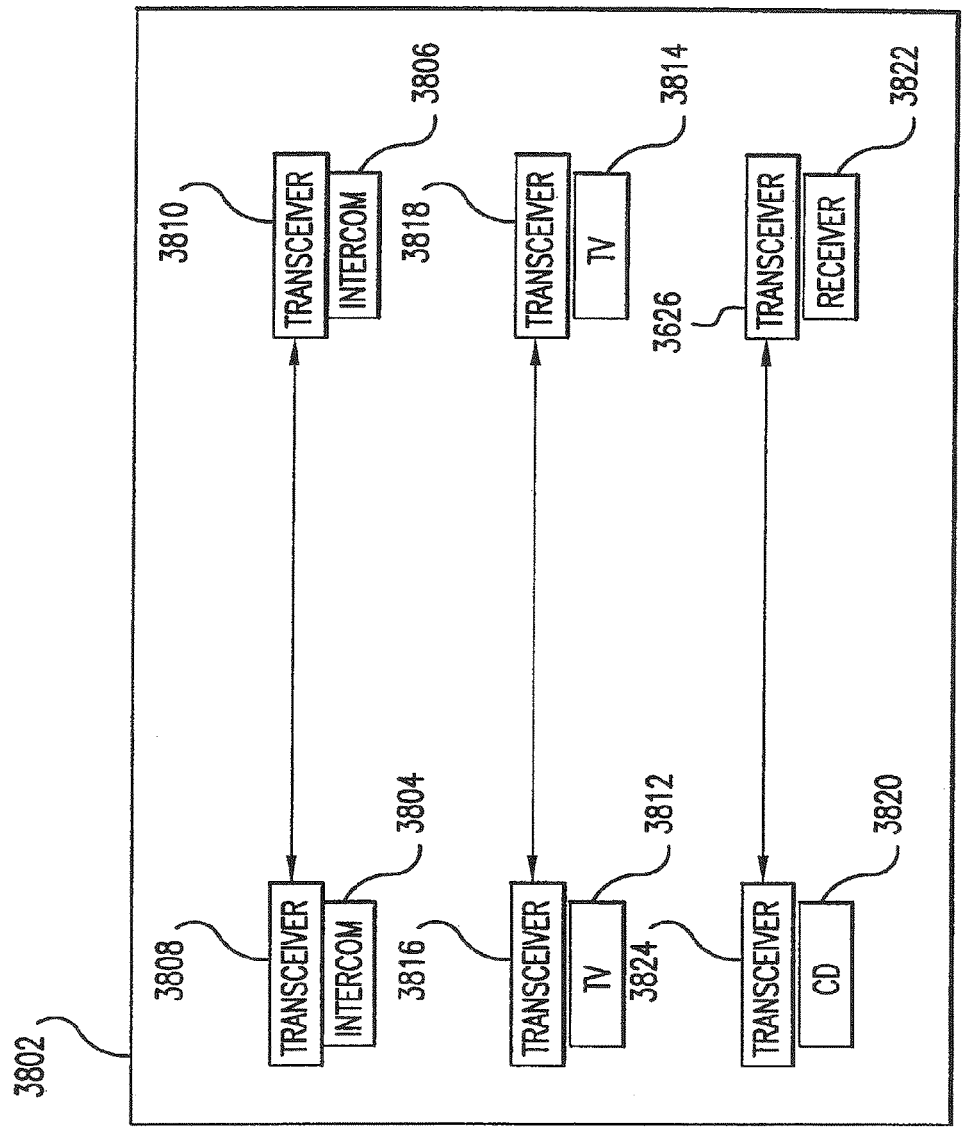

The invention is also directed to other home devices. For example, and without limitation, the invention is directed to intercoms. As shown in FIG. 38, intercoms 3804, 3806 include transceivers 3808, 3810, respectively, for communicating with other. In embodiments of the invention, the transceivers 3808, 3810 include UFT modules for performing frequency translation operations (see, for example, FIGS. 10 and 11). In other embodiments, the transceivers 3808, 3810 are replaced by receivers and transmitters, wherein the receivers and/or transmitters are implemented using UFT modules for performing frequency translation operations (see, for example, FIGS. 7 and 8).

The invention can also be used to transmit signals from one home device to another home device. For example, the invention is applicable for propagating video and/or audio signals throughout a home. This is shown, for example, in FIG. 38, where TVs 3812, 3814 include transceivers 3816, 3818 for communicating with one another. The transceivers 3816, 3818 enabled video signals to be sent from one of the TVs to another. In embodiments of the invention, the transceivers 3816, 3818 are implemented using UFT modules for performing frequency translation operations (see, for example, FIGS. 10 and 11). In other embodiments, the transceivers 3816, 3818 are replaced by receivers and transmitters, wherein the receivers and/or transmitters are implemented using UFT modules for performing frequency translation operations (see, for example, FIGS. 7 and 8).

FIG. 38 also illustrates an embodiment where transceivers 3824, 3826 are used to communicate audio signals between a CD player 3820 and a multi-media receiver 3822. In embodiments, the transceivers 3824, 3826 are implemented using UFT modules for performing frequency translation operations (see, for example, FIGS. 10 and 11). In other embodiments, the transceivers 3824, 3826 are replaced by receivers and transmitters, wherein the receivers and/or transmitters are implemented using UFT modules for performing frequency translation operations (see, for example, FIGS. 7 and 8).

In the figures described above, many of the components are shown as including transceivers. In practice, however, some components are receive only or transmit only. This is true for some of the devices discussed throughout this application, as will be apparent to persons skilled in the relevant art(s). In such cases, the transceivers can be replaced by receivers or transmitters, which are preferably implemented using UFT modules for performing frequency translation operations (see, for example, FIGS. 7 and 8).

Automotive Controls

The invention is directed to automotive controls, and other devices often used in or with automobiles.

Figure 39:
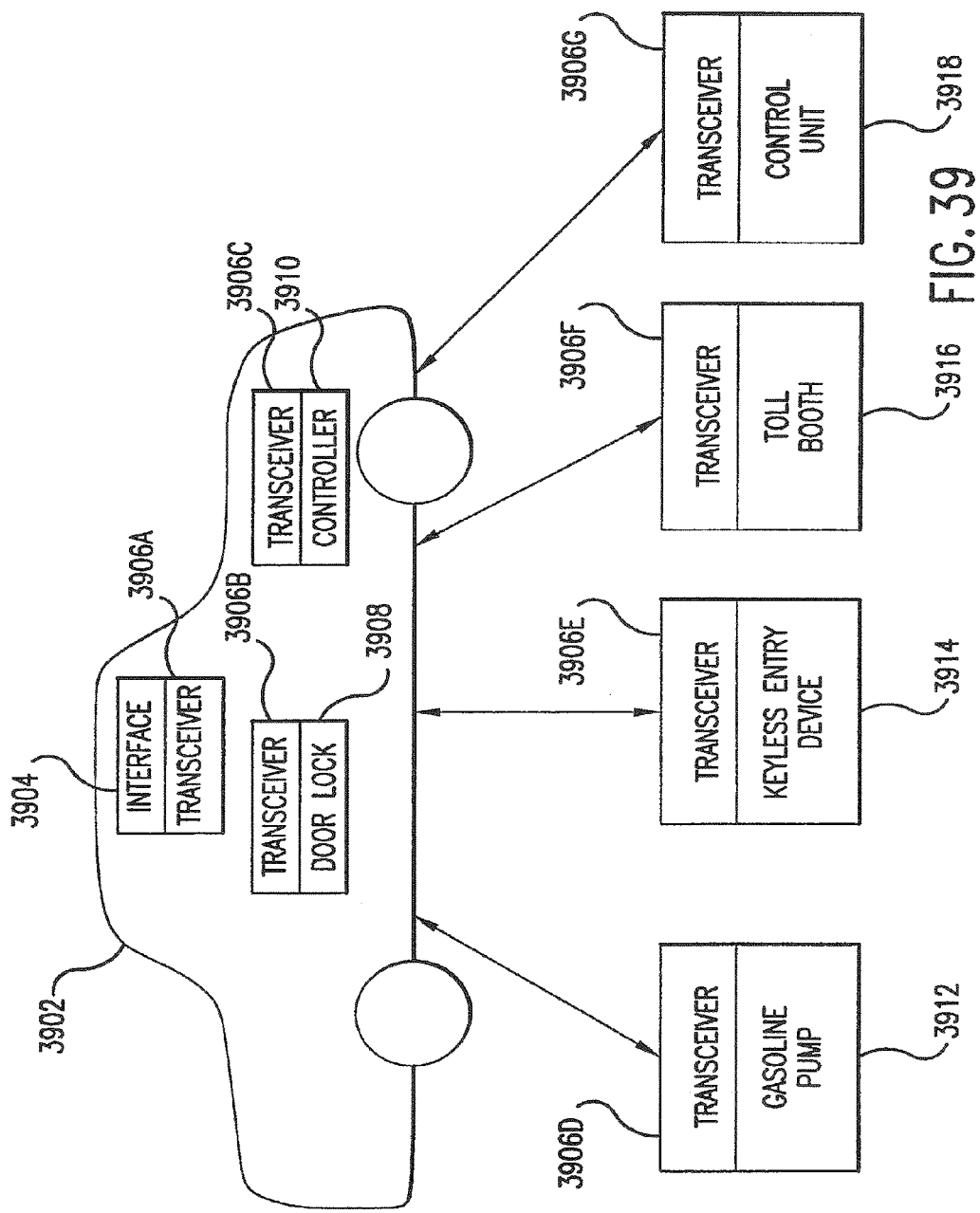
FIG. 39 illustrates an example automobile according to an embodiment of the invention.

FIG. 39 illustrates an example car 3902 according to an embodiment of the invention. The car 3902 includes a number of devices that communicate with objects.

For example, the car 3902 includes an interface 3904 (or multiple interfaces) for communicating with external devices, such as but not limited to gasoline pumps 3912 and toll booths 3916. In operation, for example, when the car 3902 approaches the toll booth 3916, the interface 3904 communicates with the toll booth 3916 in an appropriate and well known manner to enable the car 3902 to pass through the toll booth 3916. Also, when the car 3902 is proximate to the gasoline pump 3912, the interface 3904 interacts with the gas pump in an appropriate and well known manner to enable the driver of the car 3902 to utilize the gas pump 3912 to fill the car 3902 with gas.

The car also includes a controllable door lock 3908. Upon receipt of an appropriate signal from a keyless entry device 3914, the controllable door lock 3908 locks or unlocks (based on the signal received).

The car further includes a controller 3910, which controls and interacts with the systems, instrumentation, and other devices of the car 3902. The controller 3910 communicates with a control unit 3918. It is possible to control the car 3902 via use of the control unit 3918. The control unit 3918 sends commands to the controller 3910. The controller 3910 performs the functions specified in the commands from the control unit 3918. Also, the control unit 3918 sends queries to the controller 3910. The controller 3910 transmits to the control unit 3918 the car-related information specified in the queries. Thus, any car functions under the control of the controller 3910 can be controlled via the control unit 3918.

It is noted that the features and functions described above and shown in FIG. 39 are provided for illustrative purposes only, and are not limiting. The invention is applicable to other car related devices, such as but not limited to security systems, GPS systems, telephones, etc.

The interface 3904, the door lock 3908, the controller 3910, and any other car devices of interest include one or more transceivers 3906A, 3906B, 3906C for communicating with external devices. Also, the gasoline pump 3912, keyless entry device 3914, toll booth 3916, control unit 3918, and any other appropriate devices include transceivers 3906D, 3906E, 3906F, 3906G for communicating with the car 3902.

Preferably, the transceivers 3906 are implemented using UFT modules for performing frequency translation operations (see FIGS. 10 and 11). Alternatively, one or more of the transceivers 3906 can be replaced by receiver(s) and/or transmitter(s), wherein the receiver(s) and/or transmitter(s) are implemented using UFT modules for performing frequency translation operations (see, for example, FIGS. 7 and 8).

Aircraft Controls

The invention is directed to aircraft controls, and other devices often used in or with aircrafts.

Figure 40A:
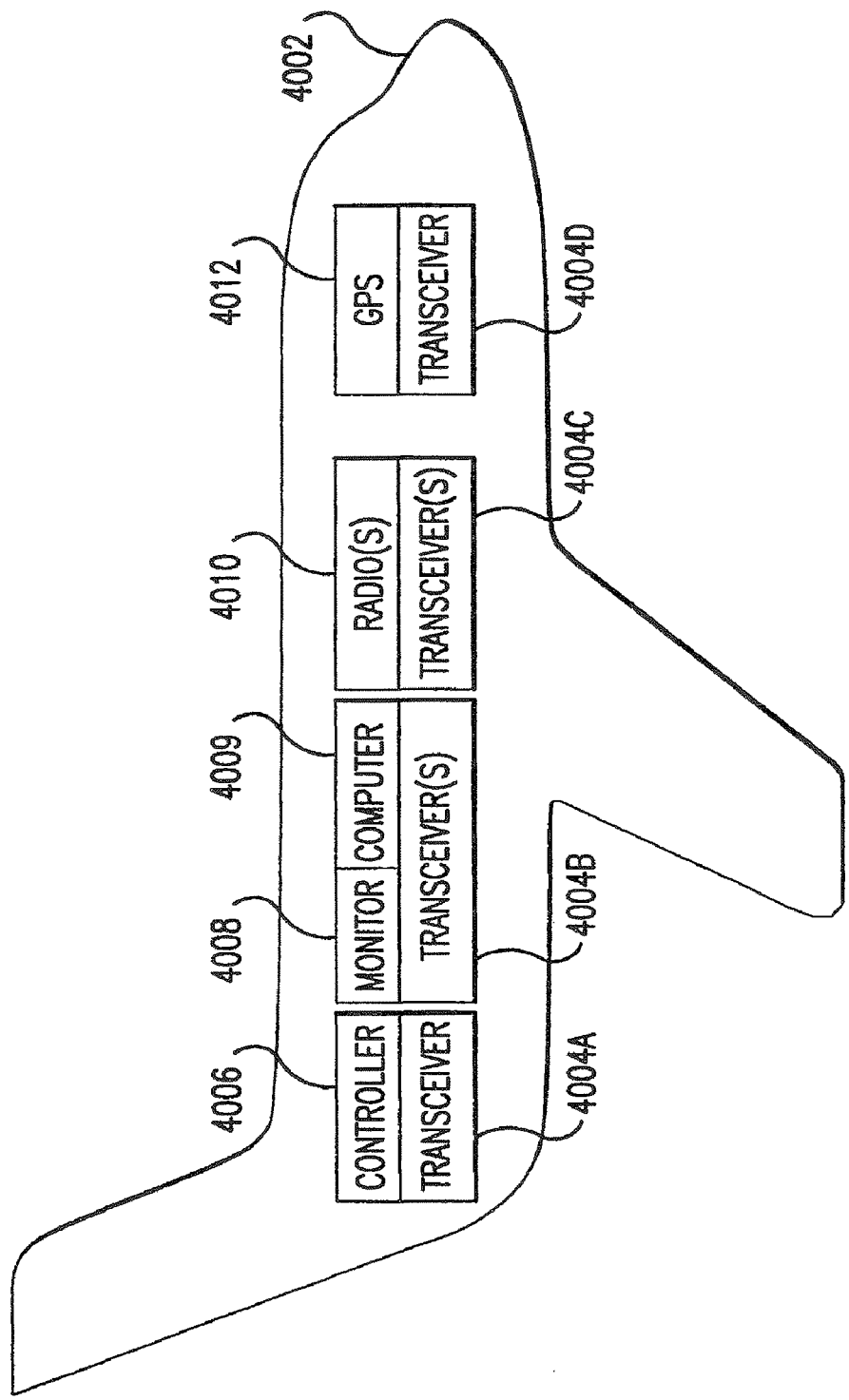
FIG. 40A illustrates an example aircraft according to an embodiment of the invention.

FIG. 40A illustrates an example aircraft 4002 according to an embodiment of the invention. The aircraft 4002 includes, for example, a GPS unit 4012 for receipt of positioning information. The GPS unit 4012 is coupled to a transceiver 4004D for receiving positioning information.

The aircraft 4002 also includes one or more radio(s) 4010 for communication with external entities. The radio(s) 4010 include one or more transceivers 4004C for enabling such communication.

The aircraft 4002 also includes monitors 4008 for displaying, for example, video programming, and computers 4009 that transmit and receive information over a communication network. The monitors 4008 and computers 4009 include one or more transceiver(s) 4004B for communicating with external devices, such as video programming sources and/or data communication networks.

The aircraft 4002 includes a controller 4006 for controlling the systems, instrumentation, and other devices of the aircraft 4002. The controller 4006 can communicate with external devices via a transceiver 4004A. External devices may control the aircraft 4002 by sending appropriate commands, queries, and other messages to the controller 4006.

It is noted that the features and functions described above and shown in FIG. 40A are provided for illustrative purposes only, and are not limiting. The invention is applicable to other aircraft related devices, such as but not limited to security systems, telephones, etc. . . .

Preferably, the transceivers 4004 are implemented using UFT modules for performing frequency translation operations (see FIGS. 10 and 11). Alternatively, one or more of the transceivers 4004 can be replaced by receiver(s) and/or transmitter(s), wherein the receiver(s) and/or transmitter(s) are implemented using UFT modules for performing frequency translation operations (see, for example, FIGS. 7 and 8).

Maritime Controls

The invention is directed to maritime controls, and other maritime-related devices.

Figure 40B:
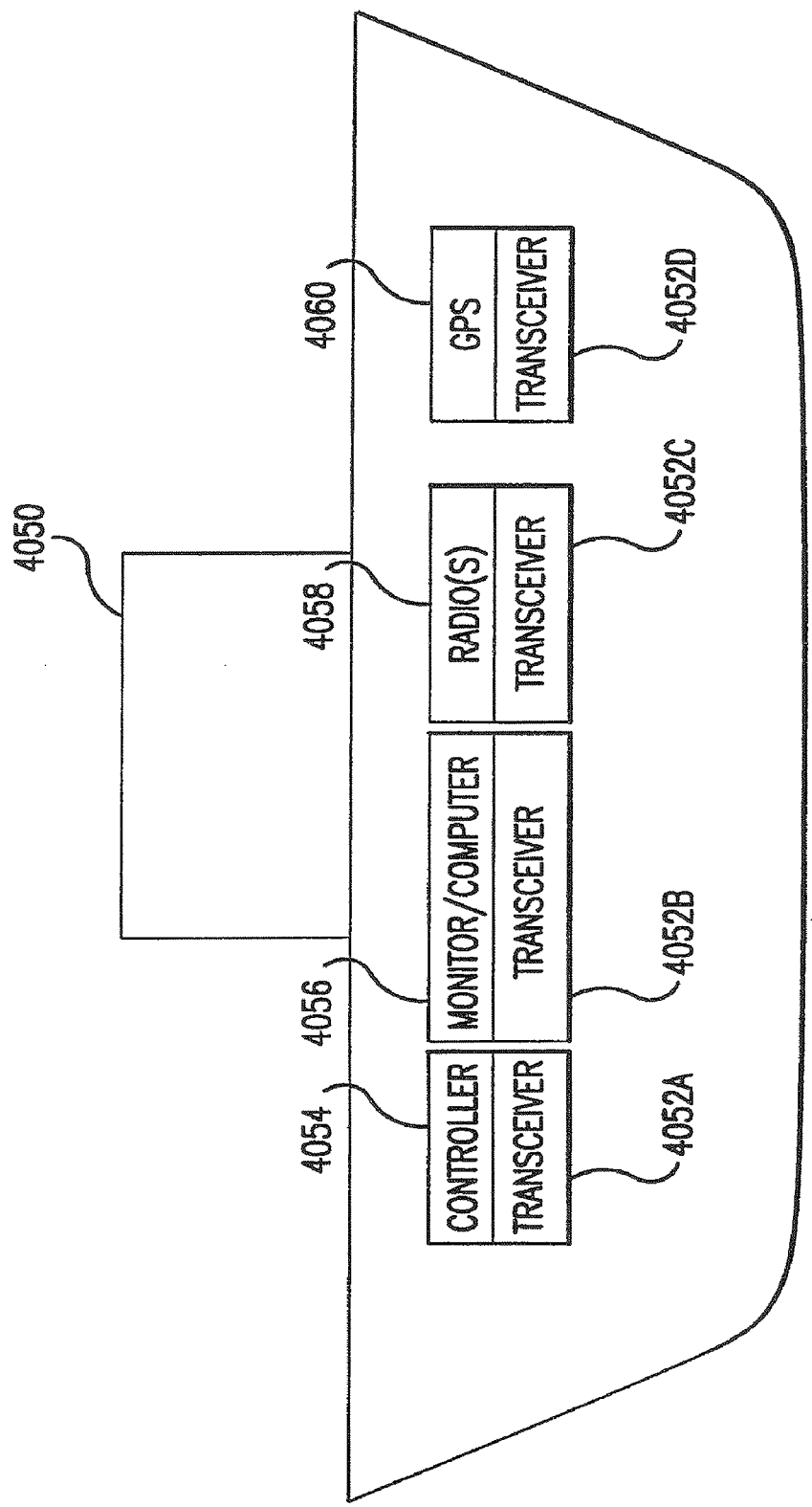
FIG. 40B illustrates an example boat according to an embodiment of the invention.

FIG. 40B illustrates an example boat 4050 according to an embodiment of the invention. The devices in the example boat 4050 of FIG. 40B are similar to the devices in the example aircraft 4002 of FIG. 40A. Accordingly, the description above relating to FIG. 40A applies to FIG. 40B.

Radio Control

The invention is directed to radio controlled devices, such as but not limited to radio controlled cars, planes and boats.

Figure 41:
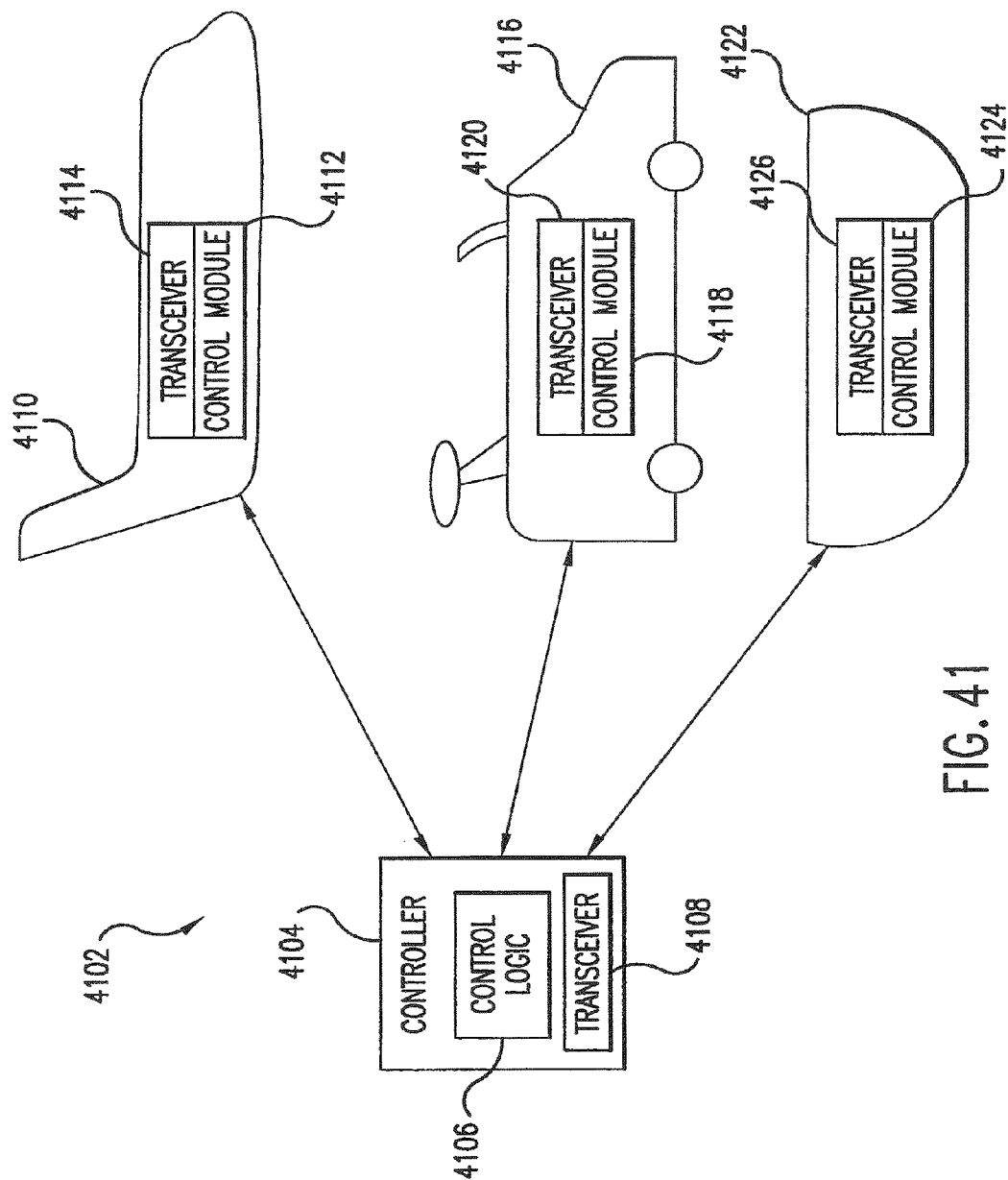
FIG. 41 illustrates radio controlled devices according to an embodiment of the invention.
Figure 42A:
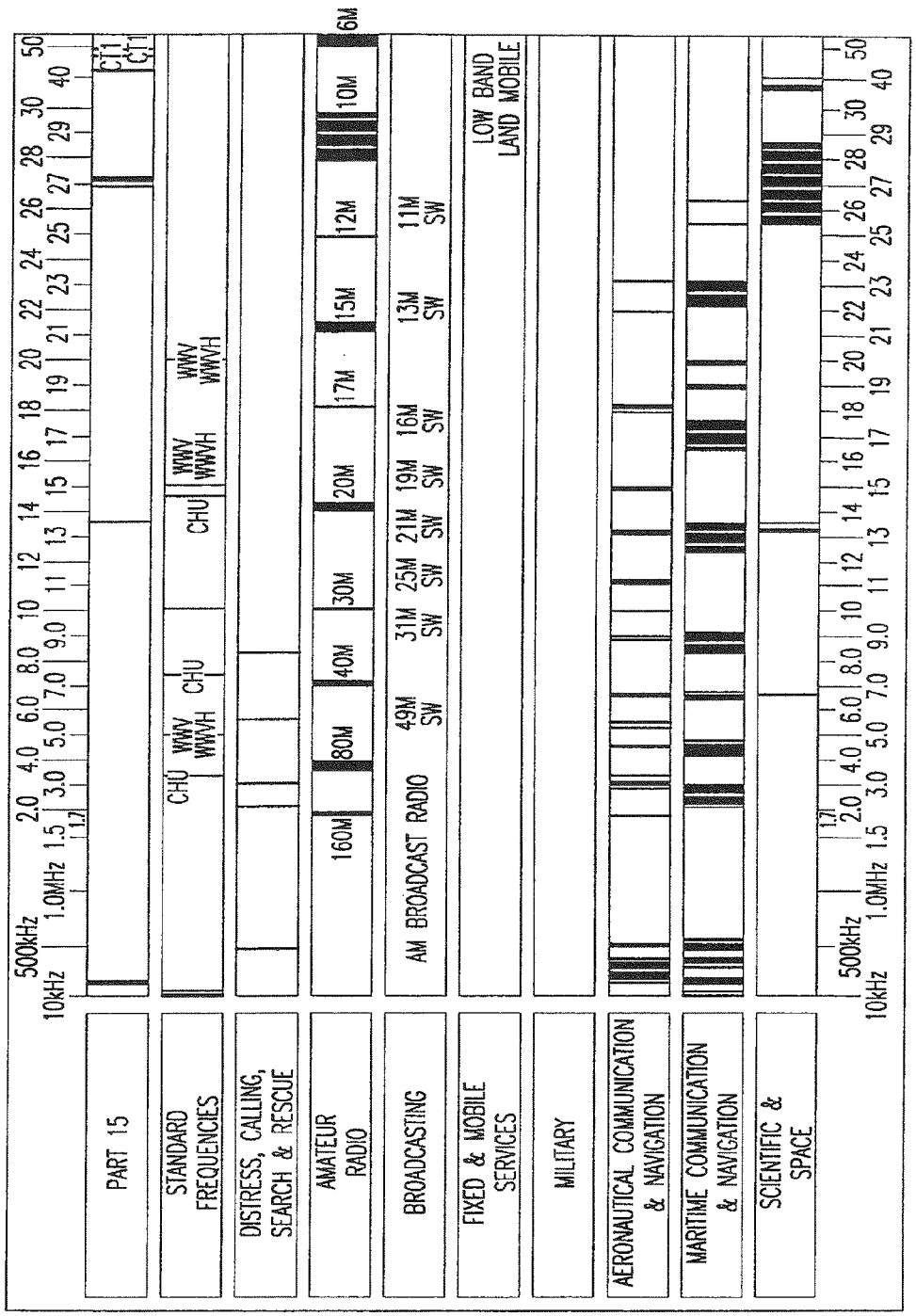
FIGS. 42A-42D illustrate example frequency bands operable with embodiments of the invention, where
Figure 42B:
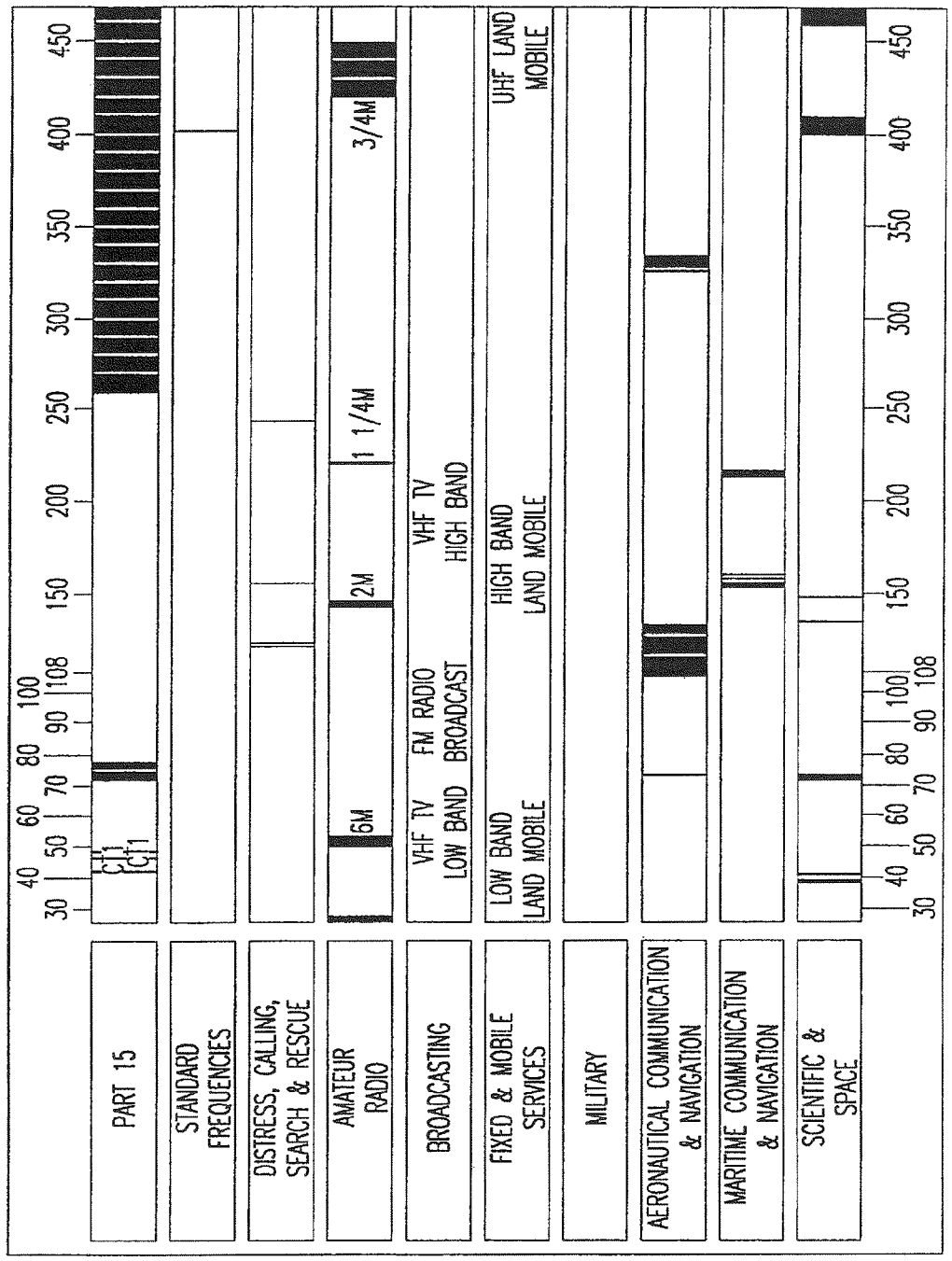
Figure 42C:
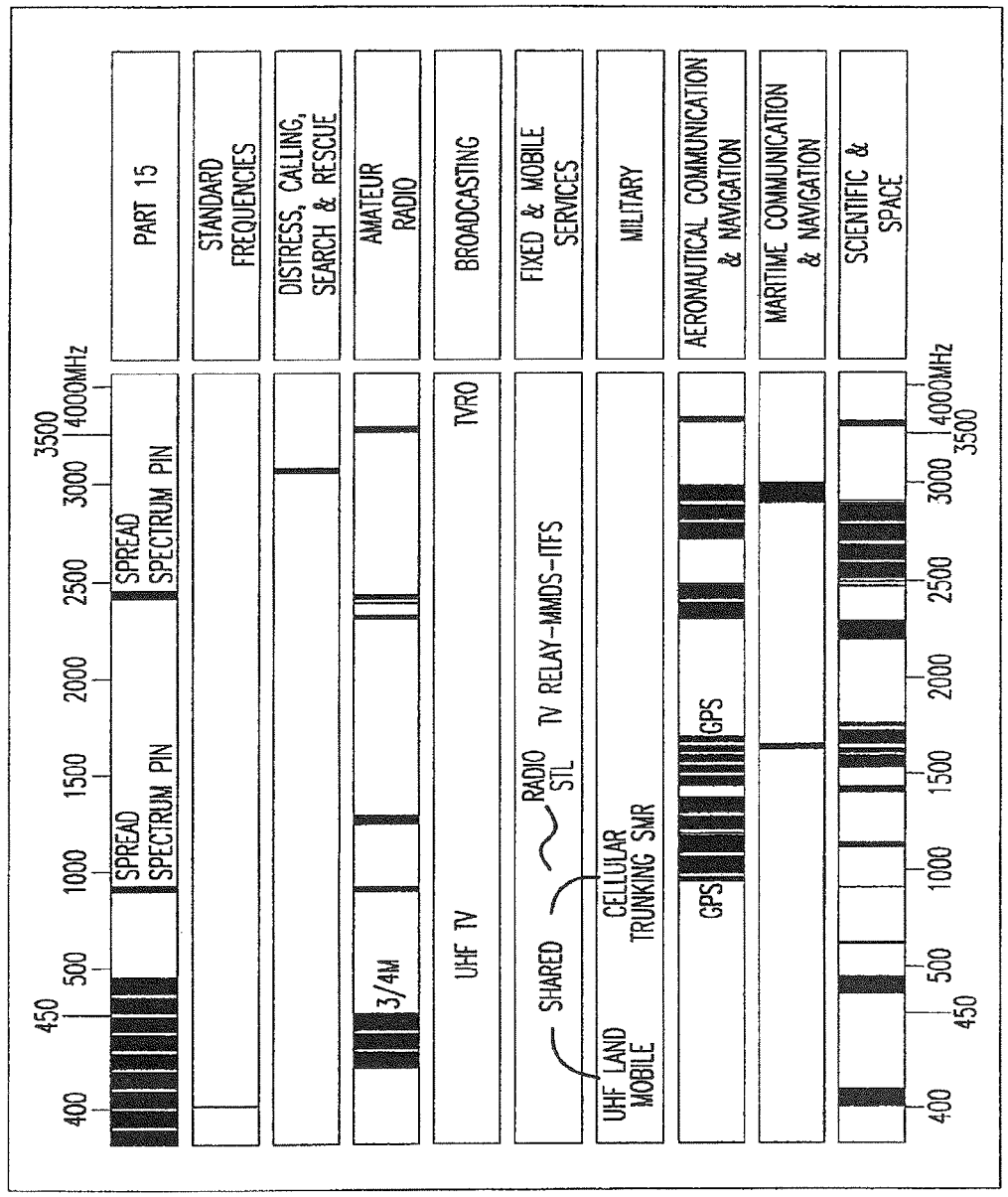
Figure 42D:
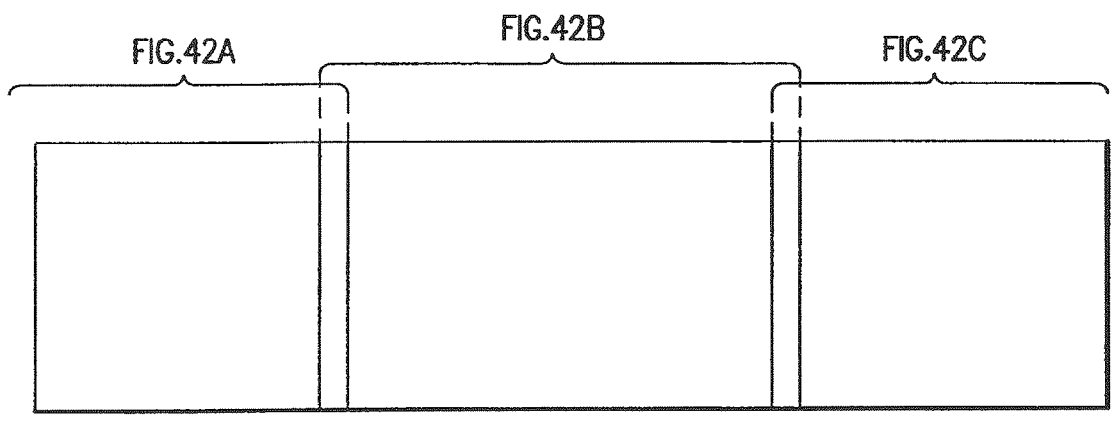

FIG. 41 illustrates radio controlled devices according to embodiments of the invention. A controller 4104 includes control logic 4106 for generating commands to control various devices, such as a plane 4110, a car 4116, and a boat 4122. The controller 4104 includes a transceiver 4108 for communication with the plane 4110, car 4146, and boat 4122.

The plane 4110, the car 4116, and the boat 4122 includes control modules 4112, 4118 and 4124 for processing commands received from the controller 4104. Also, control modules 4112, 4118, and 4124 maintain status information that can be communicated back to the control 4104. The plane 4110, the car 4116 and boat 4122 include transceivers 4114, 4120, and 4126, respectively, for communicating with the controller 4104.

Preferably, the transceivers 4108, 4114, 4120, and 4126 are implemented using UFT modules for performing frequency translation operations (see FIGS. 10 and 11). Alternatively, the transceivers 4108, 4114, 4120, and 4126 can be replaced by receivers and transmitters, wherein the receivers and/or transmitters are implemented using UFT modules for performing frequency translation operations (see, for example, FIGS. 7 and 8).

Radio Synchronous Watch

The invention is directed to radio synchronous time devices. Radio synchronous time devices are time pieces that receive signals representative of the current time. An example source of such time signals is radio station WWV in Boulder, Colo. Radio synchronous time devices update their internal clocks with the current time information contained in the signals.

The invention is directed to all types of radio synchronous time devices, such as alarm clocks, clocks in appliances and electronic equipment such as clocks in computers, clocks in televisions, clocks in VCRs, wrist watches, home and office clocks, clocks in ovens and other appliances, etc.

Figure 43:
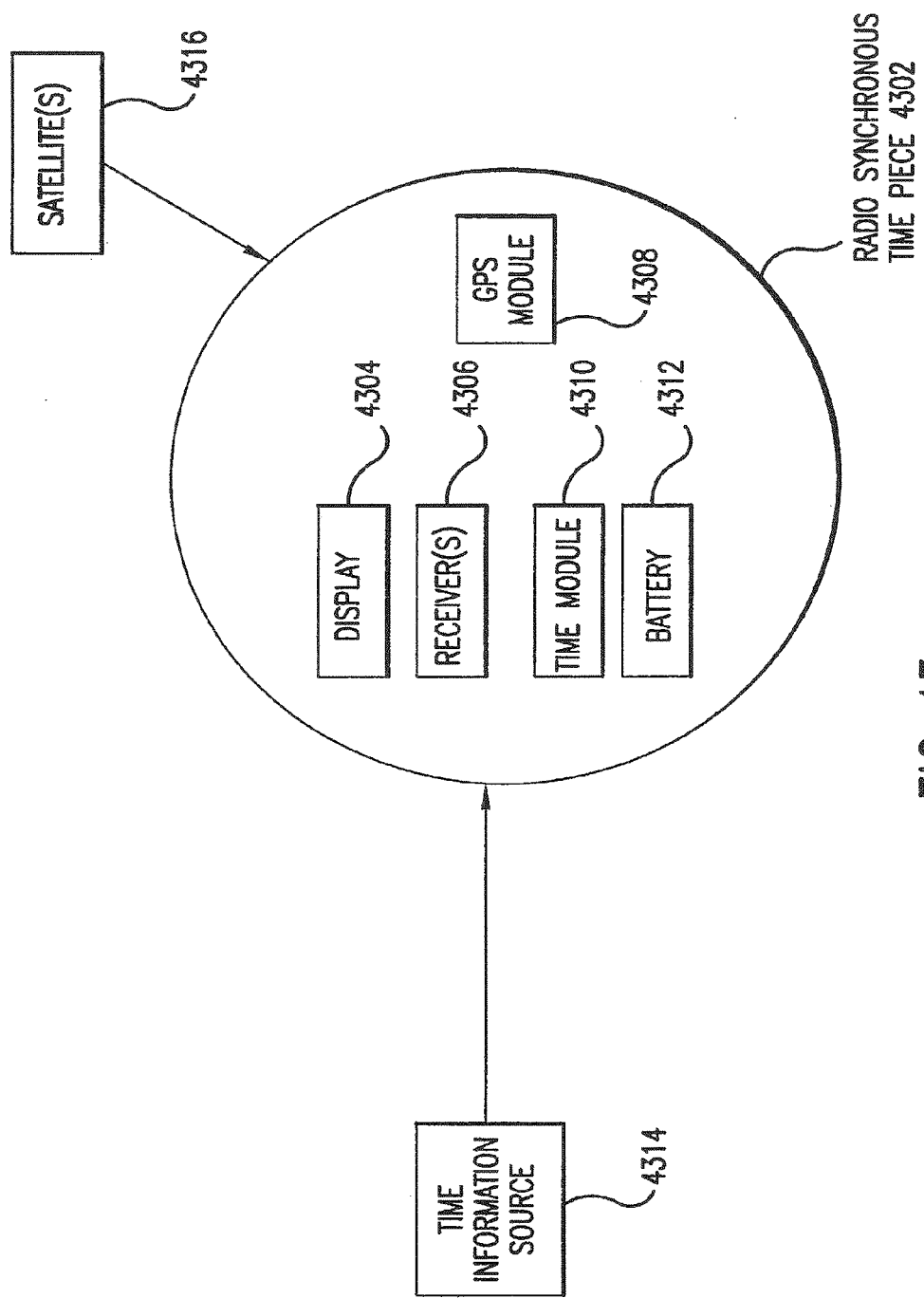
FIG. 43 illustrates an example radio synchronous watch according to an embodiment of the invention.

FIG. 43 illustrates an example radio synchronous time piece 4302, an example of which is shown in FIG. 43. The radio synchronous time piece 4302 includes a display 4304 to display the current time and time zone (and perhaps the position of the time piece 4302), receiver(s) 4306, a time module 4310, a GPS module 4308, and a battery 4312.

The receiver 4306 receives time signals from a time information source 4314. Based on the time signals, the time module 4310 determines the current time in a well known manner. Depending on the nature of the received time signals, the current time may be GMT. The current time is displayed in display 4304.

The receiver 4306 may receive the time signals continuously, periodically, upon user command, or sporadically (depending on the signal strength of the time information source 4314, for example). At times when the receiver 4306 is not receiving time signals, the time module 4310 determines the current time in a well known manner (i.e., the time module 4310 operates as a clock), using the indication of time in the last received time signal. In some embodiments, the time piece 4302 may provide some indication when it is receiving time signals from the time information source 4314. For example, the time piece 4302 may provide a visual or audible indication (such as lighting an LED or beeping when time signals are being received). The user can elect to disable this feature.

The receiver 4306 may also receive positioning information from global positioning satellites 4316. The GPS module 4308 uses the received positioning information to determine the location of the time piece 4302. The time module 4310 uses the location information to determine the time zone and/or the local time. The time zone, the local time, and/or the location of the time piece 4302 may be displayed in the display 4304.

Preferably, the receiver(s) 4306 are implemented using UFT modules for performing frequency translation operations (see, for example, FIG. 7).

The invention is particularly well suited for implementation as a time piece given the low power requirements of UFT modules. Time pieces implemented using UFT modules increase the effective life of the battery 4312.

Other Example Applications

The application embodiments described above are provided for purposes of illustration. These applications and embodiments are not intended to limit the invention. Alternate and additional applications and embodiments, differing slightly or substantially from those described herein, will be apparent to persons skilled in the relevant art(s) based on the teachings contained herein. For example, such alternate and additional applications and embodiments include combinations of those described above. Such combinations will be apparent to persons skilled in the relevant art(s) based on the herein teachings.

Additional applications and embodiments are described below.

Applications Involving Enhanced Signal Reception

As discussed above, the invention is directed to methods and systems for enhanced signal reception (ESR). Any of the example applications discussed above can be modified by incorporating ESR therein to enhance communication between transmitters and receivers. Accordingly, the invention is also directed to any of the applications described above, in combination with any of the ESR embodiments described above.

Applications Involving Unified Down-Conversion and Filtering

As described above, the invention is directed to unified down-conversion and filtering (UDF). UDF according to the invention can be used to performed filtering and/or down-conversion operations.

Many if not all of the applications described herein involve frequency translation operations. Accordingly, the applications described above can be enhanced by using any of the UDF embodiments described herein.

Many if not all of the applications described above involve filtering operations. Accordingly, any of the applications described above can be enhanced by using any of the UDF embodiments described herein.

Accordingly, the invention is directed to any of the applications described herein in combination with any of the UDF embodiments described herein.

CONCLUSION

Example implementations of the systems and components of the invention have been described herein. As noted elsewhere, these example implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An apparatus for unified down-conversion and filtering, comprising:

a down conversion module comprising first and second sampling circuits, each circuit comprised of a switching device and a storage module;

the first sampling circuit receiving as an input an RF information signal, and providing as an output a first down-converted signal;

the second sampling circuit receiving as an input the output down-converted signal from the first sampling circuit and providing as an output a second down-converted signal that is phase shifted relative to the first down-converted signal;

the switching device of the first sampling circuit receiving as an input a first control signal and the switching device of the second sampling circuit receiving as in input a second control signal that differs in phase from the first control signal; and the first control signal controlling a charging and discharging cycle of the storage module of the first sampling circuit by controlling the switching device of the first sampling circuit so that a portion of energy is transferred from the RF information signal to the storage module of the first sampling circuit during a charging part of the cycle and a portion of the transferred energy is discharged during a discharging part of the cycle, and the first control signal operating at an aliasing rate selected so that energy of the RF information signal is sampled and applied to the storage module of the first sampling circuit at a frequency that is equal to or less than twice the frequency of the RF information signal, and wherein the storage module of the first sampling circuit generates said down-converted signal from the alternate charging and discharging applied to the storage module of the first sampling circuit using said first control signal;

a delay module comprising first and second delay circuits;

the first delay circuit receiving at its input (i) the second down-converted signal that is phase shifted, and (ii) the first control signal, and outputting a delayed version of the second down-converted signal; and the second delay circuit receiving at its input (i) the delayed version of the second down-converted signal, and (ii) the second control signal, and outputting a version of the second down-converted signal that is further delayed relative to the output of the first delay circuit; and a summing module that forms a final down-converted, filtered output signal by combining the second down-converted, phase shifted signal output from the second sampling circuit and the further delayed version of the second down-converted signal output by the second delay circuit.

2. The apparatus of claim 1, further comprising a scaling module that multiplies the further delayed version of the second down-converted signal by a specified value.

3. The apparatus of claim 2, wherein the scaling module comprises a scaling circuit that includes one or more components configured to perform signal scaling on the further delayed version of the second down-converted signal.

4. The apparatus of claim 3, wherein the scaling circuit used to scale the further delayed version of the second down-converted signal comprises an amplifier circuit.

5. The apparatus of claim 1, wherein the apparatus for unified down-conversion and filtering is implemented in a receiver.

6. The apparatus of claim 1, wherein the apparatus for unified down-conversion and filtering is implemented in a transceiver.

7. The apparatus of claim 1, wherein the apparatus for unified down-conversion and filtering is implemented in a cellular phone.

8. The apparatus of claim 1, wherein the apparatus for unified down-conversion and filtering is implemented to process a data communication.

9. The apparatus of claim 1, wherein the apparatus for unified down-conversion and filtering is implemented in a wireless network.

10. The apparatus of claim 9, wherein the wireless network comprises a wide area network (WAN).

11. The apparatus of claim 9, wherein the wireless network comprises a local area network (LAN).

12. The apparatus of claim 9, wherein the wireless network comprises communication from a first peripheral device to a second peripheral device.

13. The apparatus of claim 1, wherein the apparatus for unified down-conversion and filtering is implemented in positioning and location circuitry.

14. The apparatus of claim 1, wherein the apparatus for unified down-conversion and filtering is implemented in Global Positioning System (GPS) circuitry.

15. The apparatus of claim 1, further comprising an output sample and hold module including a third switching device and a third storage device, the output sample and hold module storing a portion of the further delayed version of the second down-converted signal in the third storage module at each clock cycle of the first control signal, the stored portions of the further delayed version of the second down-converted signal forming a sampled, down-converted, filtered output signal.

16. An apparatus for unified down-conversion and filtering, comprising:

a down conversion module comprising first and second sampling circuits, each circuit comprised of a switching device and a storage module;

the first sampling circuit receiving as an input an RF information signal, and providing as an output a first down-converted signal;

the second sampling circuit receiving as an input the output down-converted signal from the first sampling circuit and providing as an output a second down-converted signal that is phase shifted relative to the first down-converted signal;

the switching device of the first sampling circuit receiving as an input a first control signal and the switching device of the second sampling circuit receiving as in input a second control signal that differs in phase from the first control signal; and the first control signal controlling a charging and discharging cycle of the storage module of the first sampling circuit by controlling the switching device of the first sampling circuit so that a portion of energy is transferred from the RF information signal to the storage module of the first sampling circuit during a charging part of the cycle and a portion of the transferred energy is discharged during a discharging part of the cycle, and the first control signal operating at an aliasing rate selected so that energy of the RF information signal is sampled and applied to the storage module of the first sampling circuit at a frequency that is equal to or less than twice the frequency of the RF information signal, and wherein the storage module of the first sampling circuit generates said down-converted signal from the alternate charging and discharging applied to the storage module of the first sampling circuit using said first control signal;

a first delay module comprising first and second delay circuits;

a first delay circuit receiving at its input (i) the second down-converted signal that is phase shifted, and (ii) the first control signal, and outputting a delayed version of the second down-converted signal; and the second delay circuit receiving at its input (i) the delayed version of the second down-converted signal, and (ii) the second control signal, and outputting a version of the second down-converted signal that is further delayed relative to the output of the first delay circuit;

a second delay module comprising third and fourth delay circuits;

the third delay circuit receiving at its input (i) the further delayed version of the second down-converted signal, and (ii) the first control signal, and outputting a subsequently delayed version of the further delayed version second down-converted signal; and the fourth delay circuit receiving at its input (i) the subsequently delayed version of the further delayed version second down-converted signal, and (ii) the second control signal, and outputting a version of the second down-converted signal that is further delayed relative to the output of the third delay circuit;

a first scaling module that multiplies the further delayed version of the second down-converted signal that was output by the second delay circuit by a first specified value;

a second scaling module that multiplies the subsequently delayed version of the second down-converted signal that was output by the fourth delay circuit by a second specified value;

a first summing module that combines the further delayed, scaled version of the second down-converted signal output by the second delay circuit and the subsequently delayed, scaled version of the second down-converted signal output by the fourth delay circuit to create a combined delayed output signal; and a second summing module that forms a final down-converted, filtered output signal by combining the second down-converted, phase shifted signal output from the second sampling circuit and the combined delayed output signal that was output by the first summing module.

17. The apparatus of claim 16, wherein the first and second scaling modules comprise scaling circuits that each include one or more components configured to perform signal scaling on the further delayed version of the second down-converted signal that was output by the second delay circuit and the subsequently delayed version of the second down-converted signal that was output by the fourth delay circuit.

18. The apparatus of claim 17, wherein the scaling circuits comprise amplifier circuits.

19. The apparatus of claim 16, wherein the apparatus for unified down-conversion and filtering is implemented in a receiver.

20. The apparatus of claim 16, wherein the apparatus for unified down-conversion and filtering is implemented in a transceiver.

21. The apparatus of claim 16, wherein the apparatus for unified down-conversion and filtering is implemented in a cellular phone.

22. The apparatus of claim 16, wherein the apparatus for unified down-conversion and filtering is implemented to process a data communication.

23. The apparatus of claim 16, wherein the apparatus for unified down-conversion and filtering is implemented in a wireless network.

24. The apparatus of claim 23, wherein the wireless network comprises a wide area network (WAN).

25. The apparatus of claim 23, wherein the wireless network comprises a local area network (LAN).

26. The apparatus of claim 23, wherein the wireless network comprises communication from a first peripheral device to a second peripheral device.

27. The apparatus of claim 16, wherein the apparatus for unified down-conversion and filtering is implemented in positioning and location circuitry.

28. The apparatus of claim 16, wherein the apparatus for unified down-conversion and filtering is implemented in Global Positioning System (GPS) circuitry.

29. The apparatus of claim 16, further comprising an output sample and hold module including a third switching device and a third storage device, the output sample and hold module storing a portion of the final down-converted, filtered output signal in the third storage module at each clock cycle of the first control signal, the stored portions of the final down-converted, filtered output signal forming a sampled, down-converted, filtered output signal.

30. An apparatus for unified down-conversion and filtering, comprising:

a down conversion module comprising first and second sampling circuits, each circuit comprised of a switching device and a storage module;

the first sampling circuit receiving as an input an RF information signal, and providing as an output a first down-converted signal;

the second sampling circuit receiving as an input the output down-converted signal from the first sampling circuit and providing as an output a second down-converted signal that is phase shifted relative to the first down-converted signal;

the switching device of the first sampling circuit receiving as an input a first control signal and the switching device of the second sampling circuit receiving as in input a second control signal that differs in phase from the first control signal; and the first control signal controlling a charging and discharging cycle of the storage module of the first sampling circuit by controlling the switching device of the first sampling circuit so that a portion of energy is transferred from the RF information signal to the storage module of the first sampling circuit during a charging part of the cycle and a portion of the transferred energy is discharged during a discharging part of the cycle, and the first control signal operating at an aliasing rate selected so that energy of the RF information signal is sampled and applied to the storage module of the first sampling circuit at a frequency that is equal to or less than twice the frequency of the RF information signal, and wherein the storage module of the first sampling circuit generates said down-converted signal from the alternate charging and discharging applied to the storage module of the first sampling circuit using said first control signal;

a first delay module comprising first and second delay circuits;

a first delay circuit receiving at its input (i) the second down-converted signal that is phase shifted, and (ii) the first control signal, and outputting a delayed version of the second down-converted signal; and the second delay circuit receiving at its input (i) the delayed version of the second down-converted signal, and (ii) the second control signal, and outputting a version of the second down-converted signal that is further delayed relative to the output of the first delay circuit;

a second delay module comprising third and fourth delay circuits;

the third delay circuit receiving at its input (i) the further delayed version of the second down-converted signal, and (ii) the first control signal, and outputting a subsequently delayed version of the further delayed version second down-converted signal; and the fourth delay circuit receiving at its input (i) the subsequently delayed version of the further delayed version second down-converted signal, and (ii) the second control signal, and outputting a version of the second down-converted signal that is further delayed relative to the output of the third delay circuit;

a first scaling module that multiplies the further delayed version of the second down-converted signal that was output by the second delay circuit by a first specified value;

a second scaling module that multiplies the subsequently delayed version of the second down-converted signal that was output by the fourth delay circuit by a second specified value;

a first summing module that combines the further delayed, scaled version of the second down-converted signal output by the second delay circuit and the subsequently delayed, scaled version of the second down-converted signal output by the fourth delay circuit to create a combined delayed output signal;

a second summing module that forms a final down-converted, filtered output signal by combining the second down-converted, phase shifted signal output from the second sampling circuit and the combined delayed output signal that was output by the first summing module; and an output sample and hold module including a third switching device and a third storage device, the output sample and hold module storing a portion of the final down-converted, filtered output signal in the third storage module at each clock cycle of the first control signal, the stored portions of the final down-converted, filtered output signal forming a sampled, down-converted, filtered output signal.

31. The apparatus of claim 30, wherein the first and second scaling modules comprise scaling circuits that each include one or more components configured to perform signal scaling on the further delayed version of the second down-converted signal that was output by the second delay circuit and the subsequently delayed version of the second down-converted signal that was output by the fourth delay circuit.

32. The apparatus of claim 31, wherein the scaling circuits comprise amplifier circuits.

33. The apparatus of claim 30, wherein the apparatus for unified down-conversion and filtering is implemented in a receiver.

34. The apparatus of claim 30, wherein the apparatus for unified down-conversion and filtering is implemented in a transceiver.

35. The apparatus of claim 30, wherein the apparatus for unified down-conversion and filtering is implemented in a cellular phone.

36. The apparatus of claim 30, wherein the apparatus for unified down-conversion and filtering is implemented to process a data communication.

37. The apparatus of claim 30, wherein the apparatus for unified down-conversion and filtering is implemented in a wireless network.

38. The apparatus of claim 37, wherein the wireless network comprises a wide area network (WAN).

39. The apparatus of claim 37, wherein the wireless network comprises a local area network (LAN).

40. The apparatus of claim 37, wherein the wireless network comprises communication from a first peripheral device to a second peripheral device.

41. The apparatus of claim 30, wherein the apparatus for unified down-conversion and filtering is implemented in positioning and location circuitry.

42. The apparatus of claim 30, wherein the apparatus for unified down-conversion and filtering is implemented in Global Positioning System (GPS) circuitry.

\* \* \* \* \*